US012640182B2

(12) United States Patent
Matsuzaki et al.

(10) Patent No.: US 12,640,182 B2
(45) Date of Patent: May 26, 2026

(54) SEMICONDUCTOR DEVICE WITH A FERROELECTRIC CAPACITOR AND METHOD FOR DRIVING MULTIPLE POTENTIALS TO THE SEMICONDUCTOR DEVICE

(71) Applicant: SEMICONDUCTOR ENERGY LABORATORY CO., LTD., Atsugi (JP)

(72) Inventors: Takanori Matsuzaki, Kanagawa (JP); Tatsuya Onuki, Kanagawa (JP); Toshihiko Saito, Kanagawa (JP)

(73) Assignee: SEMICONDUCTOR ENERGY LABORATORY CO., LTD., Kanagawa-Ken (JP)

( * ) Notice: Subject to any disclaimer, the term of this patent is extended or adjusted under 35 U.S.C. 154(b) by 152 days.

(21) Appl. No.: 18/030,214

(22) PCT Filed: Oct. 12, 2021

(86) PCT No.: PCT/IB2021/059305
§ 371 (c)(1),
(2) Date: Apr. 4, 2023

(87) PCT Pub. No.: WO2022/084802
PCT Pub. Date: Apr. 28, 2022

(65) Prior Publication Data
US 2023/0377625 A1 Nov. 23, 2023

(30) Foreign Application Priority Data
Oct. 20, 2020 (JP) ................................. 2020-176352

(51) Int. Cl.
*G11C 11/22* (2006.01)
*H10B 53/30* (2023.01)
(Continued)

(52) U.S. Cl.
CPC ........ *G11C 11/221* (2013.01); *G11C 11/2273* (2013.01); *G11C 11/2275* (2013.01);
(Continued)

(58) Field of Classification Search
CPC .............. G11C 11/221; G11C 11/2273; G11C 11/2275; G11C 11/2293; G11C 11/2257;
(Continued)

(56) References Cited

U.S. PATENT DOCUMENTS 5,615,144 A * 3/1997 Kimura ................... G11C 11/22
365/117
6,635,528 B2 10/2003 Gilbert et al.
(Continued)

FOREIGN PATENT DOCUMENTS

CN 001860609 A 11/2006
CN 110957353 A 4/2020
(Continued)

OTHER PUBLICATIONS

International Search Report (Application No. PCT/IB2021/059305) Dated Dec. 14, 2021.
(Continued)

*Primary Examiner* — Jerome Leboeuf
(74) *Attorney, Agent, or Firm* — NIXON PEABODY LLP; Jeffrey L. Costellia

(57) ABSTRACT

A semiconductor device includes a memory cell including a transistor and a capacitor that includes a ferroelectric; a word line; a bit line; and a plate line. A gate of the transistor is electrically connected to the word line. One of a source and a drain of the transistor is electrically connected to the bit line. The other of the source and the drain of the transistor is electrically connected to one electrode of the capacitor. The other electrode of the capacitor is electrically connected to the plate line. The semiconductor device has a function of
(Continued)

supplying a potential that controls an on state or an off state of the transistor to the word line, a function of supplying a first potential or a second potential to the bit line, and a function of supplying a third potential, a fourth potential, or a fifth potential to the plate line.

10 Claims, 31 Drawing Sheets

(51) Int. Cl.
    *H10D 1/68*          (2025.01)
    *H10D 30/67*       (2025.01)

(52) U.S. Cl.
    CPC .......... *G11C 11/2293* (2013.01); *H10B 53/30* (2023.02); *H10D 1/682* (2025.01); *H10D 30/6755* (2025.01); *G11C 11/2257* (2013.01)

(58) Field of Classification Search
    CPC . G11C 11/2255; G11C 11/2259; H01L 28/55; H01L 29/7869; H01L 27/1207; H01L 29/78648; H10B 53/30
    See application file for complete search history.

(56)            References Cited

U.S. PATENT DOCUMENTS

| | | | |
|---|---|---|---|
| 7,696,502 | B2 | 4/2010 | Jin. et al. |
| 7,875,872 | B2 | 1/2011 | Jin. et al. |
| 8,088,644 | B2 | 1/2012 | Jin. et al. |
| 8,981,440 | B2 | 3/2015 | Nakao |
| 9,001,563 | B2 | 4/2015 | Atsumi et al. |
| 9,443,563 | B2 | 9/2016 | Atsumi et al. |
| 10,020,374 | B2 | 7/2018 | Sone et al. |
| 10,763,816 | B2 | 9/2020 | Yanagitani et al. |
| 11,164,936 | B2 | 11/2021 | Okita et al. |
| 11,482,270 | B1 * | 10/2022 | Dokania ........... G11C 11/40615 |
| 2007/0107774 | A1 | 5/2007 | Jin et al. |
| 2014/0070289 | A1 | 3/2014 | Tanaka et al. |
| 2020/0098871 | A1 | 3/2020 | Chen et al. |
| 2021/0013218 | A1 | 1/2021 | Tsukamoto |
| 2021/0091098 | A1 | 3/2021 | Tsukamoto |
| 2021/0398992 | A1 * | 12/2021 | Wu ........................ H10B 51/40 |
| 2022/0028930 | A1 * | 1/2022 | Wu ........................ H10B 53/30 |
| 2022/0069131 | A1 * | 3/2022 | Pesic ..................... H01G 4/005 |
| 2022/0093151 | A1 * | 3/2022 | Suzuki ................... H10B 51/20 |

FOREIGN PATENT DOCUMENTS

| | | | |
|---|---|---|---|
| EP | 1770778 | A | 4/2007 |
| EP | 2348555 | A | 7/2011 |
| JP | 2001-202776 | A | 7/2001 |
| JP | 2012-256408 | A | 12/2012 |
| JP | 2019-201034 | A | 11/2019 |
| KR | 2006-0061381 | A | 6/2006 |
| WO | WO-2006/009218 | | 1/2006 |

OTHER PUBLICATIONS

Written Opinion (Application No. PCT/IB2021/059305) Dated Dec. 14, 2021.

Fichtner.S et al., "AlScN: A III-V semiconductor based ferroelectric", J. Appl. Phys. (Journal of Applied Physics) , Mar. 18, 2019, vol. 125, pp. 114103-1-114103-7.

Francois.T et al., "Demonstration of BEOL-compatible ferroelectric Hf0.5Zr0.5O2 scaled FeRAM co-integrated with 130nm CMOS for embedded NVM applications", IEDM 19: Technical Digest of International Electron Devices Meeting, Dec. 7, 2019, pp. 362-365.

Okuno.J et al., "SoC compatible 1T1C FeRAM memory array based on ferroelectric Hf0.5Zr0.5O2", 2020 Symposium on VLSI Technology : Digest of Technical Papers, Jun. 16, 2020, p. 2pages.

Fan.Z et al., "Ferroelectric HfO2-based materials for next-generation ferroelectric memories", Journal of Advanced Dielectrics, May 3, 2016, vol. 6, No. 2, pp. 1630003-1-1630003-11.

Boscke.T et al., "Ferroelectricity in hafnium oxide thin films", Appl. Phys. Lett. (Applied Physics Letters) , Sep. 8, 2011, vol. 99, No. 10, pp. 102903-1-102903-3.

Toriumi.A, "Ferroelectricity of HfO2 thin film", OYOBUTURI , Sep. 10, 2019, vol. 88, No. 9, pp. 586-596, JSAP(The Japan Society of Applied Physics).

Toriumi.A, "Ferroelectric properties of thin HfO2 films", OYOBUTURI , Sep. 10, 2019, vol. 88, No. 9, pp. 586-596, JSAP(The Japan Society of Applied Physics).

* cited by examiner

<u>100</u>

<u>100</u>

BL[j]

WL[i]

PL

10[i, j]

130[i, j]

SN[i, j]

120[i, j]

43 Row Driver

COM

SW1[j]

SW2[j]

SAN[j]

20

46 Sense Amplifier ← SAE

120[i, j]

10[i, j]

130[i, j]

BGL

120[i, j]

10[i, j]

130[i, j]

BL
0V

WL

L

0V

PL

10

130

SN

0V

120

SW1

0V

COM

SW2

0V    SAN

46 Sense Amplifier    L    SAE

+

Polarization

−

55

−    Voltage    +

FIG. 23A
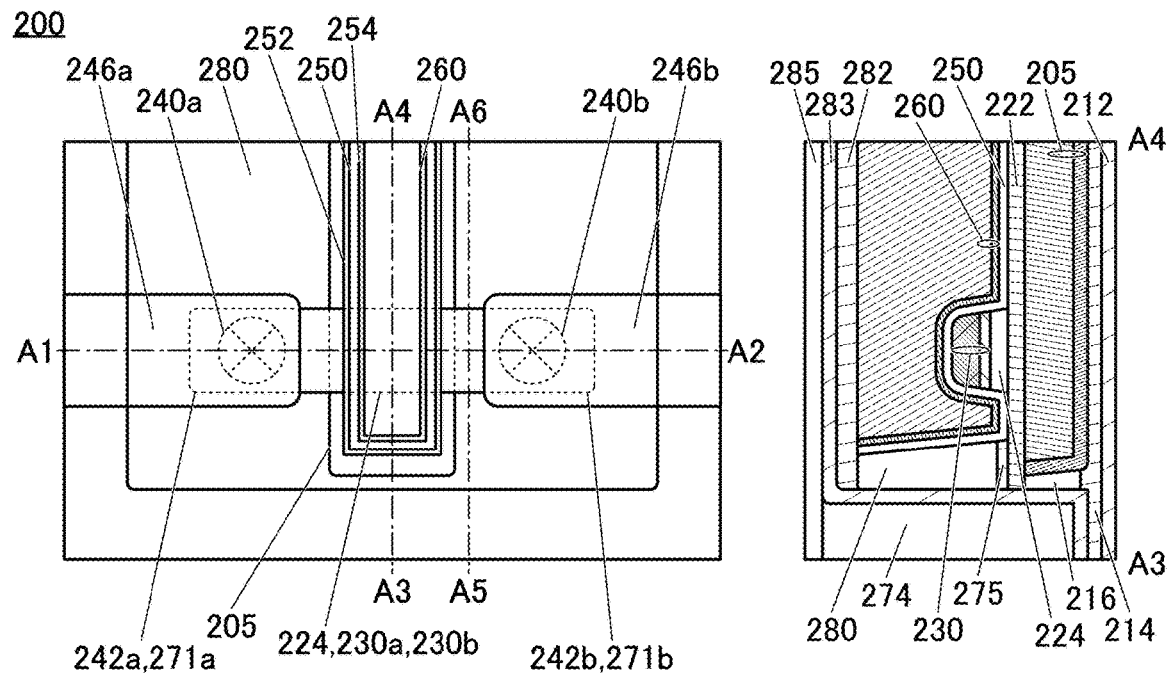
FIG. 23C
FIG. 23B
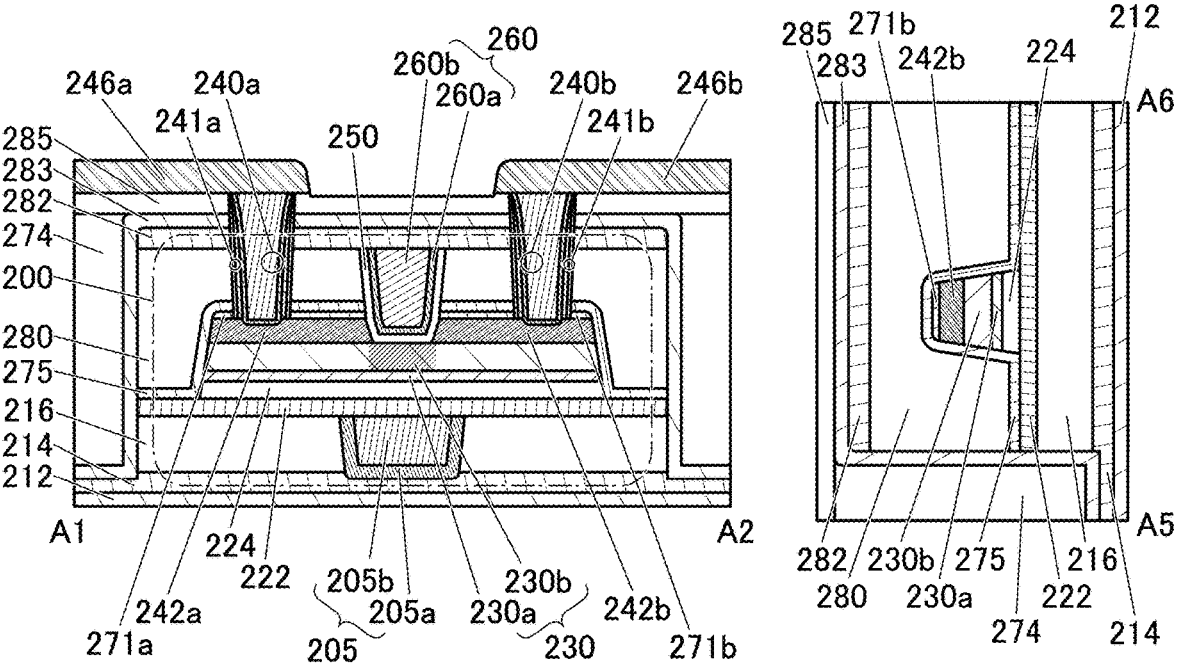
FIG. 23D

FIG. 25A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 25B
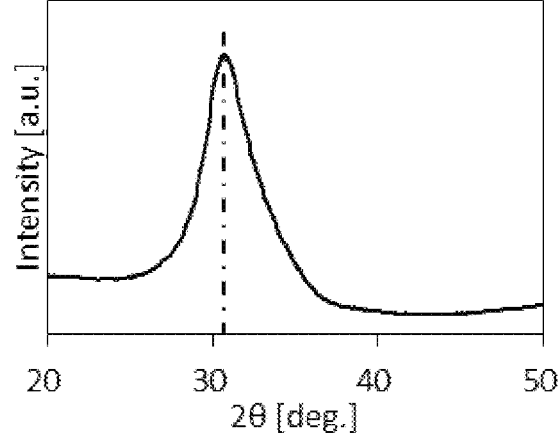
FIG. 25C
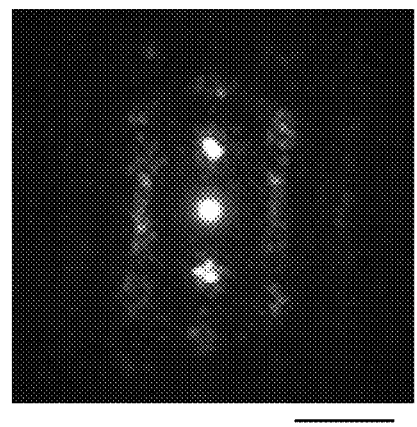
5nm⁻¹

FIG. 26A
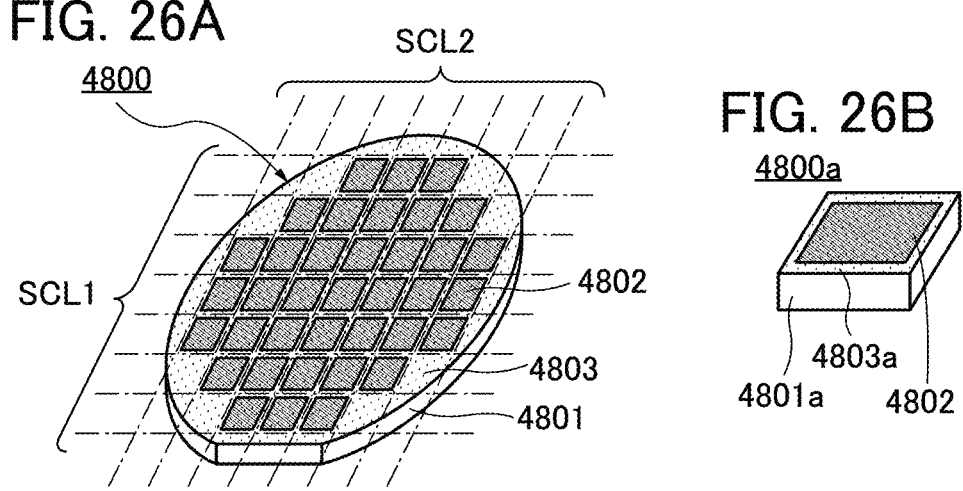
FIG. 26B
FIG. 26C
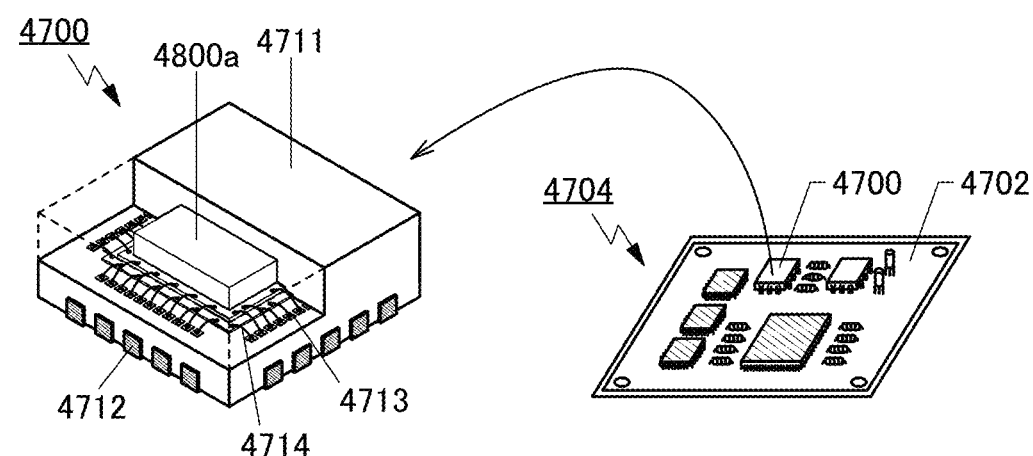
FIG. 26D
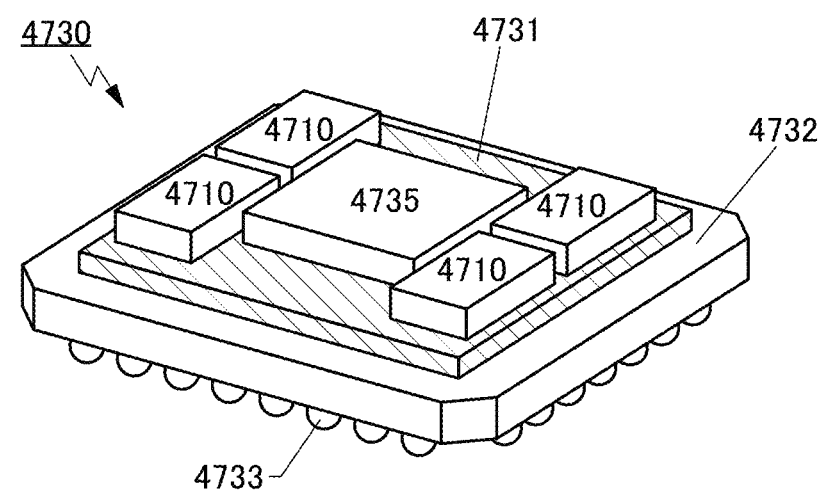

FIG. 27A
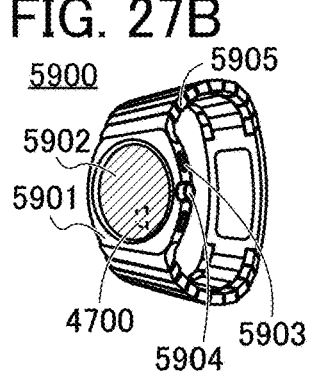
5500
5511
5510
4700
FIG. 27B
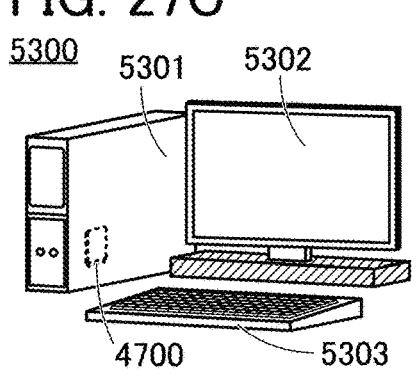
5900
5905
5902
5901
4700
5904
5903
FIG. 27C
5300
5301
5302
4700
5303
FIG. 27D
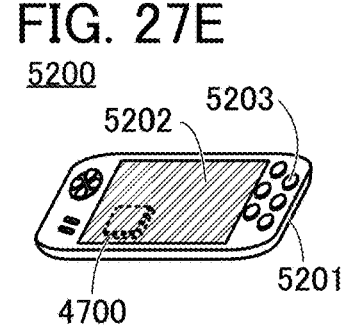
5800
4700
5801
5802
5803
FIG. 27E
5200
5202
5203
4700
5201
FIG. 27F
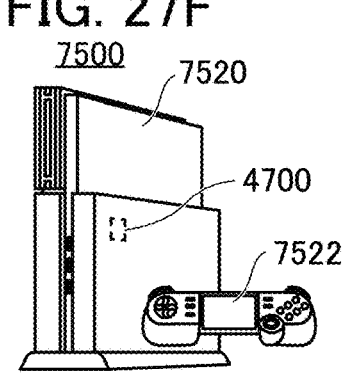
7500
7520
4700
7522
FIG. 27G
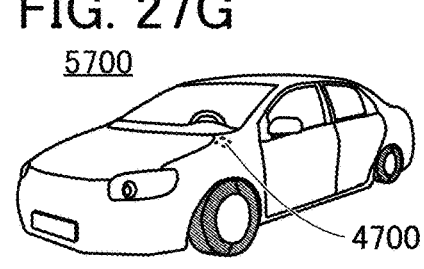
5700
4700
FIG. 27H
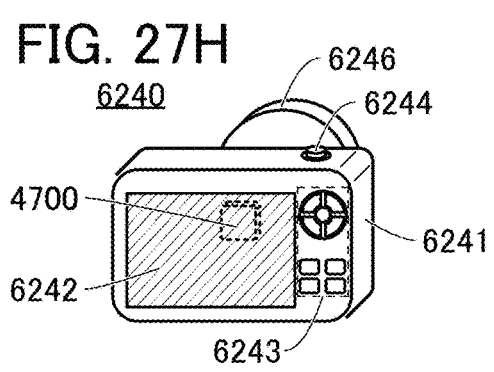
6240
6246
6244
4700
6241
6242
6243
FIG. 27I
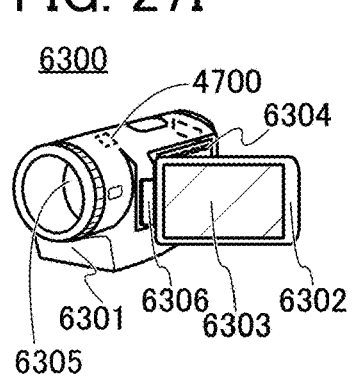
6300
4700
6304
6301
6306
6303
6302
6305
FIG. 27J
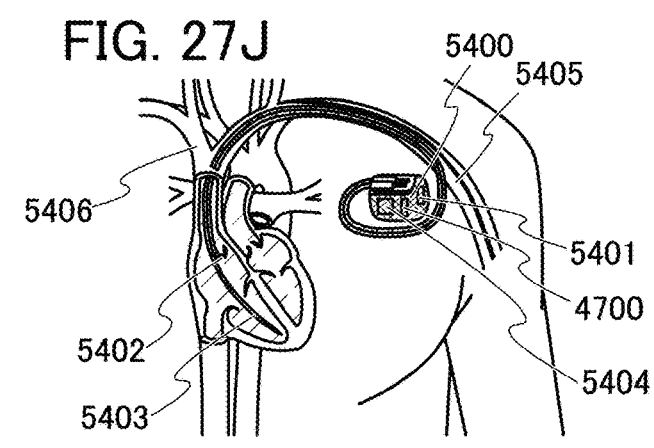
5400
5405
5406
5401
4700
5402
5404
5403

| | SiFET + FE | OSFET + FE | |
|---|---|---|---|
| Circuit diagram (1T1F) | FE / SiFET / Memory cell | FE / OSFET / Memory cell | FE / Memory cell |
| Si MOS | 130 nm node | 55 nm node | 7 nm node |
| OS L/W | — | 60 nm/60 nm | 30 nm/30 nm |
| Channel area | 0.105 $\mu$m$^2$ | 0.0036 $\mu$m$^2$ | 0.0009 $\mu$m$^2$ |
| Usable voltage | 3.3 V | 4.5 V | 4.5 V |
| Memory cell size | 0.50 $\mu$m$^2$ | 0.153 $\mu$m$^2$ | 0.018 $\mu$m$^2$ |
| FE size | 0.112 $\mu$m$^2$ | 0.05 $\mu$m$^2$ | 0.004 $\mu$m$^2$ |
| Dielectric thickness | 8 to 11 nm | 10 to 12.5 nm | 10 to 12.5 nm |
| Layout view | FE, Memory cell, via, Channel formation region | | |

Approx. 1/3   Approx. 1/8

SEMICONDUCTOR DEVICE WITH A FERROELECTRIC CAPACITOR AND METHOD FOR DRIVING MULTIPLE POTENTIALS TO THE SEMICONDUCTOR DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

In recent years, semiconductor devices such as LSI, CPUs, and memories (memory devices) have been developed. These semiconductor devices have been used in various electronic devices such as computers and portable information terminals. In addition, memories under development employ various memory systems for intended uses such as temporary storage at the time of executing arithmetic processing and long-term storage of data. Examples of memories with typical memory systems include a DRAM, an SRAM, and a flash memory.

Memories using ferroelectrics have been actively researched and developed as disclosed in Non-Patent Document 1. For the next-generation ferroelectric memories, researches on hafnium oxide, such as a research on ferroelectric $HfO_2$-based materials (Non-Patent Document 2); a research on ferroelectricity of a hafnium oxide thin film (Non-Patent Document 3); a research on ferroelectricity of a $HfO_2$ thin film (Non-Patent Document 4); and demonstration of integration of an FeRAM using a ferroelectric $Hf_{0.5}Zr_{0.5}O_2$ and a CMOS (Non-Patent Document 5) have been actively carried out.

REFERENCES

Non-Patent Documents

[Non-Patent Document 1] T. S. Boescke, et al, "Ferroelectricity in hafnium oxide thin films", APL99, 2011

[Non-Patent Document 2] Zhen Fan, et al, "Ferroelectric $HfO_2$-based materials for next-generation ferroelectric memories", JOURNAL OF ADVANCED DIELECTRICS, Vol. 6, No. 2, 2016

[Non-Patent Document 3] Jun Okuno, et al, "SoC compatible 1T1C FeRAM memory array based on ferroelectric $Hf_{0.5}Zr_{0.5}O_2$", VLSI 2020

[Non-Patent Document 4] Akira Toriumi, "Ferroelectric properties of thin $HfO_2$ films", the Japan Society of Applied Physics, Vol. 88, No. 9, 2019

[Non-Patent Document 5] T. Francois, et al, "Demonstration of BEOL-compatible ferroelectric $Hf_{0.5}Zr_{0.5}O_2$ scaled FeRAM co-integrated with 130 nm CMOS for embedded NVM applications", IEDM 2019

SUMMARY OF THE INVENTION

Problems to be Solved by the Invention

An object of one embodiment of the present invention is to provide a novel memory device. Another object of one embodiment of the present invention is to provide a memory device with low power consumption. Another object of one embodiment of the present invention is to provide a highly reliable memory device. Another object of one embodiment of the present invention is to provide a memory device that occupies a small area. Another object of one embodiment of the present invention is to provide a memory device with high memory capacity. Another object of one embodiment of the present invention is to provide a novel semiconductor device. Another object of one embodiment of the present invention is to provide a semiconductor device with low power consumption. Another object of one embodiment of the present invention is to provide a highly reliable semiconductor device. Another object of one embodiment of the present invention is to provide a semiconductor device that occupies a small area. Another object of one embodiment of the present invention is to provide a semiconductor device with high memory capacity.

Note that the objects of one embodiment of the present invention are not limited to the objects listed above. The objects listed above do not preclude the existence of other objects. Note that the other objects are objects that are not described in this section and will be described below. The objects that are not described in this section will be derived from the description of the specification, the drawings, and the like and can be extracted as appropriate from the description by those skilled in the art. Note that one embodiment of the present invention achieves at least one of the objects listed above and the other objects. Note that one embodiment of the present invention does not necessarily achieve all the objects listed above and the other objects.

Means for Solving the Problems

One embodiment of the present invention is a semiconductor device including a memory cell that includes a transistor and a capacitor including a ferroelectric and first to third wirings, in which a gate of the transistor is electrically connected to the first wiring; one of a source and a drain of the transistor is electrically connected to the second wiring; the other of the source and the drain of the transistor is electrically connected to one electrode of the capacitor; and the other electrode of the capacitor is electrically connected to the third wiring. The semiconductor device has a function of supplying a potential bringing the transistor into an on state or an off state to the first wiring, a function of supplying a first potential or a second potential to the second wiring, and a function of supplying a third potential, a fourth potential, or a fifth potential to the third wiring.

The transistor preferably includes an oxide semiconductor in a semiconductor where a channel is formed. The oxide semiconductor preferably contains at least one of indium and zinc.

For the ferroelectric, a material containing nitrogen and at least one of aluminum, gallium, and indium can be used.

For the ferroelectric, a material containing nitrogen, at least one of aluminum, gallium, and indium, at least one of boron, scandium, yttrium, lanthanum, cerium, neodymium, europium, titanium, zirconium, hafnium, vanadium, niobium, tantalum, and chromium, and at least one of magnesium, calcium, strontium, zinc, and cadmium can be used. In addition, for the ferroelectric, a material containing hafnium, oxygen, and at least one of zirconium, silicon, aluminum, gadolinium, yttrium, lanthanum, and strontium can be used.

Another embodiment of the present invention is a method for driving the semiconductor device, including the steps of supplying the first potential to the second wiring and then bringing the second wiring into a floating state; supplying the potential bringing the transistor into the on state to the first wiring; supplying the third potential to the third wiring and then supplying the first potential or the second potential to the second wiring in accordance with a potential of the second wiring; supplying the fourth potential to the third wiring; supplying the first potential to the second wiring and supplying the fifth potential to the third wiring; and supplying the potential bringing the transistor into the off state to the first wiring.

Another embodiment of the present invention is a method for driving the semiconductor device, including the steps of supplying the potential bringing the transistor into the on state to the first wiring; supplying the second potential to the second wiring and supplying the fourth potential to the third wiring; supplying the first potential to the second wiring and supplying the fifth potential to the third wiring; and supplying the potential bringing the transistor into the off state to the first wiring.

Another embodiment of the present invention is a method for driving the semiconductor device, including the steps of supplying the potential bringing the transistor into the on state to the first wiring; supplying the first potential to the second wiring and supplying the third potential to the third wiring; supplying the fifth potential to the third wiring; and supplying the potential bringing the transistor into the off state to the first wiring.

The second potential is preferably lower than or equal to 80%, further preferably lower than or equal to 50%, still further preferably lower than or equal to 20% of saturation polarization voltage of the capacitor.

Effect of the Invention

One embodiment of the present invention can provide a novel memory device. Alternatively, one embodiment of the present invention can provide a memory device with low power consumption. Alternatively, one embodiment of the present invention can provide a highly reliable memory device. Alternatively, one embodiment of the present invention can provide a memory device that occupies a small area. Alternatively, one embodiment of the present invention can provide a memory device with high memory capacity. Alternatively, one embodiment of the present invention can provide a novel semiconductor device. Alternatively, one embodiment of the present invention can provide a semiconductor device with low power consumption. Alternatively, one embodiment of the present invention can provide a highly reliable semiconductor device. Alternatively, one embodiment of the present invention can provide a semiconductor device that occupies a small area. Alternatively, one embodiment of the present invention can provide a semiconductor device with high memory capacity.

Note that the effects of one embodiment of the present invention are not limited to the effects listed above. The effects listed above do not preclude the existence of other effects. Note that the other effects are effects that are not described in this section and will be described below. The effects that are not described in this section will be derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 23A is a top view illustrating a structure example of a transistor. FIG. 23B to FIG. 23D are cross-sectional views illustrating a structure example of a transistor.

FIG. 25A is a diagram showing classification of crystal structures. FIG. 25B is a diagram showing an XRD spectrum of a CAAC-IGZO film. FIG. 25C is a diagram showing nanobeam electron diffraction patterns of the CAAC-IGZO film.

FIG. 26A is a perspective view illustrating an example of a semiconductor wafer, FIG. 26B is a perspective view illustrating an example of a chip, and FIG. 26C and FIG. 26D are perspective views illustrating examples of electronic components.

FIG. 27A to FIG. 27J are perspective views and schematic views illustrating examples of electronic devices.

FIG. 30 is a diagram showing memory cell sizes.

FIG. 31A1, FIG. 31A2, FIG. 31B1, FIG. 31B2, FIG. 31C1, and FIG. 31C2 are schematic views of memory cells. FIG. 31D1 and FIG. 31D2 are diagrams illustrating arrangement examples of peripheral driver circuits and memory cell arrays.

MODE FOR CARRYING OUT THE INVENTION

Figures 1A, 1B:
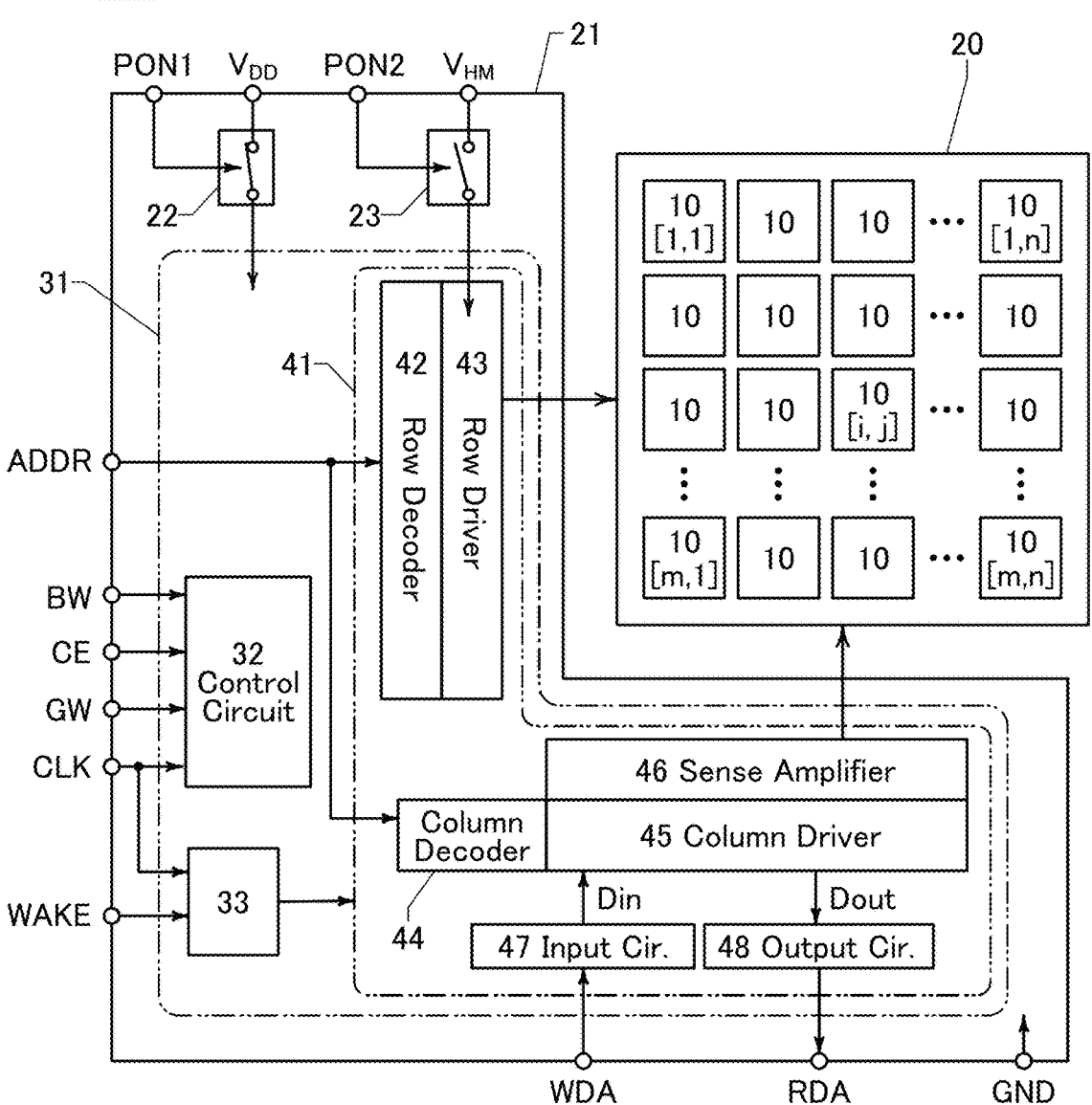
FIG. 1A is a block diagram illustrating a structure example of a semiconductor device.
FIG. 1B is a perspective view illustrating a structure example of a semiconductor device.

In this specification and the like, a semiconductor device refers to a device that utilizes semiconductor characteristics, and means a circuit including a semiconductor element (a transistor, a diode, a photodiode, or the like), a device including the circuit, and the like. In addition, the semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than that shown in the drawings or the text is regarded as being disclosed in the drawings or the text. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, or a load) can be connected between X and Y. Note that a switch is controlled to be in an on state or an off state. That is, a switch can be regarded as having a function of being in a conduction state (on state) or a non-conduction state (off state) to control whether or not current flows.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. Note that for example, even when another circuit is sandwiched between X and Y, X and Y are functionally connected when a signal output from X is transmitted to Y.

Note that an explicit description that X and Y are electrically connected includes the case where X and Y are electrically connected (i.e., the case where X and Y are connected with another element or another circuit sandwiched therebetween) and the case where X and Y are directly connected (i.e., the case where X and Y are connected without another element or another circuit sandwiched therebetween).

In addition, it can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by using an expression method similar to these examples, a source (or a first terminal or the like) and a drain (or a second terminal or the like) of a transistor can be distinguished from each other to specify the technical scope. Note that these expressions are just examples and expressions are not limited to these expressions. Here, each of X and Y denotes an object (e.g., a device, an element, a circuit, a wiring, an electrode, a terminal, a conductive film, or a layer).

Note that even when a circuit diagram shows that independent components are electrically connected to each other, one component has functions of a plurality of components in some cases. For example, when part of a wiring also functions as an electrode, one conductive film has functions of both components: a function of the wiring and a function of the electrode. Thus, electrical connection in this specification also includes such a case where one conductive film has functions of a plurality of components, in its category.

In addition, in this specification and the like, for a "resistor", a circuit element, a wiring, or the like having a resistance value higher than $0\Omega$ can be used, for example. Therefore, in this specification and the like, a "resistor" includes a wiring having a resistance value, a transistor in which current flows between its source and drain, a diode, a coil, and the like. Thus, the term "resistor" can be replaced with the term such as "resistance", "load", or "region having a resistance value"; conversely, the term "resistance", "load", or "region having a resistance value" can be replaced with the term such as "resistor". The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1 \times 10^9$ Ω.

In the case where a wiring is used for a resistor, the resistance value is sometimes determined depending on the length of the wiring. Alternatively, a conductor with resistivity different from that of a conductor used for a wiring is sometimes used for a resistor. Alternatively, the resistance value is sometimes determined by doping a semiconductor with an impurity.

In addition, in this specification and the like, a "capacitor" can be, for example, a circuit element having an electrostatic capacitance value higher than 0 F, a region of a wiring having an electrostatic capacitance value higher than 0 F, parasitic capacitance, gate capacitance of a transistor, or the like. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. Furthermore, the term such as "capacitor", "parasitic capacitance", or "gate capacitance" can be replaced with the term such as "capacitance"; conversely, the term "capacitance" can be replaced with the term such as "capacitor", "parasitic capacitance", or "gate capacitance". Moreover, the term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In addition, in this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relation of a transistor. Note that depending on the transistor structure, a transistor may include a back gate in addition to the above three terminals. In that case, in this specification and the like, one of the gate and the back gate of the transistor is sometimes referred to as a first gate, and the other of the gate and the back gate of the transistor is sometimes referred to as a second gate. Moreover, the terms "gate" and "back gate" can be replaced with each other in one transistor in some cases. In the case where a transistor includes three or more gates, the gates may be sometimes referred to as a first gate, a second gate, and a third gate, for example, in this specification and the like.

In this specification and the like, "node" can be referred to as a terminal, a wiring, an electrode, a conductive layer, a conductor, an impurity region, or the like depending on a circuit structure, a device structure, or the like. Furthermore, a terminal, a wiring, or the like can be referred to as "node".

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the terms "high-level potential" (also referred to as "H potential" or "H") and "low-level potential" (also referred to as "L potential" or "L") do not mean a particular potential. For example, in the case where two wirings are both described as "functioning as a wiring for supplying a high-level potential", the levels of the high-level potentials supplied from these wirings are not necessarily equal to each other. Similarly, in the case where two wirings are both described as "functioning as a wiring for supplying a low-level potential", the levels of the low-level potentials supplied from these wirings are not necessarily equal to each other.

"Current" is a charge transfer phenomenon (electrical conduction); for example, the description "electrical conduction of positively charged particles occurs" can be rephrased as "electrical conduction of negatively charged particles occurs in an opposite direction". Therefore, unless otherwise specified, "current" in this specification and the like refers to a charge transfer phenomenon (electrical conduction) accompanied by carrier movement. Examples of a carrier here include an electron, a hole, an anion, a cation, and a complex ion, and the carrier differs between current flow systems (e.g., a semiconductor, a metal, an electrolyte solution, and a vacuum). In addition, "direction of current" in a wiring or the like refers to a direction in which a positive carrier moves, and the amount of current is expressed as a positive value. In other words, a direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. Furthermore, the description "current is input to element A" can be rephrased as "current is output from element A", for example.

In addition, ordinal numbers such as "first", "second", and "third" in this specification and the like are used to avoid confusion among components. Thus, the ordinal numbers do not limit the number of components. Furthermore, the ordinal numbers do not limit the order of components. For example, a "first" component in one embodiment in this specification and the like can be referred to as a "second" component in other embodiments, the scope of claims, or the like. For another example, a "first" component in one embodiment in this specification and the like can be omitted in other embodiments, the scope of claims, or the like.

In this specification and the like, terms for describing positioning, such as "over" and "under", are sometimes used for convenience to describe the positional relation between components with reference to drawings. Furthermore, the positional relation between components is changed as appropriate in accordance with a direction in which each component is described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

The term "over" or "under" does not necessarily mean that a component is placed directly above or directly below and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term such as "electrode", "wiring", or "terminal" does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term such as "electrode", "wiring", or "terminal" is sometimes replaced with the term such as "region" depending on the case.

In this specification and the like, the term such as "wiring", "signal line", or "power supply line" can be interchanged with each other depending on the case or the situation. For example, the term "wiring" can be changed into the term "signal line" in some cases. Furthermore, for example, the term "wiring" can be changed into the term such as "power supply line" in some cases. Conversely, the term such as "signal line" or "power supply line" can be changed into the term "wiring" in some cases. The term such as "power supply line" can be changed into the term such as "signal line" in some cases. Conversely, the term such as "signal line" can be changed into the term such as "power supply line" in some cases. Moreover, the term "potential" that is applied to a wiring can sometimes be changed into the term such as "signal" depending on the case or the situation. Conversely, the term such as "signal" can be changed into the term "potential" in some cases.

In this specification and the like, an impurity in a semiconductor refers to, for example, an element other than a main component of a semiconductor layer. For example, an element with a concentration lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch has a function of controlling whether current flows or not by being in a conduction state (an on state) or a non-conduction state (an off state). Alternatively, a switch has a function of selecting and changing a current path. For example, an electrical switch, a mechanical switch, or the like can be used. That is, a switch can be any element capable of controlling current, and is not limited to a certain element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (Micro Electro Mechanical Systems) technology. Such a switch includes an electrode that can be moved mechanically, and operates by controlling conduction and non-conduction with movement of the electrode.

In this specification, "parallel" indicates a state where two straight lines are placed at an angle greater than or equal to $-10°$ and less than or equal to $10°$. Accordingly, the case where the angle is greater than or equal to $-5°$ and less than or equal to $5°$ is also included. In addition, "approximately parallel" or "substantially parallel" indicates a state where two straight lines are placed at an angle greater than or equal to $-30°$ and less than or equal to $30°$. In addition, "perpendicular" indicates a state where two straight lines are placed at an angle greater than or equal to $80°$ and less than or equal to $100°$. Accordingly, the case where the angle is greater than or equal to $85°$ and less than or equal to $95°$ is also included. Furthermore, "approximately perpendicular" or "substantially perpendicular" indicates a state where two straight lines are placed at an angle greater than or equal to $60°$ and less than or equal to $120°$.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an "OS transistor" is mentioned, the "OS transistor" can also be referred to as a transistor including a metal oxide or an oxide semiconductor.

In this specification and the like, a metal oxide containing nitrogen is also collectively referred to as a metal oxide in some cases. Furthermore, a metal oxide containing nitrogen may be referred to as a metal oxynitride.

In this specification and the like, one embodiment of the present invention can be constituted by combining, as appropriate, a structure described in each embodiment with any of the structures described in the other embodiments. Furthermore, in the case where a plurality of structure examples are described in one embodiment, the structure examples can be combined with each other as appropriate.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be construed as being limited to the description in the embodiments. Note that in the structures of the invention in the embodiments, the same reference numerals are used in common for the same portions or portions having similar functions in different drawings, and repeated description thereof is omitted in some cases. Moreover, some components are omitted in a perspective view, a top view, and the like for easy understanding of the drawings in some cases.

In the drawings in this specification, the size, the layer thickness, or the region is exaggerated for clarity in some cases. Therefore, embodiments of the present invention are not limited to the size, aspect ratio, and the like shown in the drawings. Note that the drawings schematically show ideal examples, and embodiments of the present invention are not limited to shapes, values, and the like shown in the drawings. For example, variation in signal, voltage, or current due to noise or variation in signal, voltage, or current due to difference in timing can be included.

In this specification and the like, when a plurality of components are denoted with the same reference numerals, and in particular need to be distinguished from each other, an identification sign such as "_1", "[i]", or "[m,n]" is sometimes added to the reference numerals. For example, one of two wirings CL is referred to as a wiring CL[1] and the other is referred to as a wiring CL[2] in some cases.

Embodiment 1

A structure example of a semiconductor device 100 including a memory cell 10 (also referred to as a "memory element") will be described.

FIG. 1A is a block diagram illustrating a structure example of the semiconductor device 100 of one embodiment of the present invention. The semiconductor device 100 illustrated in FIG. 1A includes a driver circuit 21 and a memory array 20. The memory array 20 includes a plurality of memory cells 10. FIG. 1A illustrates an example in which the memory array 20 includes the plurality of memory cells 10 arranged in a matrix of m rows and n columns (each of m and n is an integer greater than or equal to 2).

Note that the rows and the columns extend in directions orthogonal to each other. In this embodiment, the X direction is referred to as a "row" and the Y direction is referred to as a "column", but the X direction may be referred to as a "column" and the Y direction may be referred to as a "row".

In FIG. 1A, the memory cell 10 in the first row and the first column is referred to as a memory cell 10[1,1], and the memory cell 10 in the m-th row and the n-th column is referred to as a memory cell 10[m,n]. The memory cell 10 in the i-th row and the j-th column (i is an integer greater than or equal to 1 and less than or equal to m; and j is an integer greater than or equal to 1 and less than or equal to n) is referred to as a memory cell 10[i,j].

The memory array 20 includes m wirings WL (word lines) extending in the row direction, n wirings BL (bit lines) extending in the column direction, n switches SW1, and n switches SW2 (not illustrated). The plurality of memory cells 10 provided in the j-th column are electrically connected to the wiring BL in the j-th column (wiring BL[j]). The plurality of memory cells 10 provided in the i-th row are electrically connected to the wiring WL in the i-th row (wiring WL[i]).

The driver circuit 21 includes a PSW 22 (power switch), a PSW 23, and a peripheral circuit 31. The peripheral circuit 31 includes a peripheral circuit 41, a control circuit 32, and a voltage generation circuit 33.

In the semiconductor device 100, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

The signal BW, the signal CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 32.

The control circuit 32 is a logic circuit having a function of controlling the entire operation of the semiconductor device 100. For example, the control circuit performs a logical operation on the signal CE, the signal GW, and the signal BW to determine an operation mode (e.g., a writing operation or a reading operation) of the semiconductor device 100. Alternatively, the control circuit 32 generates a control signal for the peripheral circuit 41 so that the operation mode is executed.

The voltage generation circuit 33 has a function of generating a negative voltage. The signal WAKE has a function of controlling the input of the signal CLK to the voltage generation circuit 33. For example, when an H-level signal is supplied as the signal WAKE, the signal CLK is input to the voltage generation circuit 33, and the voltage generation circuit 33 generates a negative voltage.

The peripheral circuit 41 is a circuit for writing and reading data to/from the memory cell 10. The peripheral circuit 41 includes a row decoder 42, a column decoder 44, a row driver 43, a column driver 45, an input circuit 47 (Input Cir.), an output circuit 48 (Output Cir.), and a sense amplifier 46.

The row decoder 42 and the column decoder 44 have a function of decoding the signal ADDR. The row decoder 42 is a circuit for specifying a row to be accessed, and the column decoder 44 is a circuit for specifying a column to be accessed. The row driver 43 has a function of selecting the wiring WL specified by the row decoder 42. The column driver 45 has a function of writing data to the memory cell 10, a function of reading data from the memory cell 10, a function of retaining the read data, and the like.

The input circuit 47 has a function of retaining the signal WDA. Data retained by the input circuit 47 is output to the column driver 45. Data output from the input circuit 47 is data (Din) to be written to the memory cell 10. Data (Dout) read from the memory cell 10 by the column driver 45 is output to the output circuit 48. The output circuit 48 has a function of retaining Dout. In addition, the output circuit 48 has a function of outputting Dout to the outside of the semiconductor device 100. Data output from the output circuit 48 is the signal RDA.

The PSW 22 has a function of controlling supply of $V_{DD}$ to the peripheral circuit 31. The PSW 23 has a function of controlling supply of $V_{HM}$ to the row driver 43. Here, in the semiconductor device 100, a high power supply voltage is $V_{DD}$ and a low power supply voltage is GND (a ground potential). In addition, $V_{HM}$ is a high power supply voltage used to set a word line at a high level and is higher than $V_{DD}$. The on/off of the PSW 22 is controlled by the signal PON1, and the on/off of the PSW 23 is controlled by the signal PON2. The number of power domains to which $V_{DD}$ is supplied is one in the peripheral circuit 31 in FIG. 1A but can be more than one. In this case, a power switch is provided for each power domain.

The driver circuit 21 and the memory array 20 may be provided on the same plane. As illustrated in FIG. 1B, the driver circuit 21 and the memory array 20 may be provided to overlap with each other. When the driver circuit 21 and the memory array 20 are provided to overlap with each other, the signal transmission distance can be shortened. In addition, the semiconductor device 100 can be downsized.

A connection relation between the memory cell 10[$i,j$], the wiring BL[j], which is the wiring BL in the j-th column, the wiring WL[i], which is the wiring WL in the i-th row, the row driver 43, and the sense amplifier 46 will be described with reference to FIG. 2A.

Figure 2A:
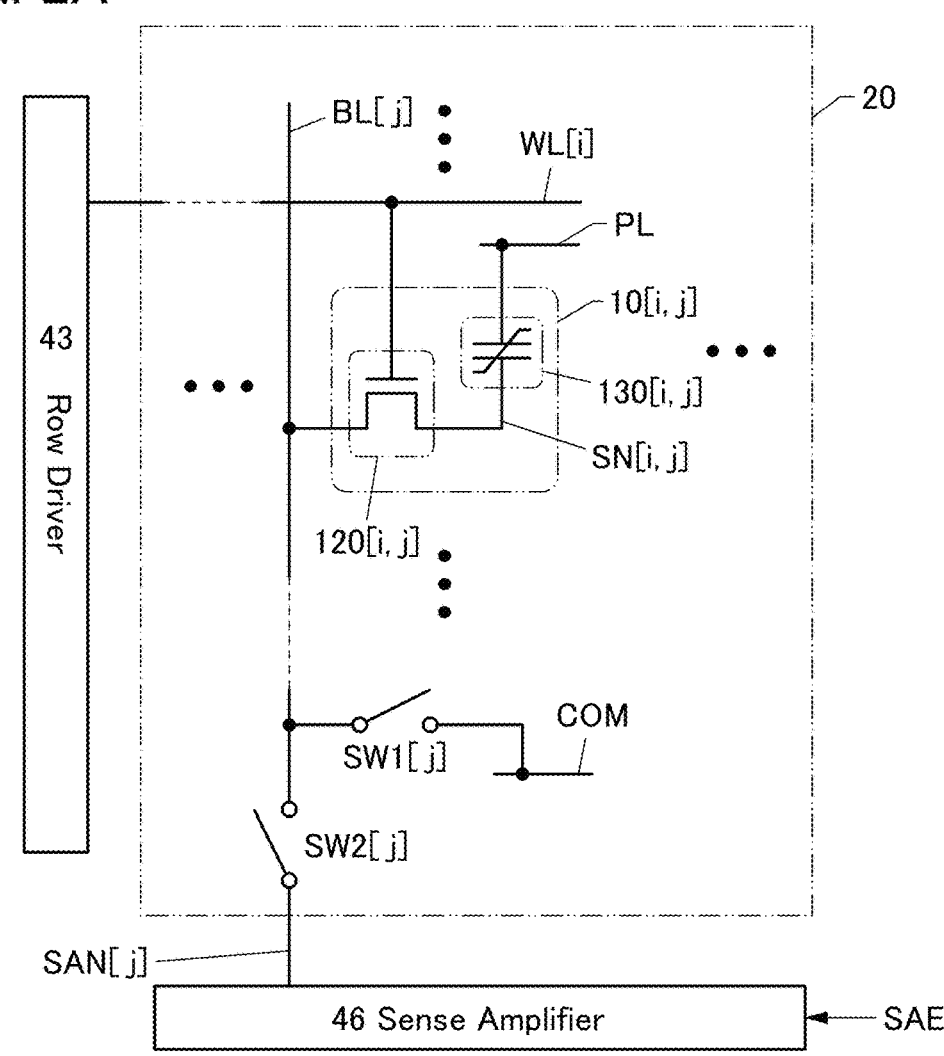
FIG. 2A to FIG. 2C are diagrams illustrating a semiconductor device.

FIG. 2A is a circuit diagram of the memory cell 10[$i,j$] included in the memory array 20. The memory cell 10[$i,j$] includes a transistor 120[$i,j$] and a capacitor 130[$i,j$]. A memory cell composed of one transistor and one capacitor is also referred to as a 1T1C memory cell.

A gate of the transistor 120[$i,j$] is electrically connected to the wiring WL[i], and one of a source and a drain of the transistor 120[$i,j$] is electrically connected to the wiring BL[j]. One electrode of the capacitor 130[$i,j$] is electrically connected to a wiring PL (plate line), and the other electrode is electrically connected to the other of the source and the drain of the transistor 120[$i,j$]. A region where the other electrode of the capacitor 130[$i,j$] is electrically connected to the other of the source and the drain of the transistor 120[$i,j$] is referred to as a node SN[i,j].

The wiring BL[j] is electrically connected to a switch SW1[$j$] and a switch SW2[$j$]. One terminal of the switch SW1[$j$] is electrically connected to the wiring BL[j], and the other terminal is electrically connected to a wiring COM. One terminal of the switch SW2[$j$] is electrically connected to the wiring BL[j], and the other terminal is electrically connected to the sense amplifier 46. A region where the other terminal of the switch SW2[$j$] is electrically connected to the sense amplifier 46 is referred to as a node SAN[j]. The wiring WL[i] is electrically connected to the row driver 43.

Figure 3:
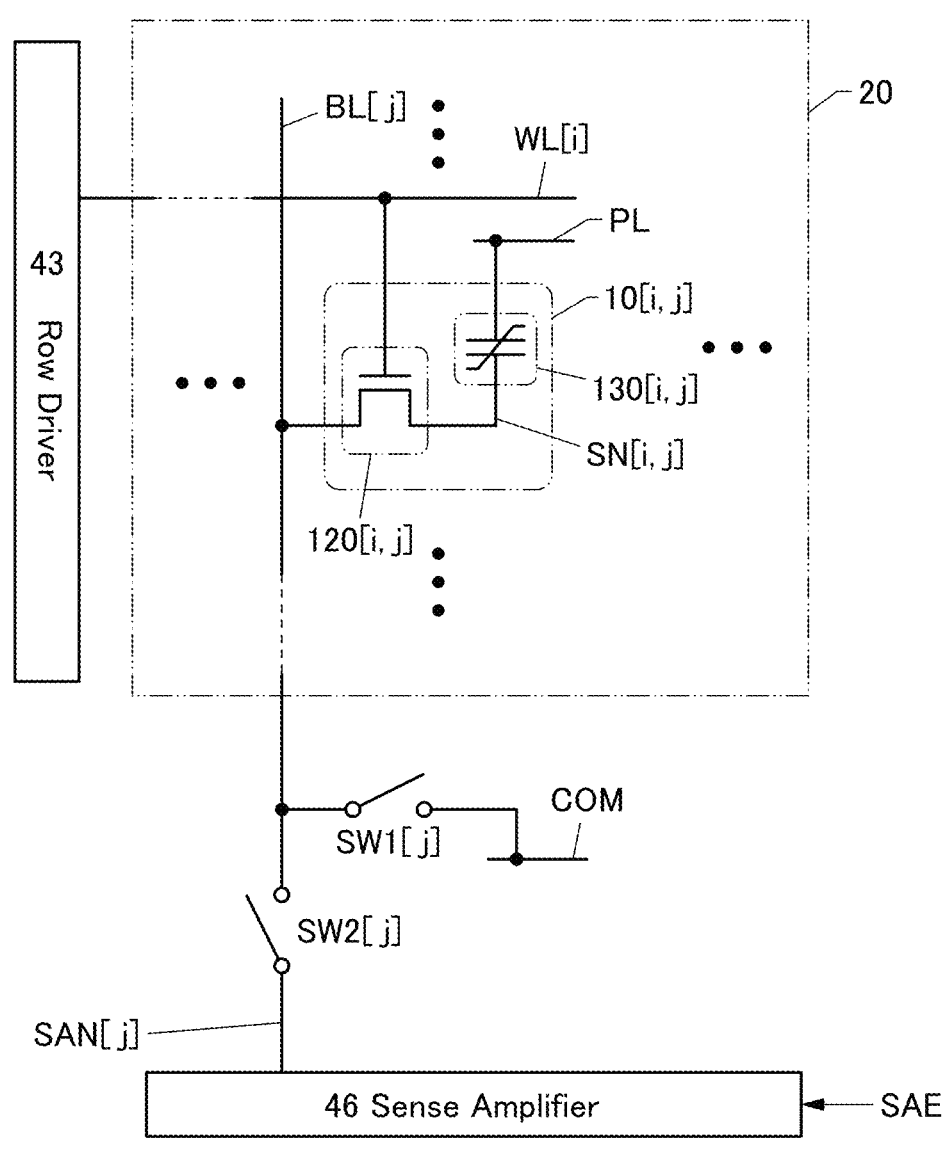
FIG. 3 is a diagram illustrating a semiconductor device.

The n switches SW1 and the n switches SW2 may be provided outside the memory array 20. For example, the switches SW1 and the switches SW2 may be provided between the memory array 20 and the sense amplifier 46 (see FIG. 3). Alternatively, the switches SW1 and the switches SW2 may be provided in the driver circuit 21. For example, the switches SW1 and the switches SW2 may be provided in the sense amplifier 46. Alternatively, either the switches SW1 or the switches SW2 may be provided in the memory array 20 and the others may be provided in the driver circuit 21.

An enable signal SAE is supplied to the sense amplifier 46. When the enable signal SAE is at a potential H, electric power is supplied to the sense amplifier 46 so that the sense amplifier 46 is brought into an operation state. When the enable signal SAE is at a potential L, supply of electric power to the sense amplifier 46 is stopped so that the sense amplifier 46 is brought into a stop state. Supply of electric power to the sense amplifier 46 only in the case where the operation of the sense amplifier 46 is necessary can reduce the power consumption of the semiconductor device 100.

Figure 2B:
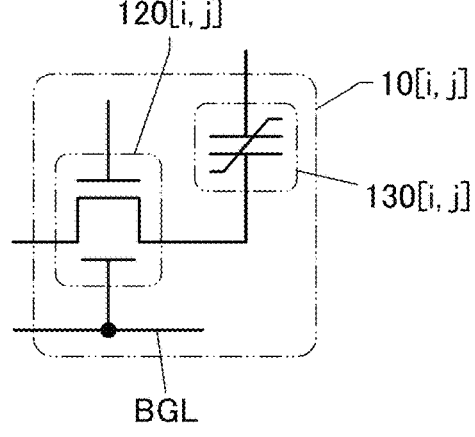
Figure 2C:
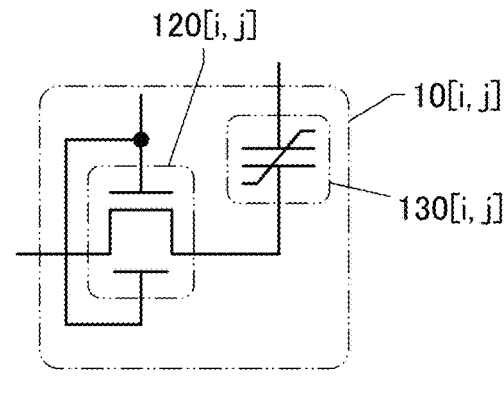

As illustrated in FIG. 2B and FIG. 2C, a transistor with a back gate may be used as the transistor 120. The gate and the back gate are placed such that a channel formation region of a semiconductor is sandwiched between the gate and the back gate. The gate and the back gate are formed using conductors. The back gate can function like the gate. By changing the potential of the back gate, the threshold voltage of the transistor can be changed. The potential of the back gate may be the same as the potential of the gate or may be a ground potential or a given potential.

The gate and the back gate are formed using conductors and thus also have a function of preventing an electric field generated outside the transistor from affecting the semiconductor in which a channel is formed (particularly, a function of preventing static electricity). That is, a variation in the electrical characteristics of the transistor due to the influence of an external electric field such as static electricity can be prevented. Moreover, providing the back gate enables a reduction in the amount of change in the threshold voltage of the transistor before and after a BT test.

FIG. 2B illustrates an example in which the back gate of the transistor 120 is electrically connected to a wiring BGL. FIG. 2C illustrates an example in which the gate and the back gate of the transistor 120 are electrically connected to each other.

Figure 4A:
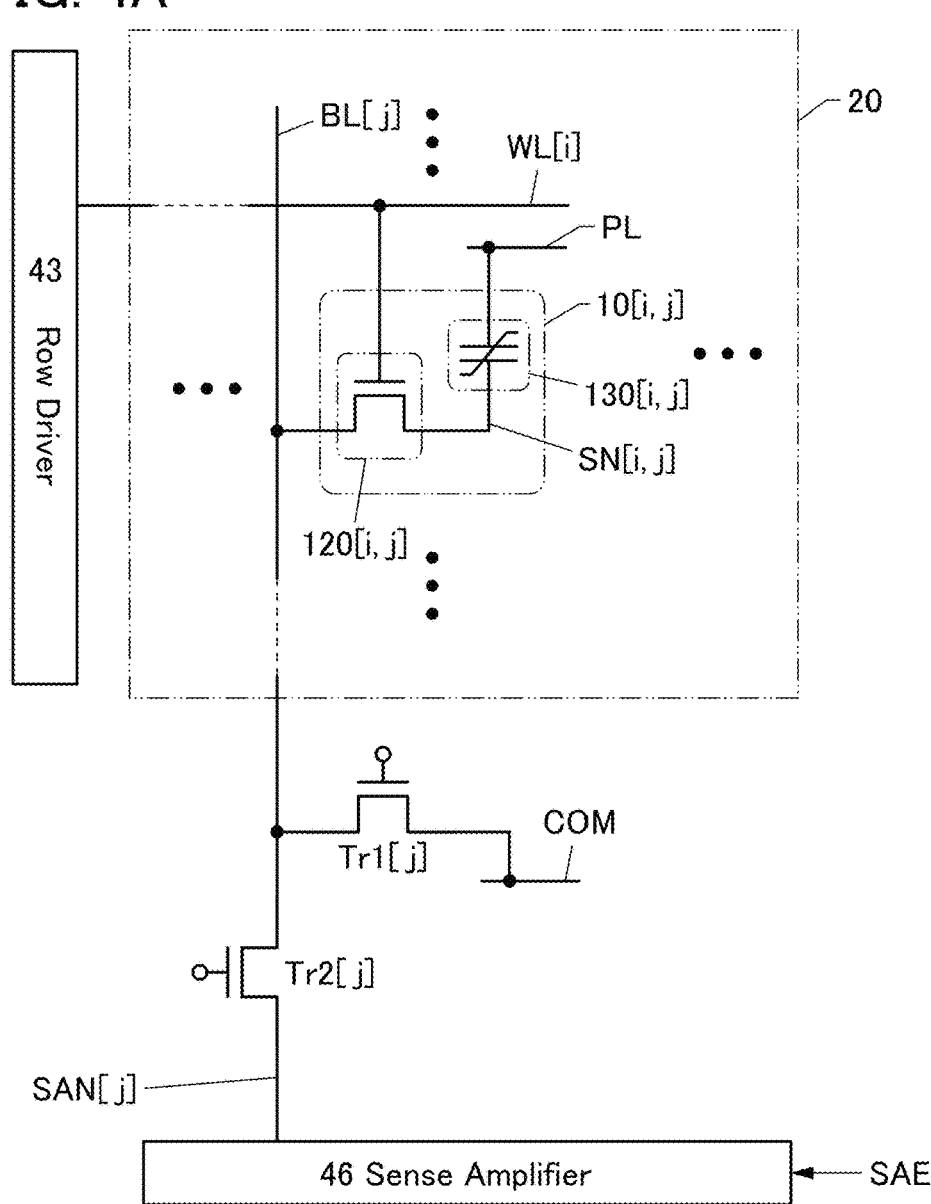
FIG. 4A to FIG. 4C are diagrams illustrating a semiconductor device.
Figure 4B:
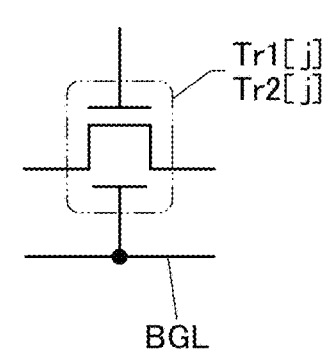
Figure 4C:
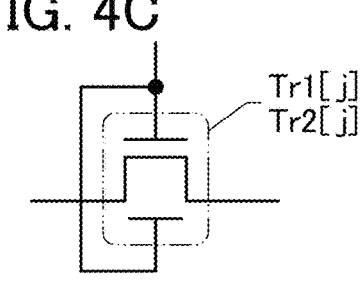

As described above, the switch can be replaced with a transistor. FIG. 4A to FIG. 4C are circuit diagrams in which the switch SW1[$j$] is replaced with a transistor Tr1[$j$] and the switch SW2[$j$] is replaced with a transistor Tr2[$j$].

A material that can have ferroelectricity is used for a dielectric included in the capacitor 130. The capacitor 130 functions as a ferroelectric capacitor.

Examples of the material that can have ferroelectricity include a metal nitride containing an element M1, an element M2, and nitrogen. Note that the element M1 corresponds to a first element, and the element M2 corresponds to a second element. Here, the element M1 is one or more selected from aluminum (Al), gallium (Ga), indium (In), and the like. The element M2 is one or more selected from boron (B), scandium (Sc), yttrium (Y), lanthanum (La), cerium (Ce), neodymium (Nd), europium (Eu), and the like. Note that the ratio of the total number of atoms of the element M1 and the element M2 to the number of nitrogen atoms is 1:1 or the neighborhood thereof. Here, the atomic ratio of the element M1 to the element M2 can be set as appropriate. For example, the number of atoms of the element M1 is preferably greater than the number of atoms of the element M2 and is further preferably 1.5 times or more the number of atoms of the element M2. Note that the atomic ratio of the element M1 to the element M2 preferably falls within the range where the metal nitride can form a solid solution. In the case where two or more of aluminum, gallium, indium, and the like are selected as the element M1, a metal nitride containing the element M1 and nitrogen sometimes has ferroelectricity even when not containing the element M2.

Typical examples of the metal nitride containing the element M1, the element M2, and nitrogen include metal nitrides such as aluminum scandium nitride ($Al_{1-a}Sc_aN_b$ (a is a real number greater than 0 and less than 0.5, and b is 1 or an approximate value of 1)), an Al—Ga—Sc nitride ($Al_{1-c-d}Ga_cSc_dN_b$ (c and d are positive real numbers, c+d is greater than 0 and less than 0.5, and b is 1 or an approximate value of 1)), and a Ga—Sc nitride ($Ga_{1-e}Sc_eN_b$ (e is a real number greater than 0 and less than 1, and b is 1 or an approximate value of 1)). That is, examples of the material that can have ferroelectricity include a material containing aluminum nitride and/or scandium nitride.

Examples of the material that can have ferroelectricity also include a metal nitride containing the element M1, an element M3, and nitrogen. Note that the element M1 corresponds to the first element, and the element M3 corresponds to the second element. Here, the element M1 is one or more selected from aluminum (Al), gallium (Ga), indium (In), and the like. The element M3 is one or more selected from titanium (Ti), zirconium (Zr), hafnium (Hf), vanadium (V), niobium (Nb), tantalum (Ta), chromium (Cr), and the like. In a metal nitride of titanium, zirconium, hafnium, vanadium, niobium, tantalum, or chromium, the valence of the metal element is +3. Thus, in the metal nitride containing the element M1, the element M3, and nitrogen, the valence of the element M3 can also be +3. Accordingly, when the ratio of the total number of atoms of the element M1 and the element M3 to the number of nitrogen atoms is 1:1 or the neighborhood thereof, charge in the metal nitride is sometimes compensated for.

Note that the metal nitride containing the element M1, the element M3, and nitrogen may contain an element M4. Here, the element M4 is one or more selected from magnesium (Mg), calcium (Ca), strontium (Sr), zinc (Zn), cadmium (Cd), and the like. Titanium, zirconium, hafnium, vanadium, niobium, tantalum, or chromium can have a valence of +4 or more. It is thus presumed that charge in the metal nitride is compensated for when the metal nitride contains the element M4 with a valence of +2. The atomic ratio of the element M1 to the element M3 and the element M4 can be set as appropriate. For example, the number of atoms of the element M1 is preferably greater than the total number of atoms of the element M3 and the element M4.

The metal nitride containing the element M1, the element M2, and nitrogen may contain the element M3 or the element M4. In that case, the ratio of the number of atoms of the element M3 or the element M4 to the total number of atoms of the element M1 and the element M2 is preferably less than or equal to 0.05, further preferably less than or equal to 0.02. This can reduce the amount of defects formed to compensate for charge in the metal nitride. Reducing the amount of defects enables the crystallinity of the metal nitride to be improved and ferroelectricity to be easily exhibited.

The metal nitride containing the element M1, the element M3, and nitrogen may contain the element M2. In that case, there is no particular limitation on the ratio of the total number of atoms of the element M1 and the element M3 to the number of atoms of the element M2. This is because charge in the metal nitride is compensated for even when the metal nitride contains the element M2.

The metal nitride containing the element M1, the element M3, the element M4, and nitrogen may contain the element M2. In that case, there is no particular limitation on the ratio of the total number of atoms of the element M1, the element M3, and the element M4 to the number of atoms of the element M2. This is because charge in the metal nitride is compensated for even when the metal nitride contains the element M2.

Since the above metal nitride contains at least a Group 13 element and nitrogen, which is a Group 15 element, the metal nitride is referred to as a ferroelectric of Group 13 to 15, a ferroelectric of a Group 13 nitride, or the like in some cases.

Examples of the material that can have ferroelectricity also include metal oxides such as hafnium oxide, zirconium oxide, and $HfZrO_X$ (X is a real number greater than 0). Examples of the material that can have ferroelectricity also include a material in which an element J1 (the element J1 here is one or more selected from zirconium (Zr), silicon (Si), aluminum (Al), gadolinium (Gd), yttrium (Y), lanthanum (La), strontium (Sr), and the like) is added to hafnium oxide. Here, the atomic ratio of hafnium to the element J1 can be set as appropriate; the atomic ratio of hafnium to the element J1 is, for example, 1:1 or the neighborhood thereof. Examples of the material that can have ferroelectricity also include a material in which an element J2 (the element J2 here is one or more selected from hafnium (Hf), silicon (Si), aluminum (Al), gadolinium (Gd), yttrium (Y), lanthanum (La), strontium (Sr), and the like) is added to zirconium oxide. The atomic ratio of zirconium to the element J2 can be set as appropriate; the atomic ratio of zirconium to the element J2 is, for example, 1:1 or the neighborhood thereof. Note that the material containing hafnium oxide or the material containing hafnium oxide and zirconium oxide may have any one or more selected from cubic, tetragonal, orthorhombic, and monoclinic crystal structures.

As the material that can have ferroelectricity, a piezoelectric ceramic having a perovskite structure, such as lead titanate ($PbTiO_X$), barium strontium titanate (BST), strontium titanate, lead zirconate titanate (PZT), strontium bismuth tantalate (SBT), bismuth ferrite (BFO), or barium titanate may be used. Examples of the material that can have ferroelectricity also include a perovskite-type oxynitride such as $SrTaO_2N$ or $BaTaO_2N$ and $GaFeO_3$ with a κ-alumina-type structure.

Note that although metal oxides and metal nitrides are shown as examples in the above description, one embodiment of the present invention is not limited thereto. For example, a metal oxynitride in which nitrogen is added to any of the above metal oxides, a metal nitride oxide in which oxygen is added to any of the above metal nitrides, or the like may be used.

As the material that can have ferroelectricity, a mixture or compound containing a plurality of materials selected from the above-listed materials can be used, for example. Since the above-listed materials and the like may change their crystal structures (characteristics) according to a variety of processes and the like as well as deposition conditions, a material that exhibits ferroelectricity is referred to not only as a ferroelectric but also as a material that can have ferroelectricity or a material that has ferroelectricity in this specification and the like. In other words, the term "ferroelectric" in this specification and the like includes both a material that exhibits ferroelectricity and a material that can have ferroelectricity.

A material containing hafnium oxide or a material containing hafnium oxide and zirconium oxide tends to exhibit ferroelectricity even with a thickness of several nanometers. With the use of a ferroelectric that can be thin as the dielectric of the capacitor 130, the capacitor 130 functioning as a ferroelectric capacitor can be easily combined with a semiconductor element such as a scaled-down transistor. That is, it is easy to obtain a semiconductor device that occupies a smaller area. Note that in this specification and the like, a layer of the material that can have ferroelectricity is referred to as a "ferroelectric layer" in some cases. Furthermore, in this specification and the like, a device including a ferroelectric layer is referred to as a ferroelectric device in some cases.

Figure 5:
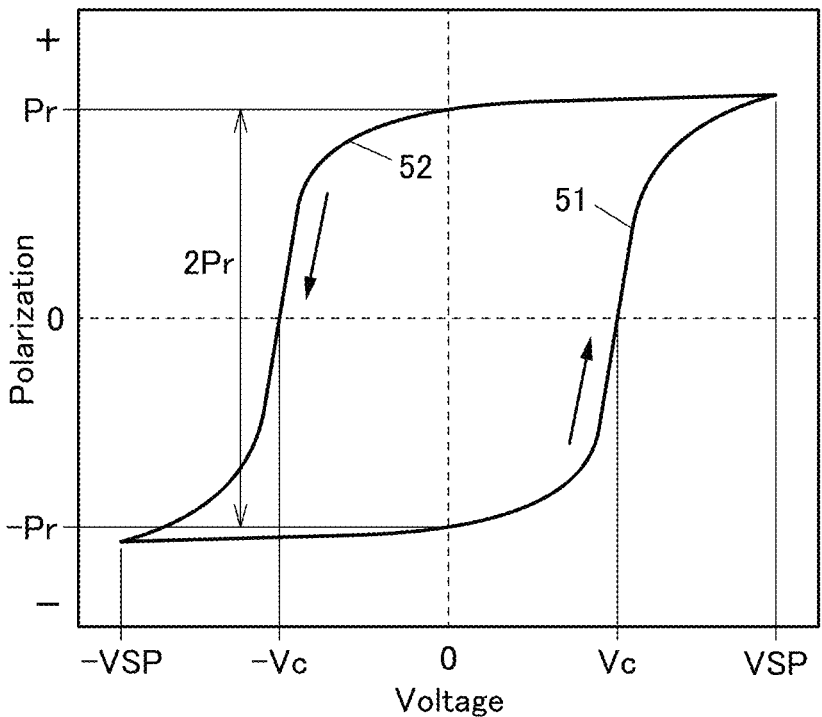
FIG. 5 is a diagram showing an example of hysteresis characteristics.

The ferroelectric layer has hysteresis characteristics. FIG. 5 is a diagram showing an example of hysteresis characteristics. The hysteresis characteristics can be measured using a capacitor including a ferroelectric layer as a dielectric (a ferroelectric capacitor). In FIG. 5, the horizontal axis represents voltage (electric field) applied to the ferroelectric layer. This voltage is a potential difference between one electrode and the other electrode of the capacitor including the ferroelectric layer as the dielectric. The electric field strength can be obtained by dividing the potential difference by the thickness of the ferroelectric layer.

In FIG. 5, the vertical axis represents polarization in the ferroelectric layer. Positive polarization indicates that positive charge in the ferroelectric layer is biased toward one electrode side of the capacitor and negative charge is biased toward the other electrode side of the capacitor. By contrast, negative polarization indicates that negative charge in the ferroelectric layer is biased toward one electrode side of the capacitor and positive charge is biased toward the other electrode side of the capacitor.

The polarization represented by the vertical axis of the graph in FIG. 5 may be positive when negative charge is biased toward one electrode side of the capacitor and positive charge is biased toward the other electrode side of the capacitor, and may be negative when positive charge is biased toward one electrode side of the capacitor and negative charge is biased toward the other electrode side of the capacitor.

As shown in FIG. 5, the hysteresis characteristics of the ferroelectric layer can be represented by a curve 51 and a curve 52. Voltages at intersection points of the curve 51 and the curve 52 are referred to as a saturation polarization voltage VSP and a saturation polarization voltage –VSP. VSP and –VSP can be regarded as having different polarities.

When a voltage lower than or equal to –VSP is applied to the ferroelectric layer and then the voltage applied to the ferroelectric layer increases, the polarization in the ferroelectric layer increases along the curve 51. Meanwhile, when a voltage higher than or equal to VSP is applied to the ferroelectric layer and then the voltage applied to the ferroelectric layer decreases, the polarization in the ferroelectric layer decreases along the curve 52. Note that in some cases, VSP is referred to as a "positive saturation polarization voltage" or a "first saturation polarization voltage", and –VSP is referred to as a "negative saturation polarization voltage" or a "second saturation polarization voltage". The absolute value of the first saturation polarization voltage may be the same as or different from the absolute value of the second saturation polarization voltage.

Here, the voltage at the time when the polarization in the ferroelectric layer changes along the curve 51 to reach 0 is referred to as a coercive voltage Vc. The voltage at the time when the polarization in the ferroelectric layer changes along the curve 52 to reach 0 is referred to as a coercive voltage –Vc. The value of Vc and the value of –Vc are each a value between –VSP and VSP. In some cases, Vc is referred to as a "positive coercive voltage" or a "first coercive voltage", and –Vc is referred to as a "negative coercive voltage" or a "second coercive voltage". The absolute value of the first coercive voltage may be the same as or different from the absolute value of the second coercive voltage.

The maximum value and the minimum value of polarization when voltage is not applied to the ferroelectric layer (when the voltage is 0 V) are referred to as "remanent polarization Pr" and "remanent polarization –Pr", respectively. The difference between the absolute values of the remanent polarization Pr and the remanent polarization –Pr is referred to as "remanent polarization 2Pr". A larger remanent polarization 2Pr increases the range of a change in the capacitance value of the ferroelectric capacitor due to polarization reversal. The remanent polarization 2Pr is preferably as large as possible.

The memory cell 10 includes the capacitor 130 that is a ferroelectric capacitor and the transistor 120 and has a function of storing information using a change in a capacitance value due to polarization reversal in the capacitor 130. The memory cell 10 functions as a ferroelectric memory. A memory cell composed of one transistor and one ferroelectric capacitor is also referred to as a 1T1F memory cell.

As the semiconductor layer in which the channel of the transistor 120 is formed, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor may be used.

Note that the transistor 120 is preferably a transistor using an oxide semiconductor, which is a kind of metal oxide, in its semiconductor layer in which a channel is formed (such a transistor is also referred to as an "OS transistor"). An oxide semiconductor has a band gap greater than or equal to 2 eV, and thus has an extremely low off-state current. Thus, the power consumption of the memory cell 10 can be reduced. Accordingly, the power consumption of the semiconductor device 100 including the memory cell 10 can be reduced.

A memory cell including an OS transistor can be referred to as an "OS memory". The semiconductor device 100 including the memory cell can also be referred to as an "OS memory".

The OS transistor operates stably even in a high-temperature environment and has small fluctuation in characteristics. For example, the off-state current hardly increases even in the high-temperature environment. Specifically, the off-state current hardly increases even at an environmental temperature higher than or equal to room temperature and lower than or equal to 200° C. Furthermore, the on-state current is unlikely to decrease even in the high-temperature environment. Thus, the OS memory can operate stably and have high reliability even in the high-temperature environment.

Moreover, the OS transistor has a high breakdown voltage between its source and drain. Even when the channel length of the transistor 120 is reduced, the use of the OS transistor as the transistor 120 allows voltage required for polarization reversal to be supplied to the capacitor 130. This can reduce the area occupied by the memory cell 10. Accordingly, the memory capacity and/or memory density of the semiconductor device can be increased.

Next, a reading operation and a writing operation of the memory cell 10 that is a ferroelectric memory will be described with reference to drawings. Note that the operations described in this embodiment are common to all the memory cells 10; thus, identification signs such as "[i]" and "[i,j]" are omitted.

As prerequisites, VSP and −VSP required for polarization reversal are 4 V and −4 V, respectively. In the case where the absolute value of voltage applied to the capacitor 130 is lower than or equal to 3 V, polarization reversal does not occur. The capacitance value of the capacitor 130 at the time of negative polarization is higher than that at the time of positive polarization. The capacitor 130 retains data "1" at the time of negative polarization and retains "0" at the time of positive polarization. The wiring COM is supplied with 0 V.

<Reading Operation>

Figure 6:
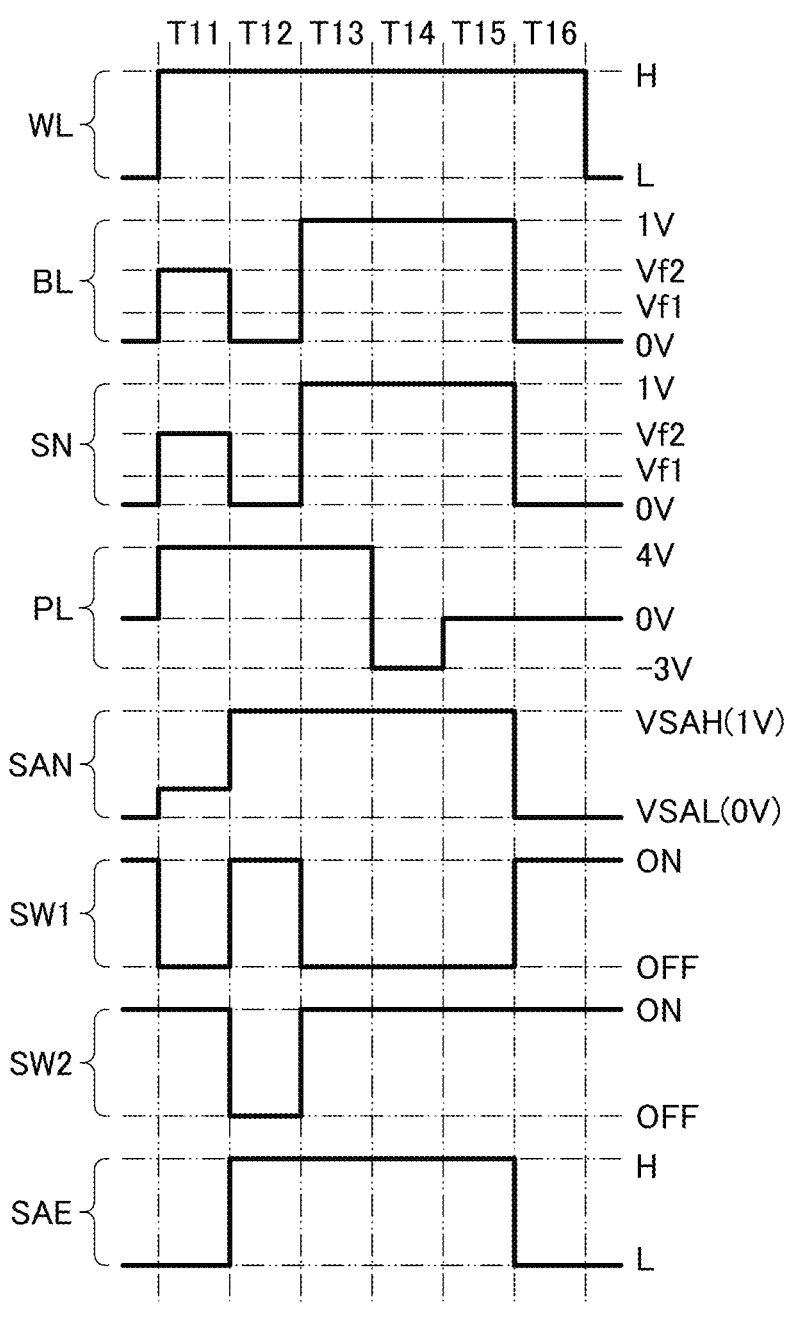
FIG. 6 is a timing chart for showing a reading operation.
Figure 14:
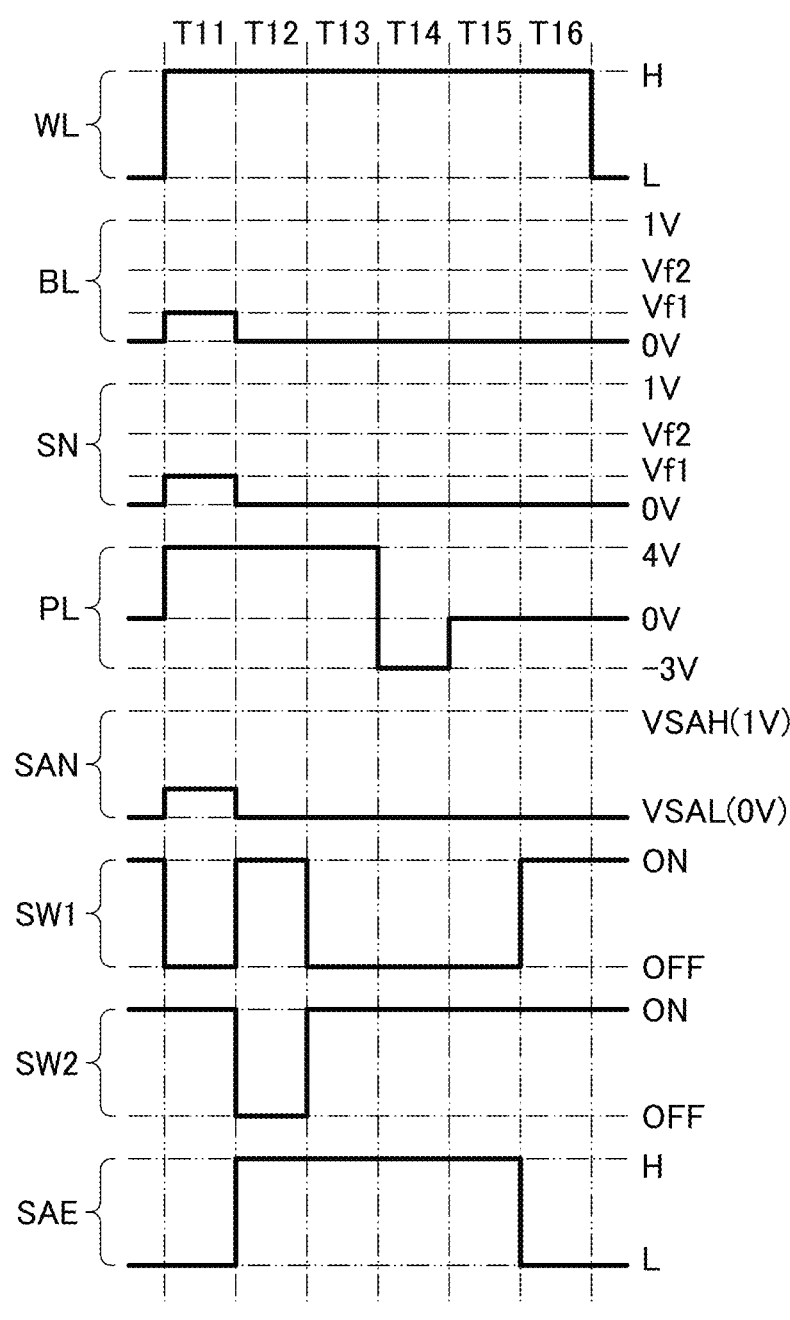
FIG. 14 is a timing chart for showing a reading operation.

An operation of reading data from the memory cell 10 will be described. FIG. 6 and FIG. 14 are timing charts for showing reading operations. A in each of FIG. 7 to FIG. 13, FIG. 15, and FIG. 16 is a circuit diagram for illustrating an operation state of the memory cell 10. B in each of FIG. 7 to FIG. 13, FIG. 15, and FIG. 16 shows hysteresis characteristics of polarization in the capacitor 130, and a white circle indicates polarization 55 in the operation state in A. Note that the horizontal axis in B in each of FIG. 7 to FIG. 13, FIG. 15, and FIG. 16 represents voltage applied to the capacitor 130. More specifically, the horizontal axis represents the potential of the wiring PL at the time when the node SN is at 0 V. The vertical axis in B in each of FIG. 7 to FIG. 13, FIG. 15, and FIG. 16 represents polarization in the capacitor 130.

In a circuit diagram or the like illustrating an operation state, in order to make it easy to know the potential of a wiring or the like, a sign such as "H" representing a potential H or "L" representing a potential L is written beside the wiring or the like. In addition, the sign such as "H" or "L" is sometimes written by an enclosed character near a wiring or the like whose potential has changed. Furthermore, a symbol "x" sometimes overlaps with an off-state transistor, an off-state circuit, and the like.

In this specification and the like, the potential H applied to a gate of an n-channel transistor is a potential that brings the transistor into an on state, and the potential L is a potential that brings the transistor into an off state. The potential L applied to a gate of a p-channel transistor is a potential that brings the transistor into an on state, and the potential H is a potential that brings the transistor into an off state.

[Operation of Reading Data "1"]

Figures 7A, 7B:
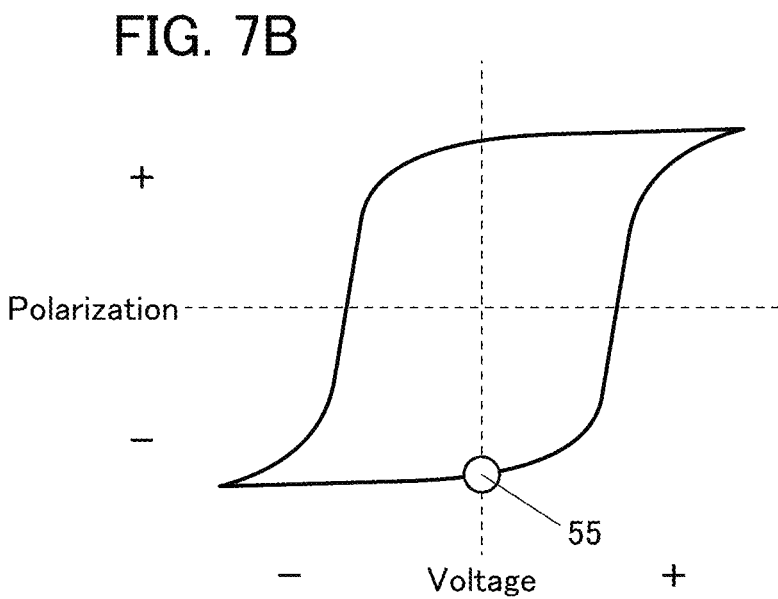
FIG. 7A and FIG. 7B are diagrams showing an operation state of a memory cell.

FIG. 6 is a timing chart for showing an operation of reading the data "1". FIG. 7A is a circuit diagram illustrating an initial state of the memory cell 10. FIG. 7B shows the polarization 55 in the initial state of the memory cell 10. In the initial state, the memory cell 10 retains the data "1". The switch SW1 and the switch SW2 are in a conduction state, and the wiring BL and the node SAN are supplied with 0 V. The potential of the enable signal SAE is the potential L. The potential of the wiring WL is the potential L. Accordingly, the transistor 120 is in an off state. The potentials of the wiring PL and the node SN are 0 V. In the initial state, no voltage is applied to the capacitor 130 and thus the polarization 55 is −Pr (see FIG. 5).

In a period T11, the switch SW1 is turned off. This brings the wiring BL and the node SAN into a floating state. The potential H is supplied to the wiring WL to turn on the transistor 120.

Figure 8A:
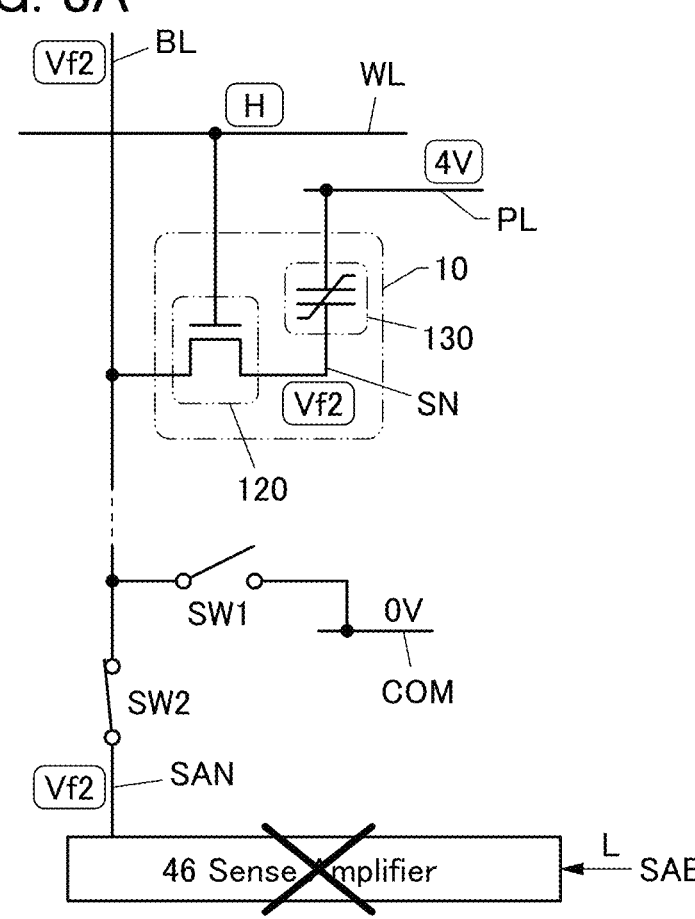
FIG. 8A and FIG. 8B are diagrams showing an operation state of a memory cell.
Figure 8B:
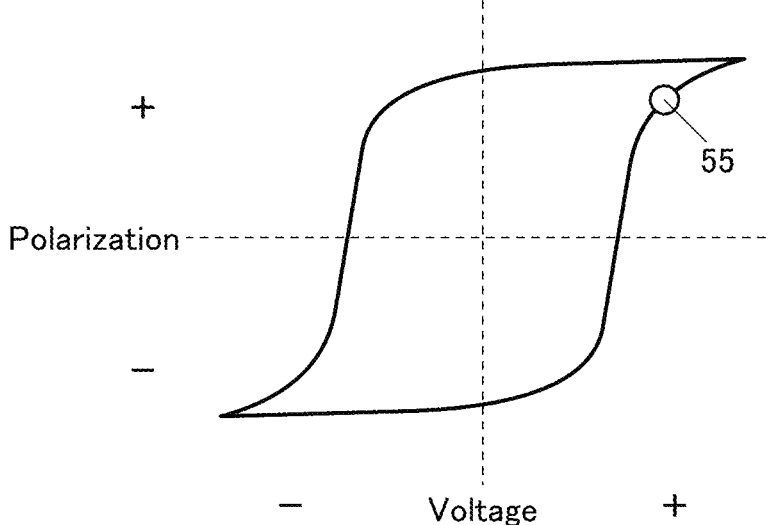

In the period T11, the wiring PL is supplied with 4 V. This causes polarization reversal in the capacitor 130. At this time, current flows through the node SN, the wiring BL, and the node SAN. Since the node SN, the wiring BL, and the node SAN are in the floating state, the potentials of the node SN, the wiring BL, and the node SAN increase. The potentials of the node SN, the wiring BL, and the node SAN increase to a potential Vf2 (see FIG. 8A). The polarization 55 at this time is shown in FIG. 8B.

The level of the potential Vf2 depends on the ratio of the parasitic capacitances of the node SN, the wiring BL, and the node SAN to the capacitance of the capacitor 130. The potential Vf2 is a potential higher than a potential Vf1 described later.

In the period T11, the data "1" written to the memory cell 10 is destroyed because of polarization reversal in the capacitor 130.

Figure 9A:
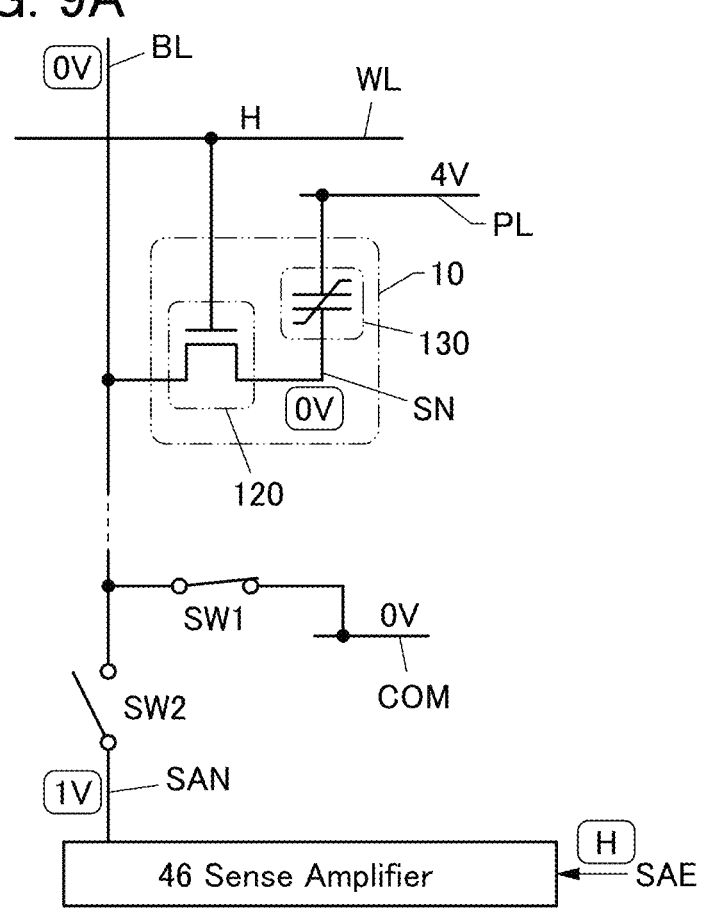
FIG. 9A and FIG. 9B are diagrams showing an operation state of a memory cell.
Figure 9B:
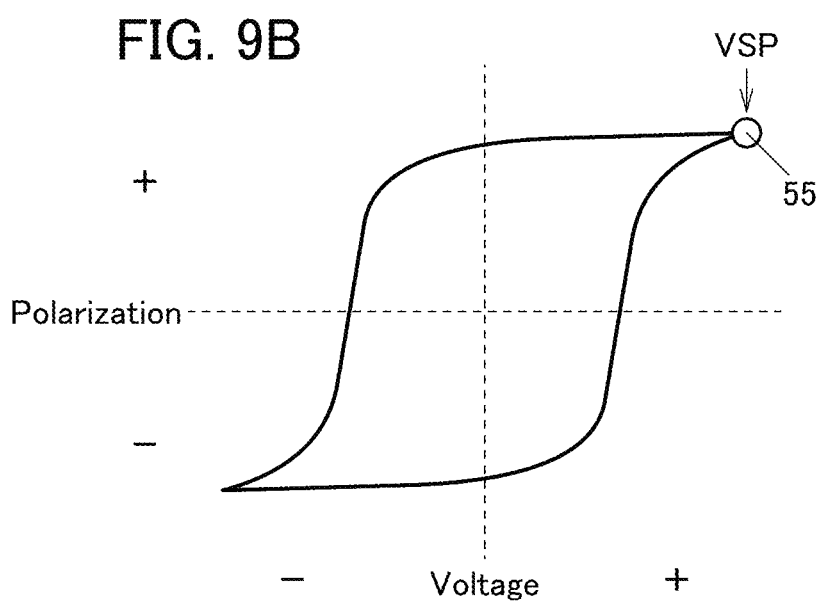

In a period T12, the switch SW1 is turned on and the switch SW2 is turned off (see FIG. 9A). Thus, the potentials of the wiring BL and the node SN become 0 V, and 4 V (saturation polarization voltage VSP) is applied to the capacitor 130. The polarization 55 at this time is shown in FIG. 9B. The application of VSP to the capacitor 130 causes almost complete polarization reversal in the capacitor 130.

The enable signal SAE is set at the potential H, and electric power is supplied to the sense amplifier 46. The sense amplifier 46 has a function of comparing a reference potential and the potential of the node SAN. The reference potential is preferably a potential between the potential Vf2 and the potential Vf1 described later.

The sense amplifier 46 has a function of supplying a potential VSAH to the node SAN in the case where the potential of the node SAN is higher than the reference potential. In the case where the potential of the node SAN is lower than or equal to the reference potential, the sense amplifier 46 has a function of supplying a potential VSAL to the node SAN. The potential VSAH is preferably lower than or equal to 80% of VSP, further preferably lower than or equal to 50% of VSP, still further preferably lower than or equal to 20% of VSP. The potential VSAL is a potential lower than the potential VSAH. In this embodiment, the potential VSAH and the potential VSAL are 1 V and 0 V, respectively. The potential Vf2 is a potential higher than the reference potential; thus, the sense amplifier 46 supplies the potential VSAH to the node SAN.

The data retained in the memory cell 10 can be known on the basis of the output voltage of the sense amplifier 46.

Figure 10A:
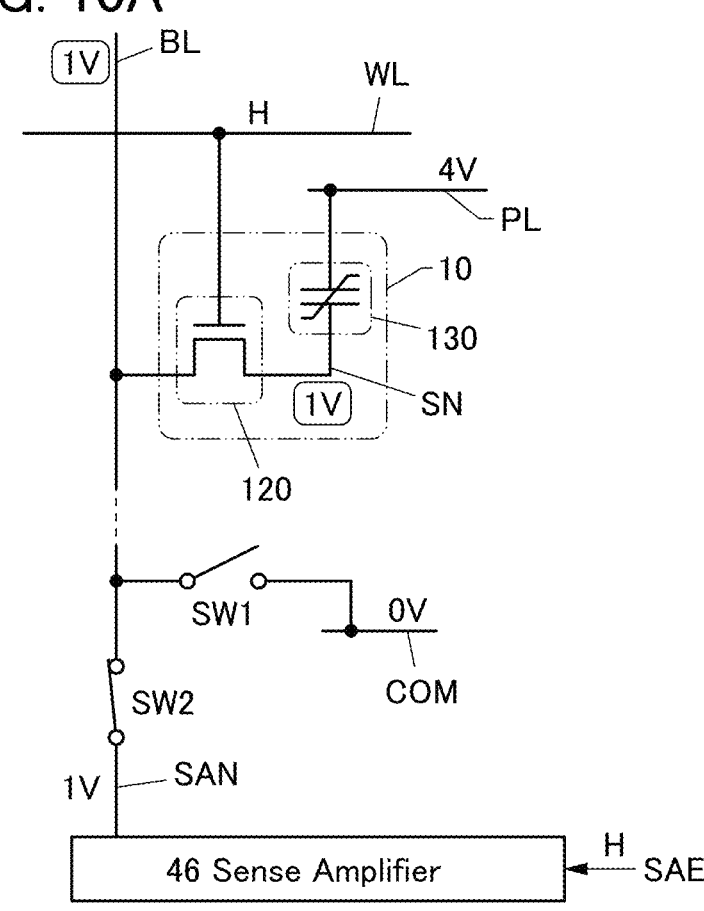
FIG. 10A and FIG. 10B are diagrams showing an operation state of a memory cell.
Figure 10B:
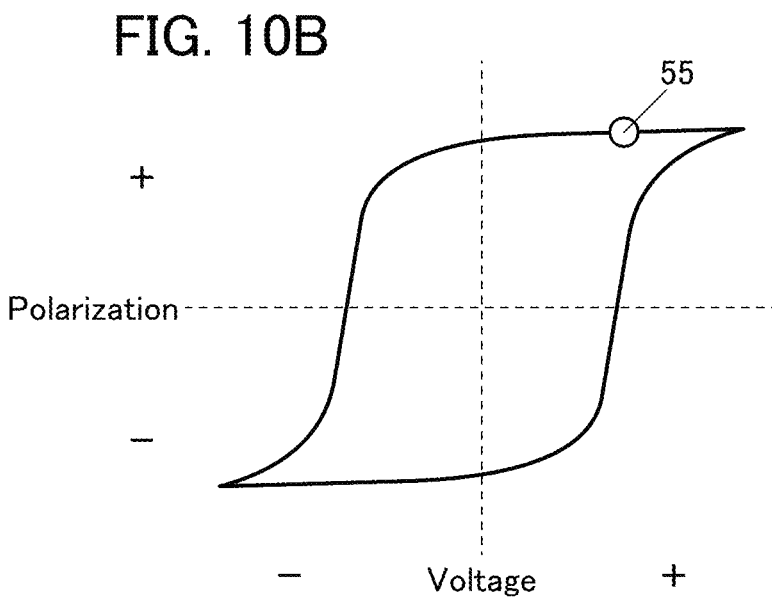

In a period T13, the switch SW1 is turned off and the switch SW2 is turned on (see FIG. 10A). Thus, the potentials of the wiring BL and the node SN become 1 V, and 3 V is applied to the capacitor 130. The polarization 55 at this time is shown in FIG. 10B.

Figure 11A:
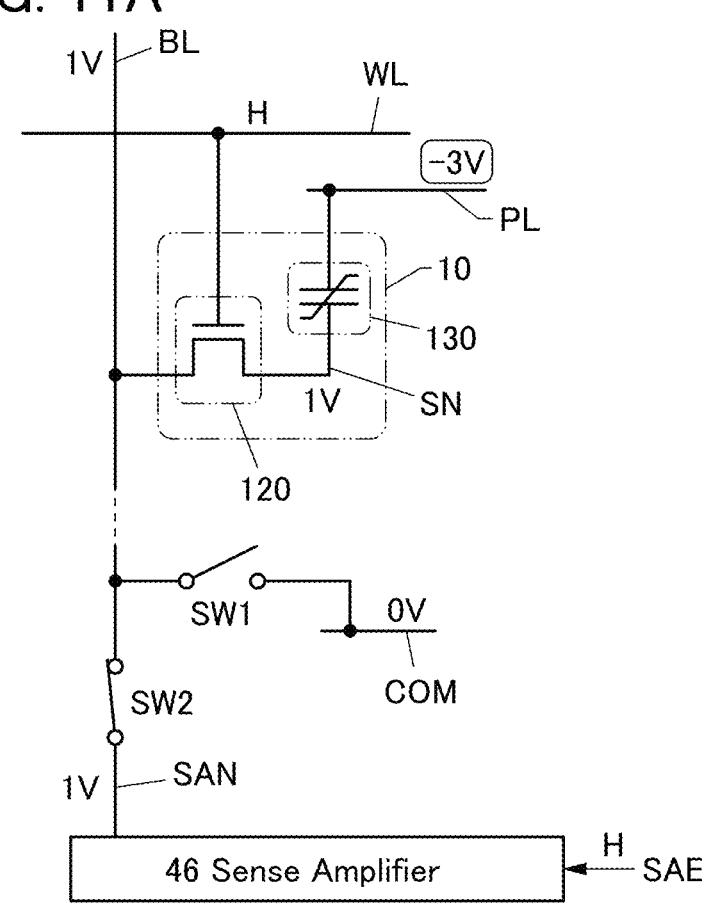
FIG. 11A and FIG. 11B are diagrams showing an operation state of a memory cell.
Figure 11B:
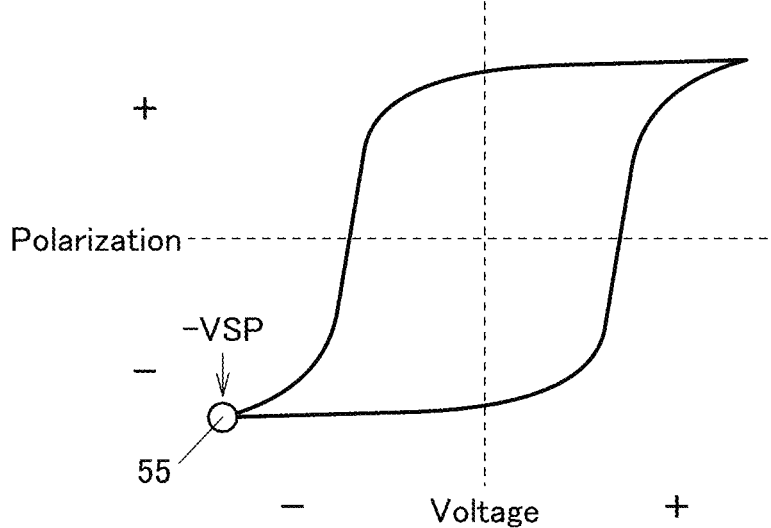

In a period T14, the wiring PL is supplied with −3 V (see FIG. 11A). The potential of the node SN is 1 V at this time; thus, −4 V is applied to the capacitor 130. That is, −VSP is applied to the capacitor 130. The polarization 55 at this time is shown in FIG. 11B. In this manner, the destroyed data "1" can be written back.

Figure 12A:
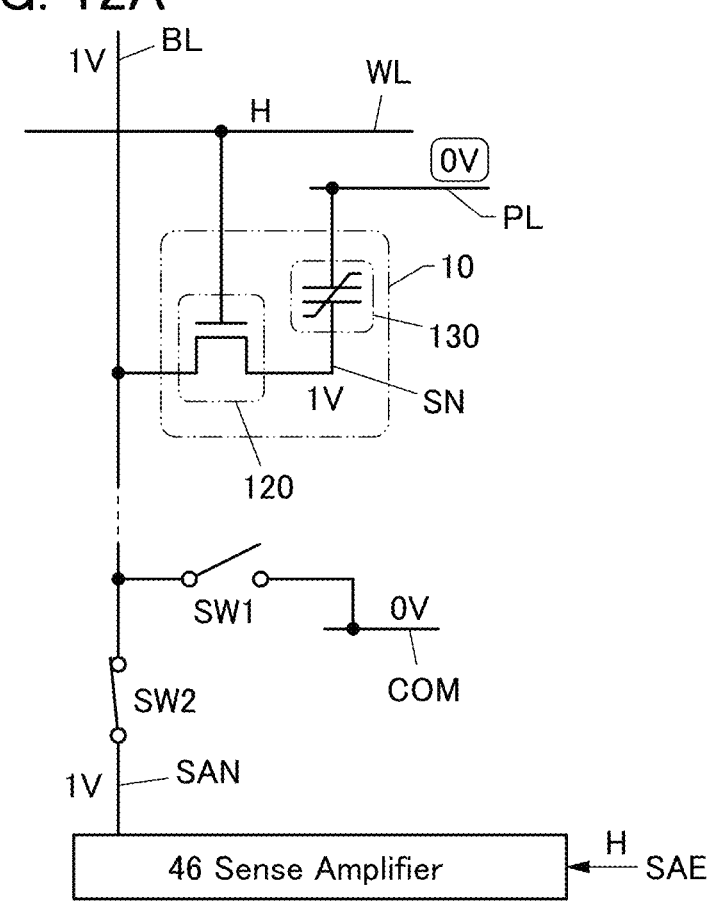
FIG. 12A and FIG. 12B are diagrams showing an operation state of a memory cell.
Figure 12B:
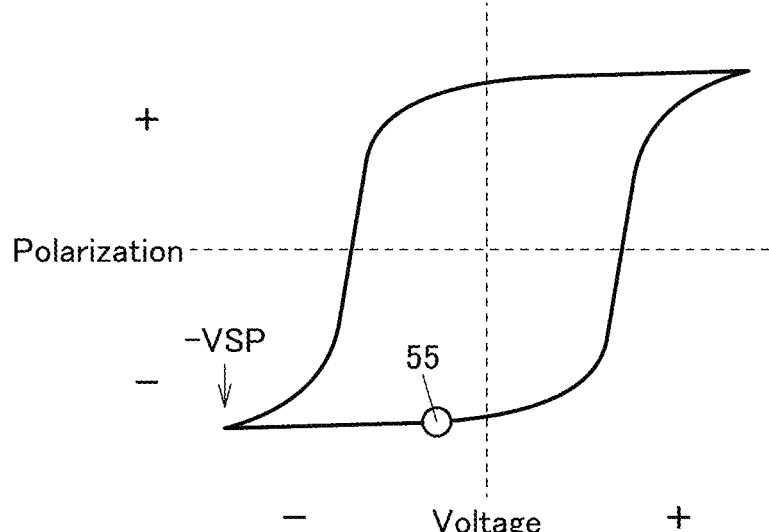
Figure 13A:
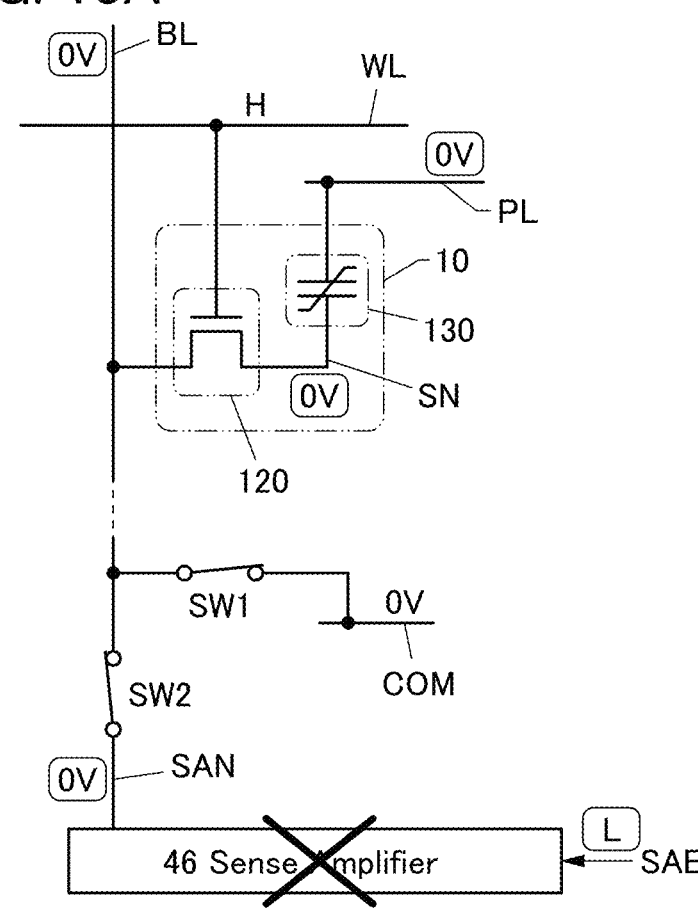
FIG. 13A and FIG. 13B are diagrams showing an operation state of a memory cell.
Figure 13B:
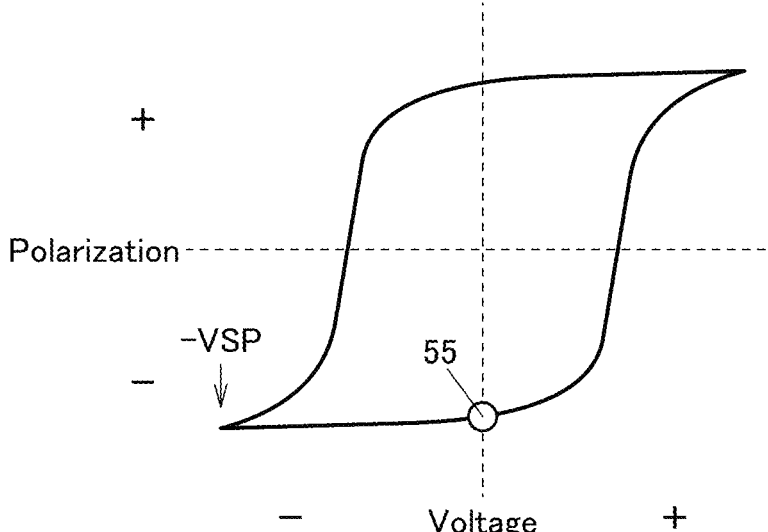

In a period T15, the wiring PL is supplied with 0 V (see FIG. 12A and FIG. 12B).

In a period T16, the switch SW1 is turned on and the enable signal SAE is set at the potential L. Thus, supply of electric power to the sense amplifier 46 is stopped, so that the potentials of the wiring BL, the node SAN, and the node SN become 0 V (see FIG. 13A and FIG. 13B). After that, the potential L is supplied to the wiring WL to turn off the transistor 120.

[Operation of Reading Data "0"]

Figure 15A:
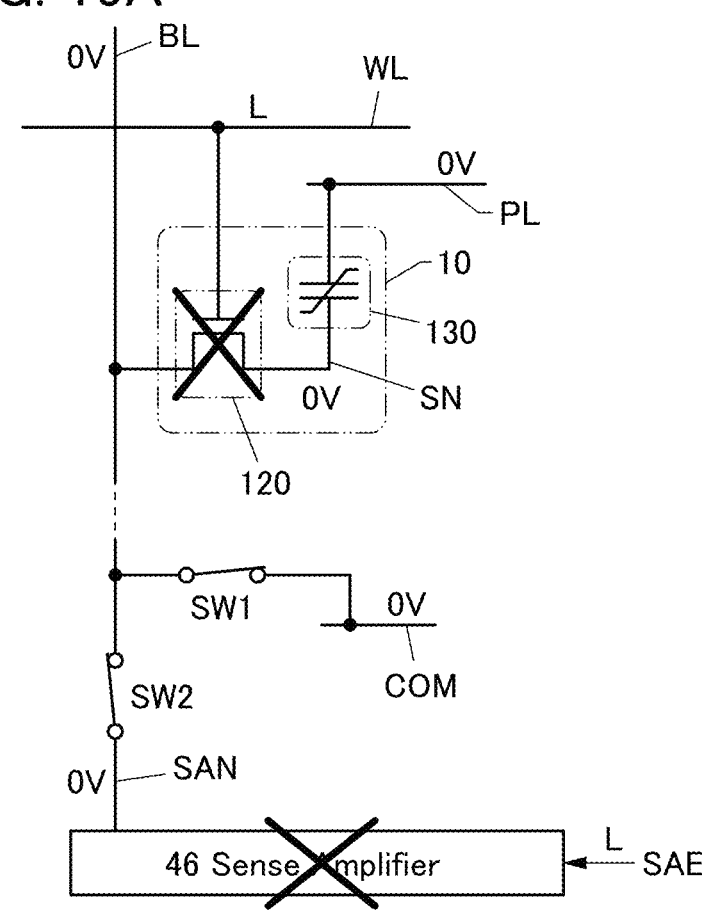
FIG. 15A and FIG. 15B are diagrams showing an operation state of a memory cell.
Figure 15B:
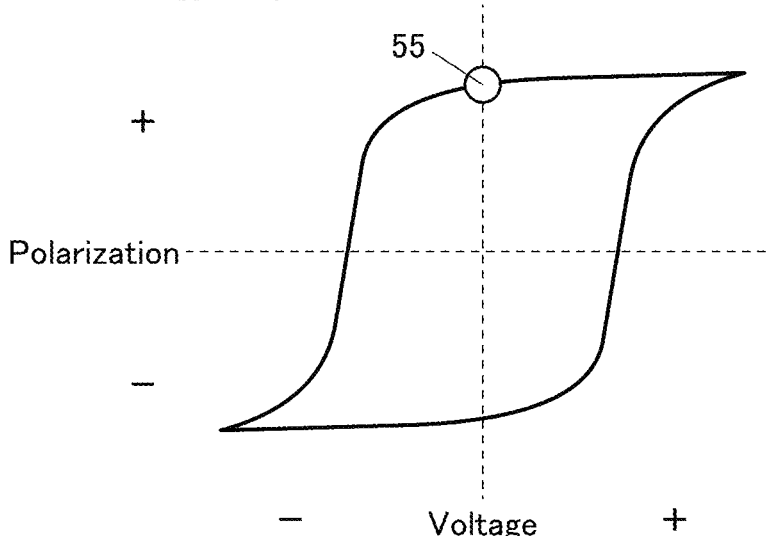
Figure 16A:
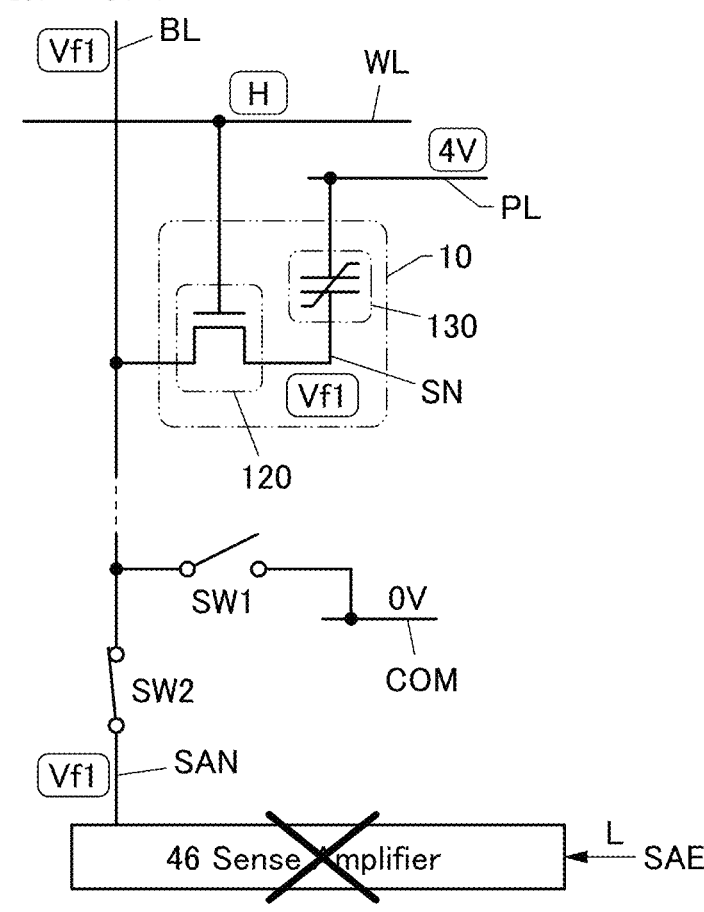
FIG. 16A and FIG. 16B are diagrams showing an operation state of a memory cell.
Figure 16B:
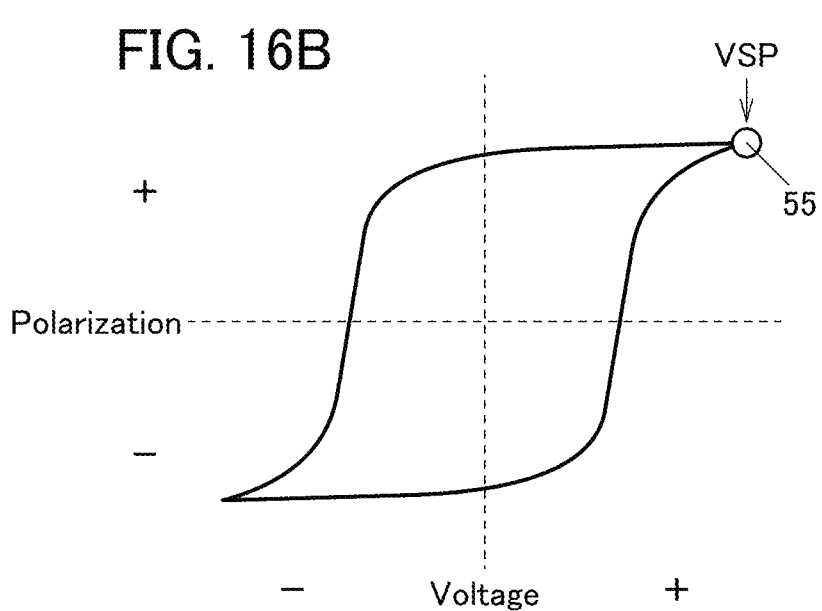

Next, a reading operation in the case where the memory cell 10 retains the data "0" will be described. In order to avoid repeated description, differences from the operation of reading the data "1" will be mainly described. FIG. 14 is a timing chart for showing an operation of reading the data "0". FIG. 15A is a circuit diagram illustrating the initial state of the memory cell 10. FIG. 15B shows the polarization 55 in the initial state of the memory cell 10. In the initial state, the memory cell 10 retains the data "0". In the initial state, no voltage is applied to the capacitor 130 and thus the polarization 55 is Pr (see FIG. 5).

In the period T11, the switch SW1 is turned off. This brings the wiring BL and the node SAN into a floating state. The potential H is supplied to the wiring WL to turn on the transistor 120.

In the period T11, the wiring PL is supplied with 4 V. In the above-described operation of reading the data "1", charge is supplied to the node SN along with the polarization reversal in the capacitor 130, and the potential of the node SN increases to the potential Vf2. Meanwhile, in the operation of reading the data "0", polarization reversal hardly occurs. In the period T11 in the reading operation, when the potential of the node SN after supply of 4 V to the wiring PL is the potential Vf1, the potential Vf1 becomes a potential lower than the potential Vf2 (see FIG. 16A and FIG. 16B).

In the period T12, the switch SW1 is turned on and the switch SW2 is turned off. As in the period T11, polarization reversal does not occur in the capacitor 130 in the operation of reading the data "0". In addition, when the enable signal SAE is set at the potential H in the period T12, the sense amplifier 46 is supplied with electric power and compares the reference potential and the potential of the node SAN. As a result, the potential VSAL (0 V) is supplied to the node SAN.

As in the operation of reading the data "1", the data retained in the memory cell 10 can be known on the basis of the output voltage of the sense amplifier 46.

In the period T13, the switch SW1 is turned off and the switch SW2 is turned on. Thus, the potential VSAL (0 V) is supplied from the sense amplifier 46 to the node SAN, the wiring BL, and the node SN.

In the period T14, the wiring PL is supplied with –3 V. The potential of the node SN is 0 V at this time; thus, –3 V is applied to the capacitor 130. That is, voltage applied to the capacitor 130 does not reach –VSP and polarization reversal does not occur. In reading of the data "0", the data can be read without destruction.

For understanding the operation after the period T15 in the operation of reading the data "0", refer to the description of the operation of reading the data "1".

<Writing Operation>

Next, the writing operation of the memory cell 10 will be described.

[Operation of Writing Data "1"]

Figure 17A:
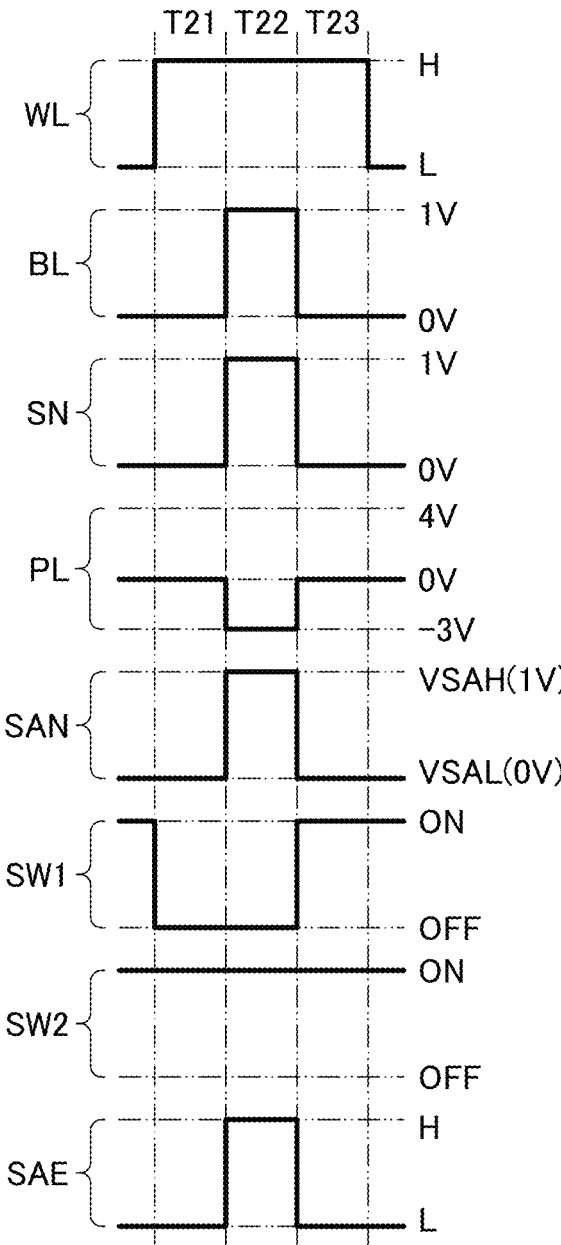
FIG. 17A and FIG. 17B are timing charts for showing writing operations.

FIG. 17A is a timing chart showing an operation of writing the data "1" to the memory cell 10. In a period T21, the switch SW1 is turned off and the switch SW2 is turned on. The potential H is supplied to the wiring WL to turn on the transistor 120.

Figure 18A:
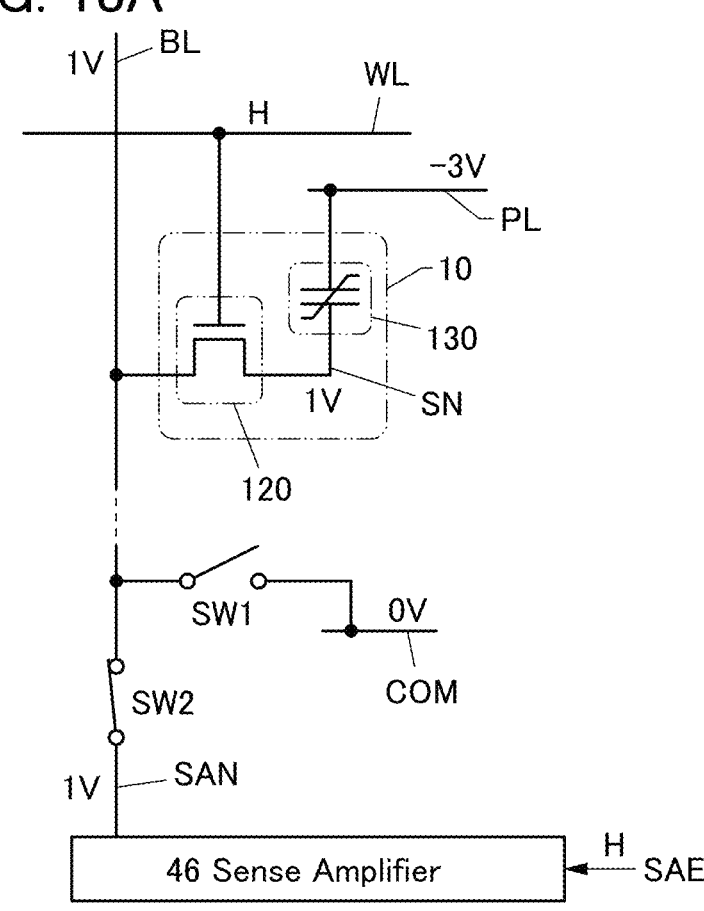
FIG. 18A and FIG. 18B are diagrams showing an operation state of a memory cell.
Figure 18B:
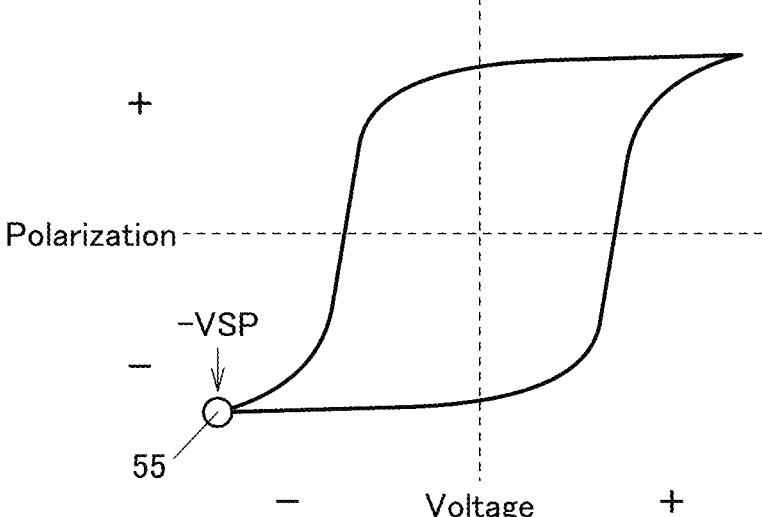

In a period T22, the enable signal SAE is set at the potential H, and the potential VSAH (1 V) is output from the sense amplifier 46. Thus, the potentials of the node SAN, the wiring BL, and the node SN become 1 V. The wiring PL is supplied with –3 V. Thus, –4 V is applied to the capacitor 130. That is, –VSP is applied to the capacitor 130. FIG. 18A is a circuit diagram illustrating the operation state of the memory cell 10 in the period T22. FIG. 18B is a diagram showing the polarization 55 in the period T22.

In a period T23, the enable signal SAE is set at the potential L and supply of electric power to the sense amplifier 46 is stopped. In addition, the switch SW1 is turned on. Thus, the potentials of the node SAN, the wiring BL, and the node SN become 0 V. Moreover, the wiring PL is supplied with 0 V. After that, the potential L is supplied to the wiring WL to turn off the transistor 120. In this manner, the data "1" can be written to the memory cell 10.

[Operation of Writing Data "0"]

Figure 17B:
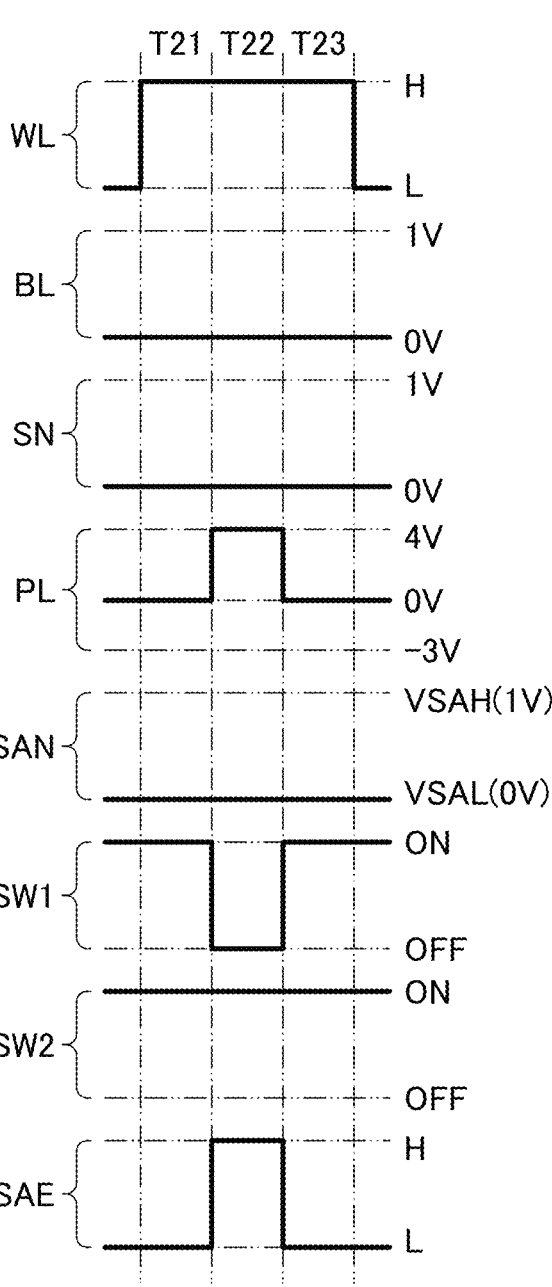

FIG. 17B is a timing chart showing an operation of writing the data "0" to the memory cell 10. In the period T21, the enable signal SAE is set at the potential L to turn on the switch SW1 and the switch SW2. The potential H is supplied to the wiring WL to turn on the transistor 120. Thus, the potentials of the node SAN, the wiring BL, and the node SN become 0 V.

Figure 19A:
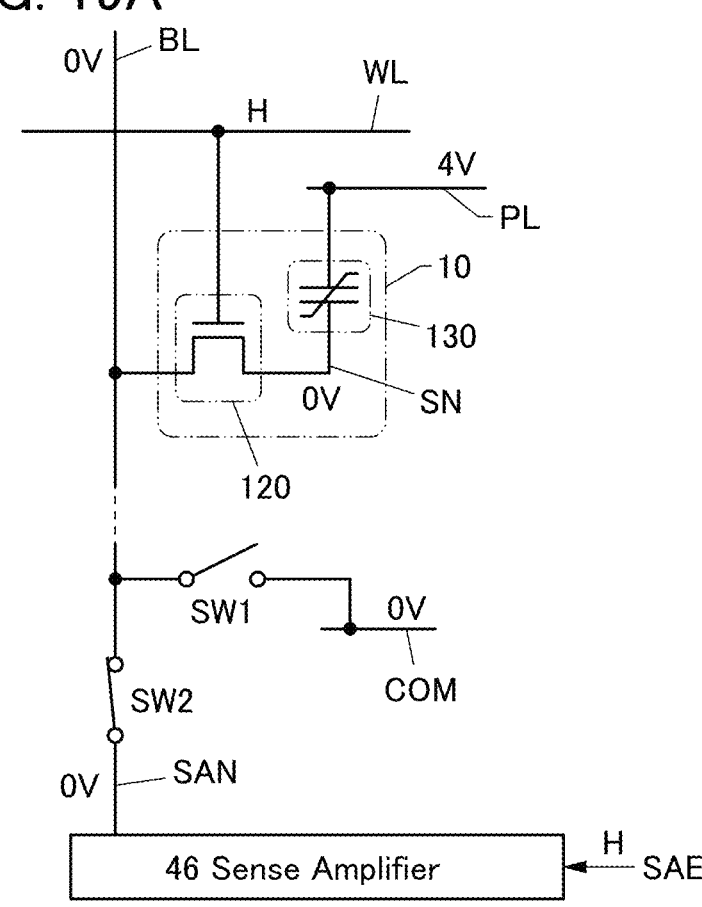
FIG. 19A and FIG. 19B are diagrams showing an operation state of a memory cell.
Figure 19B:
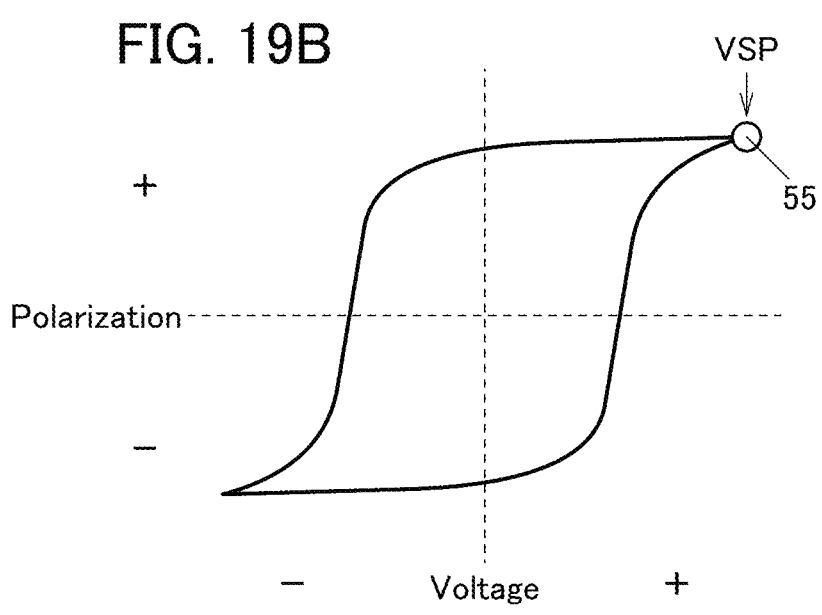

In the period T22, the enable signal SAE is set at the potential H, and the potential VSAL (0 V) is output from the sense amplifier 46. Thus, the potentials of the node SAN, the wiring BL, and the node SN become 0 V. The wiring PL is supplied with 4 V. Thus, 4 V is applied to the capacitor 130. That is, VSP is applied to the capacitor 130. FIG. 19A is a circuit diagram illustrating the operation state of the memory cell 10 in the period T22. FIG. 19B is a diagram showing the polarization 55 in the period T22.

In the period T23, the enable signal SAE is set at the potential L and supply of electric power to the sense amplifier 46 is stopped. In addition, the switch SW1 is turned on and the wiring PL is supplied with 0 V. After that, the potential L is supplied to the wiring WL to turn off the transistor 120. In this manner, the data "0" can be written to the memory cell 10.

In the case where the node SN is supplied with 0 V in the operation of writing the data "0", the enable signal SAE may be set at the potential L to turn on the switch SW1. That is, the node SN may be supplied with 0 V without using the sense amplifier 46. Since the sense amplifier 46 is not used, power consumption can be reduced.

In the reading operation and the writing operation of the data, the sense amplifier 46 has higher power consumption than the memory array 20. According to the structure and/or the operation method described in this embodiment, the output voltage of the sense amplifier 46 can be lower than or equal to 80% of VSP, preferably lower than or equal to 50% of VSP, further preferably lower than or equal to 20% of VSP. Thus, the operating voltage of the sense amplifier 46 can be reduced, thereby reducing the power consumption of the sense amplifier 46. Moreover, the power consumption of the semiconductor device can be reduced.

Modification Example

Figure 20:
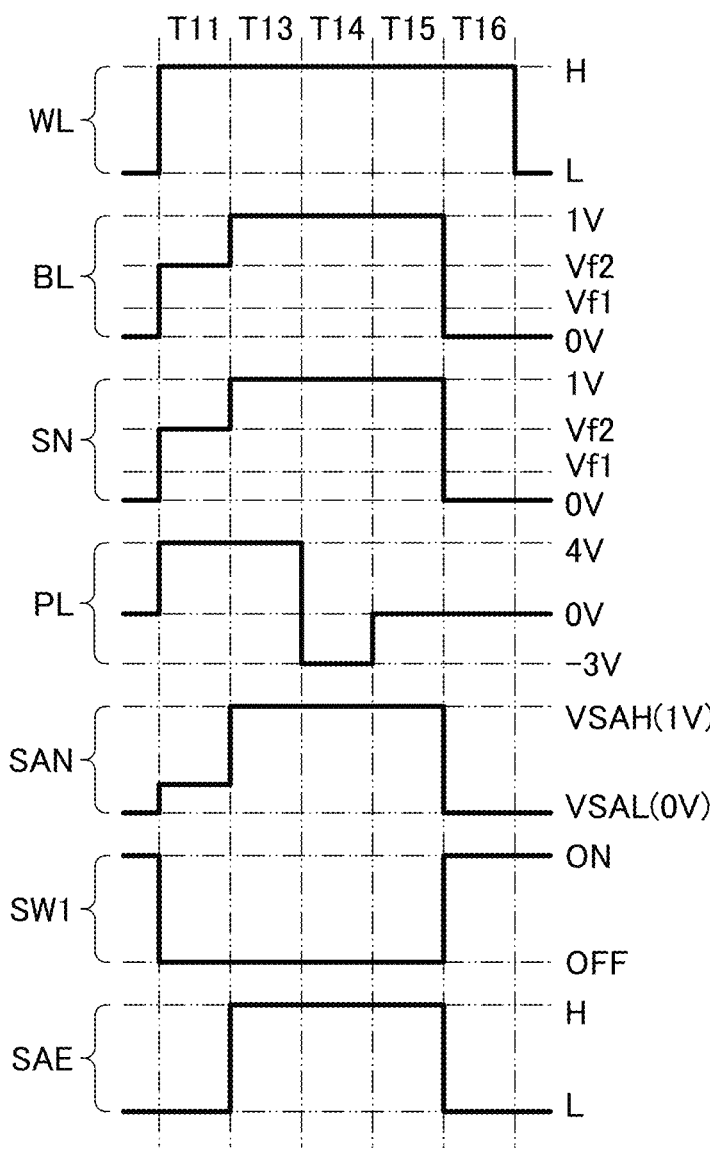
FIG. 20 is a timing chart for showing a reading operation.

In the above-described data reading operation, the period T12 may be omitted. FIG. 20 is a timing chart showing an operation of reading the data "1" in which the period T12 is omitted. Since the period T12 is omitted, the enable signal SAE is set at the potential H in the period T13.

Figure 21A:
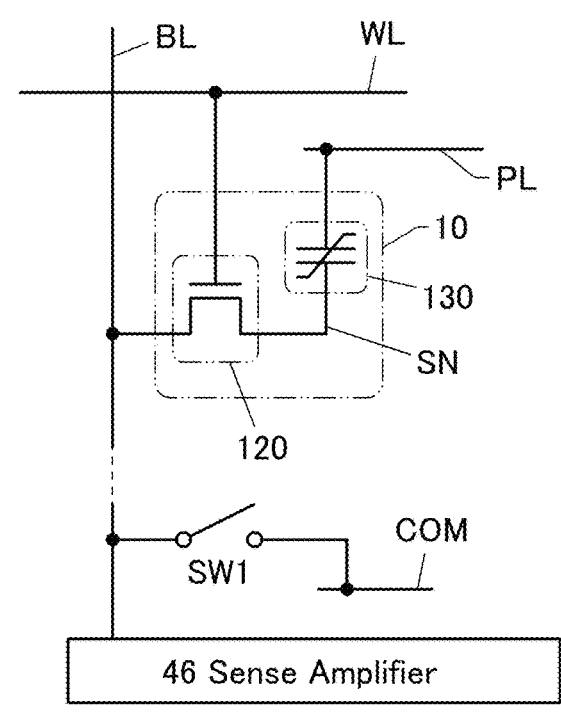
FIG. 21A and FIG. 21B are diagrams illustrating modification examples of a semiconductor device.

In the case where the period T12 is omitted, the switch SW2 is not necessarily provided as illustrated in FIG. 21A. The circuit structure illustrated in FIG. 21A allows the above-described data reading and writing operations to be performed.

Figure 21B:
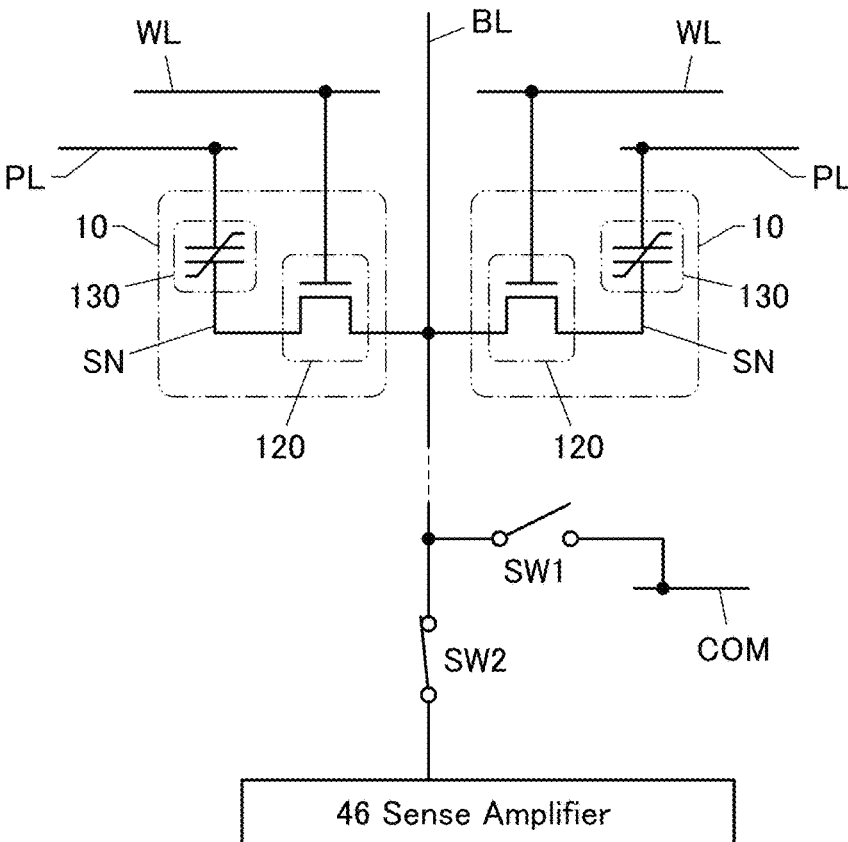

As illustrated in FIG. 21B, the memory cells 10 in two adjacent columns may be electrically connected to one wiring BL. When one wiring BL is shared by the memory cells 10 in two columns, the area occupied by the memory array 20 can be reduced and the mounting density of the memory cells 10 can be increased.

This embodiment can be combined as appropriate with any of the other embodiments and the like described in this specification.

Embodiment 2

In this embodiment, a cross-sectional structure example and the like of a semiconductor device of one embodiment of the present invention will be described.

Figure 22:
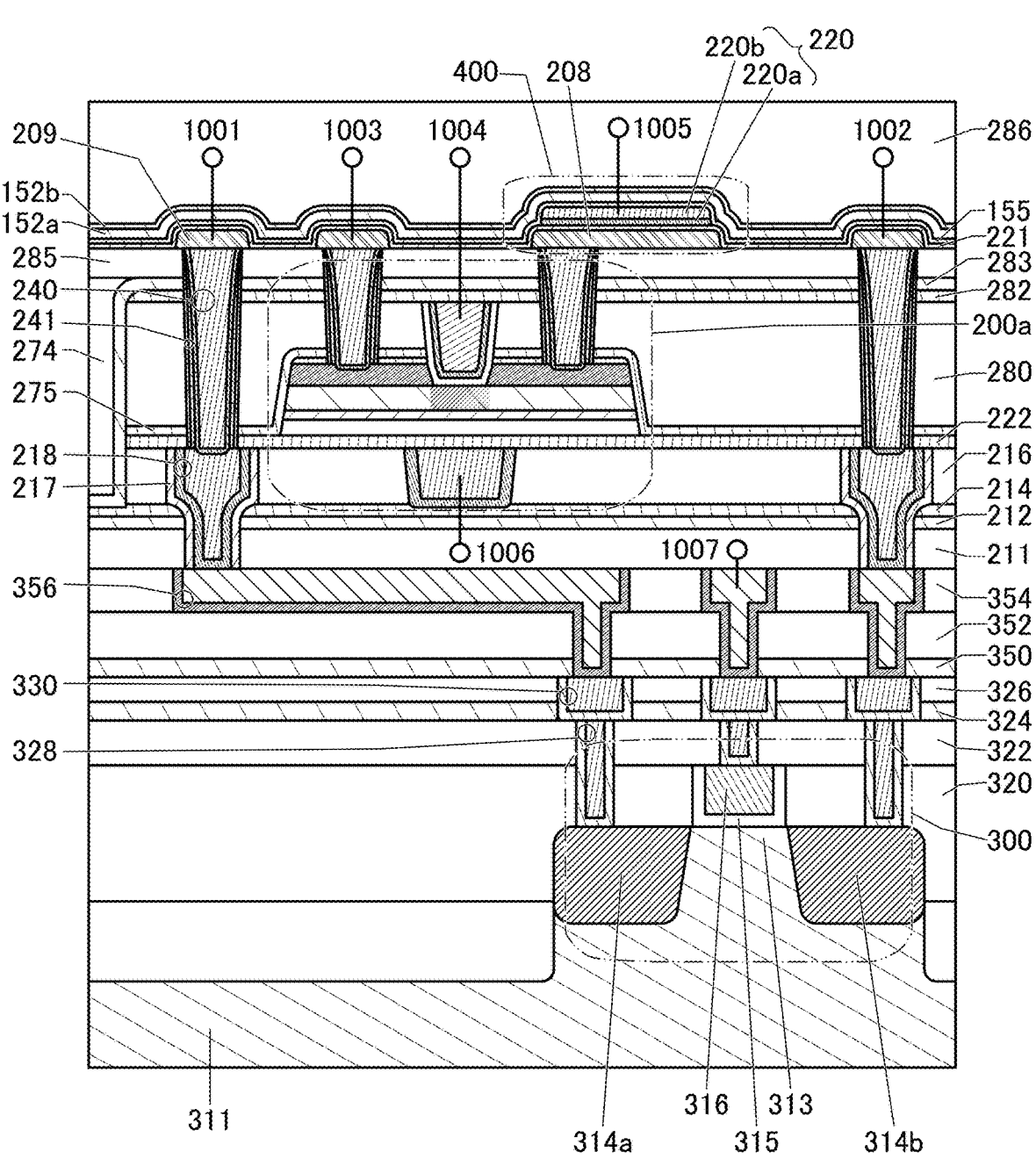
FIG. 22 is a cross-sectional view illustrating a structure example of a semiconductor device.

FIG. 22 is a cross-sectional view illustrating a structure example of a semiconductor device of one embodiment of the present invention. FIG. 22 illustrates a transistor 300, a transistor 200a, a capacitor 400, and the like among the components of the semiconductor device of one embodiment of the present invention. Here, the transistor 200a is provided above the transistor 300. The capacitor 400 is provided above the transistor 200a. The transistor 200a can be a transistor in which a channel is formed in a semiconductor layer including an oxide semiconductor.

The transistor 300 corresponds to any of the transistors included in the driver circuit 21 described in Embodiment 1, for example. The transistor 200a corresponds to the transistor 120 described in Embodiment 1, for example. The capacitor 400 corresponds to the capacitor 130 described in Embodiment 1, for example.

In FIG. 22, a wiring 1001 is electrically connected to one of a source and a drain of the transistor 300, and a wiring 1002 is electrically connected to the other of the source and the drain of the transistor 300. A wiring 1003 is electrically connected to one of a source and a drain of the transistor 200a. The other of the source and the drain of the transistor 200a is electrically connected to one electrode of the capacitor 400, and the other electrode of the capacitor 400 is electrically connected to a wiring 1005. A wiring 1004 is electrically connected to a gate of the transistor 200a, and a wiring 1006 is electrically connected to a back gate of the transistor 200a. A wiring 1007 is electrically connected to a gate of the transistor 300.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 22, the semiconductor region 313 (part of the substrate 311) in which a channel is formed has a protruding shape. The conductor 316 is provided to cover part of the side surface and part of the top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI substrate.

Note that the transistor 300 illustrated in FIG. 22 is an example and the structure is not limited thereto; an appropriate transistor is used in accordance with a circuit structure or a driving method.

<Wiring Layer>

A wiring layer provided with an interlayer film, a wiring, a plug, and the like may be provided between the components. A plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

For example, an insulator 320, an insulator 322, an insulator 324, and an insulator 326 are sequentially stacked over the transistor 300 as interlayer films. Moreover, a conductor 328, a conductor 330, and the like are embedded in the insulator 320, the insulator 322, the insulator 324, and the insulator 326. Note that the conductor 328 and the conductor 330 function as plugs or wirings.

The insulators functioning as interlayer films may also function as planarization films that cover uneven shapes therebelow. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 22, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218 and the like are embedded in an insulator 211, an insulator 212, an insulator 214, and an insulator 216. Moreover, a conductor 240 and the like are embedded in an insulator 222, an insulator 275, an insulator 280, an insulator 282, an insulator 283, and an insulator 285. Furthermore, a conductor 209 is provided over the conductor 240. Note that the conductor 218, the conductor 240, and the conductor 209 have a function of a plug or a wiring.

Here, an insulator 217 is provided in contact with the side surface of the conductor 218 functioning as a plug. The insulator 217 is provided in contact with an inner wall of an opening formed in the insulator 211, the insulator 212, the insulator 214, and the insulator 216. That is, the insulator 217 is provided between the conductor 218 and each of the insulator 211, the insulator 212, the insulator 214, and the insulator 216.

As the insulator 217, for example, an insulator such as silicon nitride, aluminum oxide, or silicon nitride oxide may be used. The insulator 217 is provided in contact with the insulator 211, the insulator 212, the insulator 214, the insulator 216, and the like; thus, impurities such as water and hydrogen can be inhibited from entering the semiconductor layer of the transistor 200a from the insulator 211, the insulator 216, or the like through the conductor 218. In particular, silicon nitride is suitable because of its high blocking property against hydrogen. Moreover, oxygen contained in the insulator 211 or the insulator 216 can be inhibited from being absorbed by the conductor 218.

Note that in this specification and the like, "oxynitride" refers to a material that contains more oxygen than nitrogen as its main component. For example, "silicon oxynitride" refers to a material that contains silicon, nitrogen, and oxygen and contains more oxygen than nitrogen. In this specification and the like, "nitride oxide" refers to a material that contains more nitrogen than oxygen as its main component. For example, "aluminum nitride oxide" refers to a material that contains aluminum, nitrogen, and oxygen and contains more nitrogen than oxygen.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material with a low dielectric constant is used for the insulator functioning as an interlayer film, parasitic capacitance generated between wirings can be reduced. Thus, a material is preferably selected depending on the function of the insulator.

For example, the insulator 211, the insulator 352, the insulator 354, and the like preferably include an insulator with a low dielectric constant. For example, the insulator preferably includes silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide and silicon oxynitride, which are thermally stable, are combined with a resin, the stacked-layer structure can have thermal stability and a low dielectric constant. Examples of the resin include polyester, polyolefin, polyamide (nylon, aramid, or the like), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used as the insulator 214, the insulator 212, the insulator 350, and the like.

An insulator having a function of inhibiting passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 240, the conductor 209, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

<Wiring or Plug in Layer Including Oxide Semiconductor>

In the case where an oxide semiconductor is used for the semiconductor layer of the transistor 200a, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, in FIG. 22, an insulator 241 is preferably provided between the insulator 280 containing excess oxygen and the conductor 240. Since the insulator 241 is provided in contact with the insulator 222, the insulator 282, and the insulator 283, the transistor 200a can be sealed with the insulators having a barrier property.

That is, the insulator 241 can inhibit excess oxygen contained in the insulator 280 from being absorbed by the conductor 240. In addition, providing the insulator 241 can inhibit diffusion of hydrogen, which is an impurity, into the transistor 200a through the conductor 240.

Note that an insulating material having a function of inhibiting diffusion of oxygen and impurities such as water and hydrogen is preferably used for the insulator 241. For example, silicon nitride, silicon nitride oxide, aluminum oxide, hafnium oxide, or the like is preferably used. In particular, silicon nitride is preferable because of its high blocking property against hydrogen. Alternatively, a metal oxide such as magnesium oxide, gallium oxide, germanium oxide, yttrium oxide, zirconium oxide, lanthanum oxide, neodymium oxide, or tantalum oxide can be used, for example.

Here, the conductor 240 penetrates the insulator 283 and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, and the insulator 283 through the conductor 240 and the conductor 218. In this manner, the transistor 200a is sealed with the insulator 212, the insulator 214, the insulator 282, the insulator 283, the insulator 241, and the insulator 217, so that impurities such as hydrogen contained in an insulator 274 or the like can be inhibited from entering from the outside.

The capacitor 400 includes a conductor 208, an insulator 221 covering the conductor 208, and a conductor 220 (a conductor 220a and a conductor 220b) including a region overlapping with the conductor 208 with the insulator 221 therebetween. The insulator 221 is formed using a material that can have ferroelectricity.

The conductor 208 is formed in the same layer as the conductor 209 and is in contact with the top surface of the conductor 240. The conductor 208 is electrically connected to the other of the source and the drain of the transistor 200a through the conductor 240.

An insulator 155 is preferably provided to cover the conductor 220, the insulator 221, and the conductor 209. It is preferable to use, as the insulator 155, an insulator having a function of capturing and fixing hydrogen. For example, aluminum oxide or the like is preferably used. Providing such an insulator 155 covering the capacitor 400 makes it possible to capture and fix hydrogen contained in the insulator 221 of the capacitor 400 so that the hydrogen concentration in the insulator 221 can be reduced. This can enhance the ferroelectricity of the insulator 221. Moreover, leakage current between the conductor 208 and the conductor 220 can be reduced. Note that the structure is not limited thereto, and the insulator 155 may be omitted.

An insulator 152a and an insulator 152b that function as barrier insulating films against hydrogen are preferably provided over the conductor 209 and the conductor 220. The insulator 152a and the insulator 152b are provided over the insulator 155. Providing the insulator 152a and the insulator 152b in this manner can inhibit impurities such as hydrogen contained in an insulator 286 over the insulator 152b from diffusing to the transistor 200a through the capacitor 400, the conductor 209, and the conductor 240.

<Dicing Line>

A dicing line (sometimes referred to as a scribe line, a dividing line, or a cutting line) which is provided when a large-sized substrate is divided into semiconductor elements so that a plurality of semiconductor devices are each taken as a chip will be described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 22, a region where the insulator 283 and the insulator 214 are in contact with each other is preferably designed to overlap with the dicing line. That is, an opening is provided in the insulator 282, the insulator 280, the insulator 275, the insulator 222, and the insulator 216 in the vicinity of a region to be the dicing line that is provided on an outer edge of a memory cell including the plurality of transistors 200a.

That is, in the opening provided in the insulator 282, insulator 280, the insulator 275, the insulator 222, and the insulator 216, the insulator 214 is in contact with the insulator 283.

For example, an opening may be provided in the insulator 214 as well as in the insulator 282, the insulator 280, the insulator 275, the insulator 222, and the insulator 216. With such a structure, in the opening provided in the insulator 282, the insulator 280, the insulator 275, the insulator 222, the insulator 216, and the insulator 214, the insulator 212 is in contact with the insulator 283. Here, the insulator 212 and the insulator 283 may be formed using the same material and the same method. When the insulator 212 and the insulator 283 are formed using the same material and the same method, the adhesion therebetween can be increased. For example, silicon nitride is preferably used.

With the structure, the transistors 200a can be surrounded by the insulator 212, the insulator 214, the insulator 282, and the insulator 283. Since at least one of the insulator 212, the insulator 214, the insulator 282, and the insulator 283 has a function of inhibiting diffusion of oxygen, hydrogen, and water, even when the substrate is divided into circuit regions each of which is provided with the semiconductor elements described in this embodiment to be processed into a plurality of chips, entry and diffusion of impurities such as hydrogen and water from the direction of the side surface of the divided substrate into the transistor 200a can be prevented.

With the structure, excess oxygen in the insulator 280 can be inhibited from diffusing to the outside. Accordingly, excess oxygen in the insulator 280 is efficiently supplied to the oxide where the channel is formed in the transistor 200a. The oxygen can reduce oxygen vacancies in the oxide where the channel is formed in the transistor 200a. Thus, the oxide where the channel is formed in the transistor 200a can be an oxide semiconductor with a low density of defect states and stable characteristics. That is, the transistor 200a can have a small variation in the electrical characteristics and higher reliability.

<Structure Example of Transistor>

FIG. 23A to FIG. 23D are a top view and cross-sectional views illustrating a structure example of a transistor 200 that can be used as the transistor 200a. Here, FIG. 23B is a cross-sectional view of a portion indicated by the dashed-dotted line A1-A2 in FIG. 23A, and is a cross-sectional view in the channel length direction of the transistor 200. FIG. 23C is a cross-sectional view of a portion indicated by the dashed-dotted line A3-A4 in FIG. 23A, and is a cross-sectional view in the channel width direction of the transistor 200. FIG. 23D is a cross-sectional view of a portion indicated by the dashed-dotted line A5-A6 in FIG. 23A. Note that for clarity of the drawing, some components are omitted in the top view in FIG. 23A.

FIG. 23B to FIG. 23D illustrate the insulator 212, the insulator 214 over the insulator 212, the transistor 200 over the insulator 214, the insulator 280 over the transistor 200, the insulator 282 over the insulator 280, the insulator 283 over the insulator 282, the insulator 274 over the insulator 283, and the insulator 285 over the insulator 283 and the insulator 274. The insulator 212, the insulator 214, the insulator 216, the insulator 280, the insulator 282, the insulator 283, the insulator 285, and the insulator 274 each function as an interlayer film. The semiconductor device includes the conductor 240 (a conductor 240a and a conductor 240b) that is electrically connected to the transistor 200 and functions as a plug. Note that the insulator 241 (an insulator 241a and an insulator 241b) is provided in contact with the side surface of the conductor 240 functioning as a plug. A conductor 246 (a conductor 246a and a conductor 246b) that is electrically connected to the conductor 240 and functions as a wiring is provided over the insulator 285 and the conductor 240. The insulator 283 is in contact with part of the top surface of the insulator 214, the side surface of the insulator 216, the side surface of the insulator 222, the side surface of the insulator 275, the side surface of the insulator 280, and the side surface and the top surface of the insulator 282.

The insulator 241a is provided in contact with an inner wall of an opening in the insulator 280, the insulator 282, the insulator 283, and the insulator 285, and the conductor 240a is provided in contact with the side surface of the insulator 241a. The insulator 241b is provided in contact with an inner wall of an opening in the insulator 280, the insulator 282, the insulator 283, and the insulator 285, and the conductor 240b is provided in contact with the side surface of the insulator 241b. The insulator 241 has a structure in which a first insulator is provided in contact with the inner wall of the opening and a second insulator is provided on the inner side of the first insulator. The conductor 240 has a structure in which a first conductor is provided in contact with the side surface of the insulator 241 and a second conductor is provided on the inner side of the first conductor. Here, the top surface of the conductor 240 can be substantially level with the top surface of the insulator 285 in a region overlapping with the conductor 246.

Although the first insulator of the insulator 241 and the second insulator of the insulator 241 are stacked in the transistor 200, the present invention is not limited thereto. For example, the insulator 241 may have a single-layer structure or a stacked-layer structure of three or more layers. Although the first conductor of the conductor 240 and the second conductor of the conductor 240 are stacked in the transistor 200, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

[Transistor 200]

As illustrated in FIG. 23A to FIG. 23D, the transistor 200 includes the insulator 216 over the insulator 214, a conductor 205 (a conductor 205a and a conductor 205b) placed to be embedded in the insulator 214 and/or the insulator 216, the insulator 222 over the insulator 216 and the conductor 205, an insulator 224 over the insulator 222, an oxide 230a over the insulator 224, an oxide 230b over the oxide 230a, a conductor 242a over the oxide 230b, an insulator 271a over the conductor 242a, a conductor 242b over the oxide 230b, an insulator 271b over the conductor 242b, an insulator 250 over the oxide 230b, a conductor 260 (a conductor 260a and a conductor 260b) that is positioned over the insulator 250 and overlaps with part of the oxide 230b, and the insulator 275 placed over the insulator 222, the insulator 224, the oxide 230a, the oxide 230b, the conductor 242a, the conductor 242b, the insulator 271a, and the insulator 271b. Here, as illustrated in FIG. 23B and FIG. 23C, the insulator 250 is in contact with the top surface of the insulator 222, the side surface of the insulator 224, the side surface of the oxide 230a, the side surface and the top surface of the oxide 230b, the side surface of the conductor 242, the side surface of the insulator 271, the side surface of the insulator 275, and the side surface of the insulator 280. The top surface of the conductor 260 is placed to be substantially level with the uppermost portion of the insulator 250 and the top surface of the insulator 280. The insulator 282 is in contact with at least parts of the top surfaces of the conductor 260, the insulator 250, and the insulator 280.

Hereinafter, the oxide 230a and the oxide 230b are collectively referred to as an oxide 230 in some cases. The conductor 242a and the conductor 242b are collectively referred to as a conductor 242 in some cases. The insulator 271a and the insulator 271b are collectively referred to as an insulator 271 in some cases.

An opening reaching the oxide 230b is provided in the insulator 280 and the insulator 275. The insulator 250 and the conductor 260 are placed in the opening. In the channel length direction of the transistor 200, the conductor 260 and the insulator 250 are provided between the conductor 242a and the conductor 242b and between the insulator 271a and the insulator 271b. The insulator 250 includes a region in contact with the side surface of the conductor 260 and a region in contact with the bottom surface of the conductor 260.

The oxide 230 preferably includes the oxide 230a placed over the insulator 224 and the oxide 230b placed over the oxide 230a. Including the oxide 230a under the oxide 230b makes it possible to inhibit diffusion of impurities into the oxide 230b from components formed below the oxide 230a.

Although a structure in which two layers, the oxide 230a and the oxide 230b, are stacked as the oxide 230 in the transistor 200 is described, the present invention is not limited thereto. For example, the oxide 230 may be provided as a single layer of the oxide 230b or to have a stacked-layer structure of three or more layers, or the oxide 230a and the oxide 230b may each have a stacked-layer structure.

The conductor 260 functions as a gate electrode and the conductor 205 functions as a back gate electrode. The insulator 250 functions as a gate insulator for the gate electrode, and the insulator 222 and the insulator 224 function as a gate insulator for the back gate electrode. The conductor 242a functions as one of a source and a drain, and the conductor 242b functions as the other of the source and the drain. At least part of a region of the oxide 230 that overlaps with the conductor 260 functions as a channel formation region.

Figure 24:
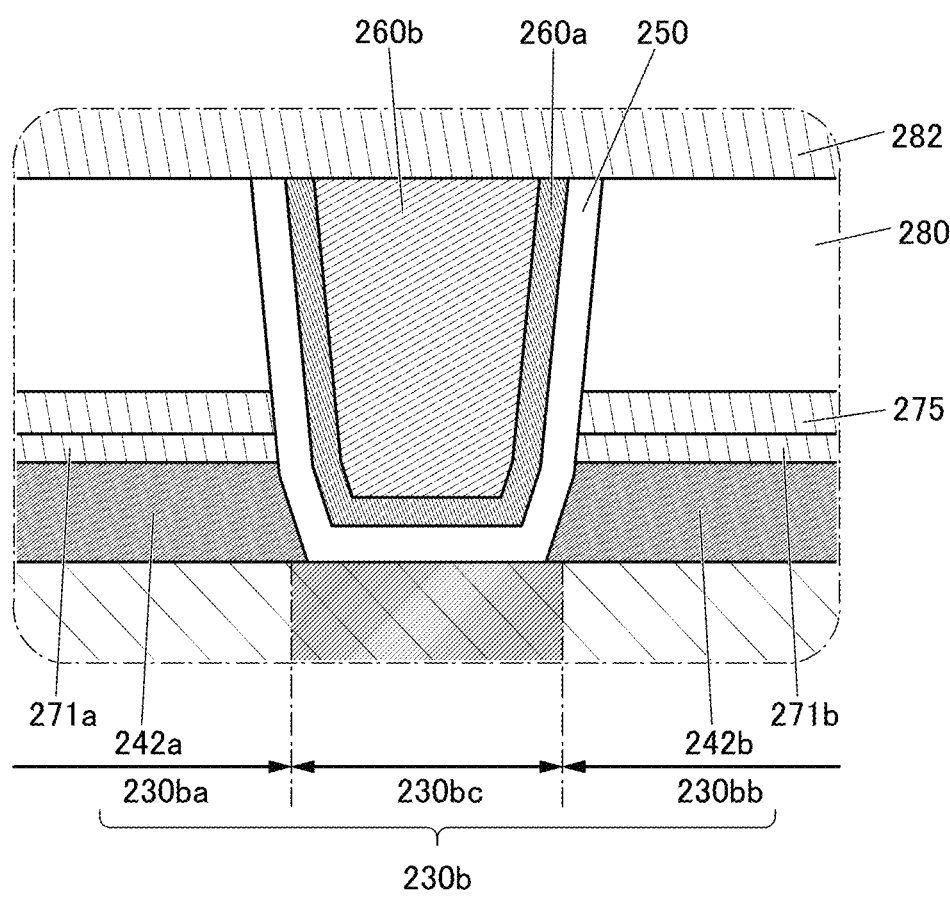
FIG. 24 is a cross-sectional view illustrating a structure example of a transistor.

FIG. 24 is an enlarged view of the vicinity of the channel formation region in FIG. 23B. Supply of oxygen to the oxide 230b forms the channel formation region in a region between the conductor 242a and the conductor 242b. Thus, as illustrated in FIG. 24, the oxide 230b includes a region 230bc functioning as the channel formation region of the transistor 200 and a region 230ba and a region 230bb that are provided to sandwich the region 230bc and function as a source region and a drain region. At least part of the region 230bc overlaps with the conductor 260. In other words, the region 230bc is provided in a region between the conductor 242a and the conductor 242b. The region 230ba is provided to overlap with the conductor 242a, and the region 230bb is provided to overlap with the conductor 242b.

The region 230bc functioning as the channel formation region has fewer oxygen vacancies or a lower impurity concentration than the region 230ba and the region 230bb, and thus is a high-resistance region with a low carrier concentration. Thus, the region 230bc can be regarded as being i-type (intrinsic) or substantially i-type.

The region 230ba and the region 230bb functioning as the source region and the drain region include many oxygen vacancies or have a high concentration of an impurity such as hydrogen, nitrogen, or a metal element, and thus are each a low-resistance region with an increased carrier concentration. In other words, the region 230ba and the region 230bb are each an n-type region having a higher carrier concentration and a lower resistance than the region 230bc.

The carrier concentration in the region 230bc functioning as the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration in the region 230bc functioning as the channel formation region is not particularly limited and can be, for example, $1\times10^{-9}$ cm$^{-3}$.

Between the region 230bc and the region 230ba or the region 230bb, a region having a carrier concentration that is lower than or substantially equal to the carrier concentrations in the region 230ba and the region 230bb and higher than or substantially equal to the carrier concentration in the region 230bc may be formed. That is, the region functions as a junction region between the region 230bc and the region 230ba or the region 230bb. The hydrogen concentration in the junction region is lower than or substantially equal to the hydrogen concentrations in the region 230ba and the region 230bb and higher than or substantially equal to the hydrogen concentration in the region $230bc$ in some cases. The amount of oxygen vacancies in the junction region is smaller than or substantially equal to the amounts of oxygen vacancies in the region $230ba$ and the region $230bb$ and larger than or substantially equal to the amount of oxygen vacancies in the region $230bc$ in some cases.

Although FIG. 24 illustrates an example in which the region $230ba$, the region $230bb$, and the region $230bc$ are formed in the oxide $230b$, the present invention is not limited thereto. For example, the above regions may be formed not only in the oxide $230b$ but also in the oxide $230a$.

In the oxide 230, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 200, a metal oxide functioning as a semiconductor (such a metal oxide is hereinafter also referred to as an oxide semiconductor) is preferably used for the oxide 230 (the oxide $230a$ and the oxide $230b$) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 230, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 230.

The atomic ratio of In to the element M in the metal oxide used as the oxide $230b$ is preferably greater than the atomic ratio of In to the element M in the metal oxide used as the oxide $230a$.

The oxide $230a$ is placed under the oxide $230b$ in this manner, whereby impurities and oxygen can be inhibited from diffusing into the oxide $230b$ from components formed below the oxide $230a$.

When the oxide $230a$ and the oxide $230b$ contain a common element (as the main component) besides oxygen, the density of defect states at the interface between the oxide $230a$ and the oxide $230b$ can be made low. Since the density of defect states at the interface between the oxide $230a$ and the oxide $230b$ can be made low, the influence of interface scattering on carrier conduction is small, and a high on-state current can be obtained.

The oxide $230b$ preferably has crystallinity. It is particularly preferable to use a CAAC-OS (c-axis aligned crystalline oxide semiconductor) as the oxide $230b$.

The CAAC-OS is a metal oxide having a dense structure with high crystallinity and small amounts of impurities and defects (e.g., oxygen vacancies ($V_O$)). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained.

When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter, sometimes referred to as $V_OH$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_OH$ are preferably reduced as much as possible in the region of the oxide semiconductor where a channel is formed. In other words, it is preferable that the region of the oxide semiconductor where a channel is formed have a reduced carrier concentration and be of i-type (intrinsic) or substantially i-type.

As a countermeasure to the above, an insulator containing oxygen to be released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and $V_OH$. However, supply of an excess amount of oxygen to the source region or the drain region might cause a decrease in the on-state current or field-effect mobility of the transistor 200. Furthermore, a variation of the amount of oxygen supplied to the source region or the drain region in the substrate plane leads to a variation in characteristics of the semiconductor device including the transistor.

Therefore, the region $230bc$ functioning as the channel formation region in the oxide semiconductor is preferably an i-type or substantially i-type region with a reduced carrier concentration, whereas the region $230ba$ and the region $230bb$ functioning as the source region and the drain region are preferably n-type regions with high carrier concentrations. That is, it is preferable that oxygen vacancies and $V_OH$ in the region $230bc$ of the oxide semiconductor be reduced and the region $230ba$ and the region $230bb$ not be supplied with an excess amount of oxygen.

Thus, in this embodiment, microwave treatment is performed in an oxygen-containing atmosphere in a state where the conductor 242a and the conductor 242b are provided over the oxide $230b$ so that oxygen vacancies and $V_OH$ in the region $230bc$ can be reduced. Here, the microwave treatment refers to, for example, treatment performed using an apparatus including a power source that generates high-density plasma with the use of a microwave.

The microwave treatment performed in an oxygen-containing atmosphere can convert an oxygen gas into plasma using a high-frequency wave such as a microwave or RF and apply the oxygen plasma. At this time, the region $230bc$ can also be irradiated with the high-frequency wave such as the microwave or RF. By the effect of the plasma, a microwave, or the like, $V_OH$ in the region $230bc$ can be cut; thus, hydrogen H can be removed from the region 230$bc$ and an oxygen vacancy $V_O$ can be filled with oxygen. That is, the reaction "$V_O$H→H+$V_O$" occurs in the region 230$bc$, so that the hydrogen concentration in the region 230$bc$ can be reduced. As a result, oxygen vacancies and $V_O$H in the region 230$bc$ can be reduced to lower the carrier concentration.

In the microwave treatment performed in an oxygen-containing atmosphere, the high-frequency wave such as the microwave or RF, the oxygen plasma, or the like is blocked by the conductor 242$a$ and the conductor 242$b$ and does not affect the region 230$ba$ nor the region 230$bb$. In addition, the effect of the oxygen plasma can be reduced by the insulator 271 and the insulator 280 that are provided to cover the oxide 230$b$ and the conductor 242. Hence, a reduction in $V_O$H and supply of an excess amount of oxygen do not occur in the region 230$ba$ or the region 230$bb$ in the microwave treatment, preventing a decrease in carrier concentration.

After an insulating film to be the insulator 250 is deposited, microwave treatment is preferably performed in an oxygen-containing atmosphere. By performing the microwave treatment in an oxygen-containing atmosphere through the insulator 250 in such a manner, oxygen can be efficiently supplied into the region 230$bc$.

The oxygen supplied into the region 230$bc$ has any of a variety of forms such as an oxygen atom, an oxygen molecule, and an oxygen radical (an 0 radical, an atom or a molecule having an unpaired electron, or an ion). Note that the oxygen supplied into the region 230$bc$ has any one or more of the above forms, and is particularly preferably an oxygen radical. Furthermore, the film quality of the insulator 250 can be improved, leading to higher reliability of the transistor 200.

In the above manner, oxygen vacancies and $V_O$H can be selectively removed from the region 230$bc$ in the oxide semiconductor, whereby the region 230$bc$ can be an i-type or substantially i-type region. Furthermore, supply of an excess amount of oxygen to the region 230$ba$ and the region 230$bb$ functioning as the source region and the drain region can be inhibited and the conductivity can be maintained. As a result, a change in the electrical characteristics of the transistor 200 can be inhibited, and thus a variation in the electrical characteristics of the transistors 200 in the substrate plane can be inhibited.

With the above structure, a semiconductor device with a small variation in transistor characteristics can be provided. A semiconductor device with favorable reliability can also be provided. A semiconductor device having favorable electrical characteristics can be provided.

As illustrated in FIG. 23C, a curved surface may be provided between the side surface of the oxide 230$b$ and the top surface of the oxide 230$b$ in a cross-sectional view of the transistor 200 in the channel width direction. In other words, an end portion of the side surface and an end portion of the top surface may be curved (hereinafter, referred to as rounded).

The radius of curvature of the curved surface is preferably greater than 0 nm and less than the thickness of the oxide 230$b$ in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 230$b$ with the insulator 250 and the conductor 260.

The oxide 230 preferably has a stacked-layer structure of a plurality of oxide layers with different chemical compositions. Specifically, the atomic ratio of the element M to a metal element that is a main component of the metal oxide used as the oxide 230$a$ is preferably greater than the atomic ratio of the element M to a metal element that is a main component of the metal oxide used as the oxide 230$b$. Moreover, the atomic ratio of the element M to In in the metal oxide used as the oxide 230$a$ is preferably greater than the atomic ratio of the element M to In in the metal oxide used as the oxide 230$b$. Furthermore, the atomic ratio of In to the element Min the metal oxide used as the oxide 230$b$ is preferably greater than the atomic ratio of In to the element M in the metal oxide used as the oxide 230$a$.

The oxide 230$b$ is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 230$b$ by the source electrode or the drain electrode. This can reduce oxygen extraction from the oxide 230$b$ even when heat treatment is performed; thus, the transistor 200 is stable with respect to high temperatures in a manufacturing process (what is called thermal budget).

Here, the conduction band minimum gradually changes at a junction portion of the oxide 230$a$ and the oxide 230$b$. In other words, the conduction band minimum at the junction portion of the oxide 230$a$ and the oxide 230$b$ continuously changes or is continuously connected. To achieve this, the density of defect states in a mixed layer formed at the interface between the oxide 230$a$ and the oxide 230$b$ is preferably made low.

Specifically, when the oxide 230$a$ and the oxide 230$b$ contain a common element as a main component besides oxygen, a mixed layer with a low density of defect states can be formed. For example, in the case where the oxide 230$b$ is an In-M-Zn oxide, an In-M-Zn oxide, an M-Zn oxide, an oxide of the element M, an In—Zn oxide, an indium oxide, or the like may be used as the oxide 230$a$.

Specifically, as the oxide 230$a$, a metal oxide with In:M:Zn=1:3:4 [atomic ratio] or a composition in the neighborhood thereof, or In:M:Zn=1:1:0.5 [atomic ratio] or a composition in the neighborhood thereof is used. As the oxide 230$b$, a metal oxide with In:M:Zn=1:1:1 [atomic ratio] or a composition in the neighborhood thereof, In:M:Zn=1:1:2 [atomic ratio] or a composition in the neighborhood thereof, or In:M:Zn=4:2:3 [atomic ratio] or a composition in the neighborhood thereof can be used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

When the oxide 230$a$ and the oxide 230$b$ have the above structure, the density of defect states at the interface between the oxide 230$a$ and the oxide 230$b$ can be made low. Thus, the influence of interface scattering on carrier conduction is small, and the transistor 200 can have a high on-state current and excellent frequency characteristics.

At least one of the insulator 212, the insulator 214, the insulator 271, the insulator 275, the insulator 282, the insulator 283, and the insulator 285 preferably functions as a barrier insulating film, which inhibits diffusion of impurities such as water and hydrogen from the substrate side or from above the transistor 200 into the transistor 200. Thus, for at least one of the insulator 212, the insulator 214, the insulator 271, the insulator 275, the insulator 282, the insulator 283, and the insulator 285, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as a function of less easily transmitting the substance). In addition, a barrier property in this specification means a function of capturing and fixing (also referred to as gettering) a targeted substance.

An insulator having a function of inhibiting diffusion of oxygen and impurities such as water and hydrogen is preferably used as the insulator 212, the insulator 214, the insulator 271, the insulator 275, the insulator 282, the insulator 283, and the insulator 285; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 212, the insulator 275, and the insulator 283. For example, aluminum oxide or magnesium oxide, which has a function of capturing and fixing hydrogen well, is preferably used for the insulator 214, the insulator 271, the insulator 282, and the insulator 285. In this case, impurities such as water and hydrogen can be inhibited from diffusing to the transistor 200 side from the substrate side through the insulator 212 and the insulator 214. Impurities such as water and hydrogen can be inhibited from diffusing to the transistor 200 side from an interlayer insulating film and the like which are provided outside the insulator 285. Alternatively, oxygen contained in the insulator 224 and the like can be inhibited from diffusing to the substrate side through the insulator 212 and the insulator 214. Alternatively, oxygen contained in the insulator 280 and the like can be inhibited from diffusing to the components above the transistor 200 through the insulator 282 and the like. In this manner, it is preferable that the transistor 200 be surrounded by the insulator 212, the insulator 214, the insulator 271, the insulator 275, the insulator 282, the insulator 283, and the insulator 285, which have a function of inhibiting diffusion of oxygen and impurities such as water and hydrogen.

Here, an oxide having an amorphous structure is preferably used for the insulator 212, the insulator 214, the insulator 271, the insulator 275, the insulator 282, the insulator 283, and the insulator 285. For example, a metal oxide such as AlOx (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 200 or provided around the transistor 200, hydrogen contained in the transistor 200 or hydrogen present around the transistor 200 can be captured or fixed. In particular, hydrogen contained in the channel formation region of the transistor 200 is preferably captured or fixed. The metal oxide having an amorphous structure is used as the component of the transistor 200 or provided around the transistor 200, whereby the transistor 200 and a semiconductor device which have favorable characteristics and high reliability can be fabricated.

Although each of the insulator 212, the insulator 214, the insulator 271, the insulator 275, the insulator 282, the insulator 283, and the insulator 285 preferably has an amorphous structure, a region having a polycrystalline structure may be partly formed. Alternatively, each of the insulator 212, the insulator 214, the insulator 271, the insulator 275, the insulator 282, the insulator 283, and the insulator 285 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 212, the insulator 214, the insulator 271, the insulator 275, the insulator 282, the insulator 283, and the insulator 285 can be deposited by a sputtering method, for example. Since a sputtering method does not need to use a molecule containing hydrogen as a deposition gas, the hydrogen concentrations in the insulator 212, the insulator 214, the insulator 271, the insulator 275, the insulator 282, the insulator 283, and the insulator 285 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 212, the insulator 275, and the insulator 283 are preferably low in some cases. For example, by setting the resistivities of the insulator 212, the insulator 275, and the insulator 283 to approximately $1 \times 10^{13}$ $\Omega$cm, the insulator 212, the insulator 275, and the insulator 283 can sometimes reduce charge up of the conductor 205, the conductor 242, the conductor 260, or the conductor 246 in treatment using plasma or the like in the fabrication process of a semiconductor device. The resistivities of the insulator 212, the insulator 275, and the insulator 283 are preferably higher than or equal to $1 \times 10^{10}$ $\Omega$cm and lower than or equal to $1 \times 10^{15}$ $\Omega$cm.

The insulator 216, the insulator 274, the insulator 280, and the insulator 285 each preferably have a lower permittivity than the insulator 214. When a material with a low permittivity is used for an interlayer film, parasitic capacitance generated between wirings can be reduced. For the insulator 216, the insulator 274, the insulator 280, and the insulator 285, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The conductor 205 is placed to overlap with the oxide 230 and the conductor 260. Here, the conductor 205 is preferably provided to be embedded in an opening formed in the insulator 216. Part of the conductor 205 is embedded in the insulator 214 in some cases.

The conductor 205 includes the conductor 205a and the conductor 205b. The conductor 205a is provided in contact with the bottom surface and the sidewall of the opening. The conductor 205b is provided to be embedded in a depressed portion formed in the conductor 205a. Here, the top surface of the conductor 205b is substantially level with the top surface of the conductor 205a and the top surface of the insulator 216.

Here, for the conductor 205a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205a is formed using a conductive material having a function of inhibiting diffusion of hydrogen, impurities such as hydrogen contained in the conductor 205b can be prevented from diffusing into the oxide 230 through the insulator 224 and the like. When the conductor 205a is formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205a may be a single layer or a stacked layer of the above conductive materials. For example, titanium nitride is used for the conductor 205a.

Moreover, the conductor 205b is preferably formed using a conductive material containing tungsten, copper, or aluminum as its main component. For example, tungsten is used for the conductor 205b.

The conductor 205 sometimes functions as a back gate electrode. In that case, by changing a potential applied to the conductor 205 not in conjunction with but independently of a potential applied to the conductor 260, the threshold voltage (Vth) of the transistor 200 can be controlled. In particular, Vth of the transistor 200 can be higher in the case where a negative potential is applied to the conductor 205, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

In the case where the oxide 230 is a highly purified intrinsic oxide and as many impurities as possible are eliminated from the oxide 230, the transistor 200 can be expected to become normally-off (the threshold voltage of the transistor 200 can be expected to higher than 0 V) in some cases with no potential application to the conductor 205 and/or the conductor 260. In that case, it is suitable to connect the conductor 260 and the conductor 205 to each other such that the same potential is supplied.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. When the thickness of the insulator 216 is reduced, the absolute amount of impurities such as hydrogen contained in the insulator 216 can be reduced, inhibiting the diffusion of the impurities into the oxide 230.

As illustrated in FIG. 23A, the conductor 205 is preferably provided to be larger than a region of the oxide 230 that does not overlap with the conductor 242a or the conductor 242b. As illustrated in FIG. 23C, it is particularly preferable that the conductor 205 extend to a region outside end portions of the oxide 230a and the oxide 230b in the channel width direction. That is, the conductor 205 and the conductor 260 preferably overlap with each other with the insulators therebetween on the outer side of the side surface of the oxide 230 in the channel width direction. With this structure, the channel formation region of the oxide 230 can be electrically surrounded by the electric field of the conductor 260 functioning as a gate electrode and the electric field of the conductor 205 functioning as the back gate electrode. In this specification, a transistor structure in which a channel formation region is electrically surrounded by electric fields of a gate and a back gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the transistor 200 becomes normally-off and has the above-described S-Channel structure, the channel formation region can be electrically surrounded. Accordingly, the transistor 200 can be regarded as having a GAA (Gate All Around) structure or an LGAA (Lateral Gate All Around) structure. When the transistor 200 has the S-Channel structure, the GAA structure, or the LGAA structure, the channel formation region that is formed at the interface between the oxide 230 and the gate insulating film or in the vicinity of the interface can be formed in the entire bulk of the oxide 230. In other words, the transistor 200 having the S-Channel structure, the GAA structure, or the LGAA structure can be what is called a Bulk-Flow type, in which a carrier path is used as the entire bulk. A transistor structure with a Bulk-Flow type can improve the density of current flowing through the transistor and thus can be expected to improve the on-state current of the transistor or increase the field-effect mobility of the transistor.

Furthermore, as illustrated in FIG. 23C, the conductor 205 is extended to function as a wiring as well. However, without limitation to this structure, a structure in which a conductor functioning as a wiring is provided below the conductor 205 may be employed. In addition, the conductor 205 is not necessarily provided in each transistor. For example, the conductor 205 may be shared by a plurality of transistors.

Although the transistor 200 having a structure in which the conductor 205 is a stack of the conductor 205a and the conductor 205b is described, the present invention is not limited thereto. For example, the conductor 205 may be provided to have a single-layer structure or a stacked-layer structure of three or more layers.

The insulator 222 and the insulator 224 function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of inhibiting diffusion of one or both of hydrogen and oxygen more than the insulator 224.

As the insulator 222, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. Alternatively, an oxide containing hafnium and zirconium, e.g., a hafnium-zirconium oxide, is preferably used. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. The insulator 222 may have a stacked-layer structure including silicon oxide, silicon oxynitride, or silicon nitride over any of these insulators.

For example, a single layer or stacked layers of an insulator containing what is called a high-k material such as aluminum oxide, hafnium oxide, tantalum oxide, zirconium oxide, or hafnium-zirconium oxide may be used for the insulator 222. As scaling down and high integration of transistors progress, a problem such as leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 222.

Silicon oxide or silicon oxynitride, for example, can be used as appropriate for the insulator 224 that is in contact with the oxide 230.

In a fabrication process of the transistor 200, heat treatment is preferably performed with the surface of the oxide 230 exposed. For example, the heat treatment is performed at higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies ($V_O$). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 230 can promote a reaction in which oxygen vacancies in the oxide 230 are repaired with supplied oxygen, i.e., a reaction of "$V_O + O \rightarrow null$". Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of $V_O H$.

Note that the insulator 222 and the insulator 224 may each have a stacked-layer structure of two or more layers. In that case, without limitation to a stacked-layer structure formed of the same material, a stacked-layer structure formed of different materials may be employed. The insulator 224 may be formed into an island shape so as to overlap with the oxide 230a. In this case, the insulator 275 is in contact with the side surface of the insulator 224 and the top surface of the insulator 222.

The conductor 242a and the conductor 242b are provided in contact with the top surface of the oxide 230b. Each of the conductor 242a and the conductor 242b functions as a source electrode or a drain electrode of the transistor 200.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 230b or the like diffuses into the conductor 242a or the conductor 242b in some cases. In particular, when a nitride containing tantalum is used for the conductor 242a and the conductor 242b, hydrogen contained in the oxide 230b or the like is likely to diffuse into the conductor 242a or the conductor 242b, and the hydrogen that has diffused is bonded to nitrogen contained in the conductor 242a or the conductor 242b in some cases. That is, hydrogen contained in the oxide 230b or the like is absorbed by the conductor 242a or the conductor 242b in some cases.

No curved surface is preferably formed between the side surface of the conductor 242 and the top surface of the conductor 242. When no curved surface is formed in the conductor 242, the conductor 242 can have a large cross-sectional area in the channel width direction as illustrated in FIG. 23D. Accordingly, the conductivity of the conductor 242 is increased, so that the on-state current of the transistor 200 can be increased.

The insulator 271a is provided in contact with the top surface of the conductor 242a, and the insulator 271b is provided in contact with the top surface of the conductor 242b. The insulator 271 preferably functions as at least a barrier insulating film against oxygen. Thus, the insulator 271 preferably has a function of inhibiting oxygen diffusion. For example, the insulator 271 preferably has a function of inhibiting diffusion of oxygen more than the insulator 280. As the insulator 271, an insulator such as aluminum oxide or magnesium oxide is used, for example.

The insulator 275 is provided to cover the insulator 224, the oxide 230a, the oxide 230b, the conductor 242, and the insulator 271. The insulator 275 preferably has a function of capturing and fixing hydrogen. In that case, the insulator 275 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 275.

When the insulator 271 and the insulator 275 as described above are provided, the conductor 242 can be surrounded by the insulators having a barrier property against oxygen. That is, oxygen contained in the insulator 224 and the insulator 280 can be prevented from diffusing into the conductor 242. This makes it possible to inhibit oxygen contained in the insulator 224 and the insulator 280 from directly oxidizing the conductor 242, so that an increase in resistivity and a reduction in on-state current can be inhibited.

The insulator 250 functions as part of the gate insulator. As in the insulator 224, the concentration of impurities such as water and hydrogen in the insulator 250 is preferably reduced. The thickness of the insulator 250 is preferably greater than or equal to 1 nm and less than or equal to 20 nm, further preferably greater than or equal to 0.5 nm and less than or equal to 15.0 nm. In this case, it is acceptable that at least part of the insulator 250 has a region with the above-described thickness.

The conductor 260 functions as the gate electrode of the transistor 200. The conductor 260 preferably includes the conductor 260a and the conductor 260b placed over the conductor 260a. For example, the conductor 260a is preferably placed to cover the bottom surface and the side surface of the conductor 260b. Moreover, as illustrated in FIG. 23B and FIG. 23C, the top surface of the conductor 260 is substantially level with the top surface of the insulator 250. Although the conductor 260 is illustrated to have a two-layer structure of the conductor 260a and the conductor 260b in FIG. 23B and FIG. 23C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of the conductive material and titanium or titanium nitride may be employed.

In the transistor 200, the conductor 260 is formed in a self-aligned manner to fill the opening formed in the insulator 280 and the like. The formation of the conductor 260 in this manner allows the conductor 260 to be placed properly in a region between the conductor 242a and the conductor 242b without alignment.

As illustrated in FIG. 23C, in the channel width direction of the transistor 200, with reference to the bottom surface of the insulator 222, the level of the bottom surface of the conductor 260 in a region where the conductor 260 and the oxide 230b do not overlap with each other is preferably lower than the level of the bottom surface of the oxide 230b. When the conductor 260 functioning as the gate electrode covers the side surface and the top surface of the channel formation region of the oxide 230b with the insulator 250 and the like therebetween, the electric field of the conductor 260 can easily act on the entire channel formation region of the oxide 230b. Thus, the on-state current of the transistor 200 can be increased and the frequency characteristics of the transistor 200 can be improved. With reference to the bottom surface of the insulator 222, the difference between the level of the bottom surface of the conductor 260 in a region where the conductor 260 does not overlap with the oxide 230a or the oxide 230b and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and the opening is formed in a region where the insulator 250 and the conductor 260 are to be provided. In addition, the top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide, in each of which a region containing oxygen to be released by heating can be easily formed, are particularly preferable.

The concentration of impurities such as water and hydrogen in the insulator 280 is preferably reduced. An oxide containing silicon, such as silicon oxide or silicon oxynitride, is used as appropriate for the insulator 280, for example.

The insulator 282 preferably functions as a barrier insulating film that inhibits impurities such as water and hydrogen from diffusing into the insulator 280 from above and preferably has a function of capturing impurities such as hydrogen. The insulator 282 preferably functions as a barrier insulating film that inhibits passage of oxygen. For the insulator 282, a metal oxide having an amorphous structure, for example, an insulator such as aluminum oxide can be used. In this case, the insulator 282 is an insulator containing at least oxygen and aluminum. The insulator 282, which has a function of capturing impurities such as hydrogen, is provided in contact with the insulator 280 in a region interposed between the insulator 212 and the insulator 283, whereby impurities such as hydrogen contained in the insulator 280 and the like can be captured and the amount of hydrogen in the region can be constant. Aluminum oxide having an amorphous structure is particularly preferably used for the insulator 282, in which case hydrogen can sometimes be captured or fixed more effectively. Accordingly, the transistor 200 and a semiconductor device which have favorable characteristics and high reliability can be fabricated.

The insulator 283 functions as a barrier insulating film that inhibits impurities such as water and hydrogen from diffusing into the insulator 280 from above. The insulator 283 is placed over the insulator 282. The insulator 283 is preferably formed using a nitride containing silicon such as silicon nitride or silicon nitride oxide. For example, silicon nitride deposited by a sputtering method may be used for the insulator 283. When the insulator 283 is deposited by a sputtering method, a high-density silicon nitride film can be formed. To obtain the insulator 283, silicon nitride deposited by a PEALD method or a CVD method may be stacked over silicon nitride deposited by a sputtering method.

For the conductor 240a and the conductor 240b, a conductive material containing tungsten, copper, or aluminum as its main component is preferably used. The conductor 240a and the conductor 240b may each have a stacked-layer structure.

In the case where the conductor 240 has a stacked-layer structure, a conductive material having a function of inhibiting passage of impurities such as water and hydrogen is preferably used for the first conductor placed in the vicinity of the insulator 285, the insulator 283, the insulator 282, the insulator 280, the insulator 275, and the insulator 271. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 283 can be inhibited from entering the oxide 230 through the conductor 240a and the conductor 240b.

For the insulator 241a and the insulator 241b, a barrier insulating film that can be used for the insulator 275 or the like may be used. For the insulator 241a and the insulator 241b, for example, an insulator such as silicon nitride, aluminum oxide, or silicon nitride oxide may be used. Since the insulator 241a and the insulator 241b are provided in contact with the insulator 283, the insulator 282, and the insulator 271, impurities such as water and hydrogen contained in the insulator 280 or the like can be inhibited from entering the oxide 230 through the conductor 240a and the conductor 240b. In particular, silicon nitride is suitable because of its high blocking property against hydrogen. Furthermore, oxygen contained in the insulator 280 can be prevented from being absorbed by the conductor 240a and the conductor 240b.

When the insulator 241a and the insulator 241b each have a stacked-layer structure as illustrated in FIG. 23B, the first insulator in contact with an inner wall of the opening in the insulator 280 and the like and the second insulator on the inner side of the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 240 can be inhibited, and hydrogen can be inhibited from entering the conductor 240.

The conductor 246 (the conductor 246a and the conductor 246b) functioning as a wiring may be placed in contact with the top surface of the conductor 240a and the top surface of the conductor 240b. The conductor 246 is preferably formed using a conductive material containing tungsten, copper, or aluminum as its main component. Furthermore, the conductor may have a stacked-layer structure and may be a stack of titanium or titanium nitride and the conductive material, for example. Note that the conductor may be formed to be embedded in an opening provided in an insulator.

<Classification of Crystal Structures>

Hereinafter, the classification of crystal structures of an oxide semiconductor will be described with reference to FIG. 25A. FIG. 25A is a diagram showing the classification of crystal structures of an oxide semiconductor, typically IGZO (a metal oxide containing In, Ga, and Zn).

As shown in FIG. 25A, an oxide semiconductor is roughly classified into "Amorphous", "Crystalline", and "Crystal". "Amorphous" includes completely amorphous. "Crystalline" includes CAAC (c-axis-aligned crystalline), nc (nanocrystalline), and CAC (cloud-aligned composite) (excluding single crystal and poly crystal). Note that "Crystalline" excludes single crystal, poly crystal, and completely amorphous. "Crystal" includes single crystal and poly crystal.

Note that the structures in the thick frame in FIG. 25A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 25B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 25B and obtained by GIXD measurement is hereinafter simply referred to as an XRD spectrum. The CAAC-IGZO film in FIG. 25B has a composition in the neighborhood of In:Ga:Zn=4:2:3 [atomic ratio]. The CAAC-IGZO film in FIG. 25B has a thickness of 500 nm.

In FIG. 25B, the horizontal axis represents 2θ [deg.], and the vertical axis represents intensity [a.u.]. As shown in FIG. 25B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 25B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 25C shows a diffraction pattern of the CAAC-IGZO film. FIG. 25C shows a diffraction pattern obtained by the NBED in which an electron beam is incident in the direction parallel to the substrate. The CAAC-IGZO film in FIG. 25C has a composition in the neighborhood of In:Ga:Zn=4:2:3 [atomic ratio]. In the nanobeam electron diffraction method, electron diffraction is performed with a probe diameter of 1 nm.

As shown in FIG. 25C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 25A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the diameter of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] than the second region and has lower [Ga] than the second region. Moreover, the second region has higher [Ga] than the first region and has lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a channel formation region of the transistor. For example, the carrier concentration in an oxide semiconductor in the channel formation region is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet still further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, a reduction in the impurity concentration in the oxide semiconductor is effective in stabilizing the electrical characteristics of the transistor. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region in the oxide semiconductor and the concentration of silicon or carbon in the vicinity of an interface with the channel formation region in the oxide semiconductor (the concentrations obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the channel formation region in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the channel formation region of the oxide semiconductor is preferably reduced as much as possible. Specifically, the hydrogen concentration in the channel formation region of the oxide semiconductor, which is obtained by SIMS, is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, yet still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined as appropriate with any of the other embodiments and the like described in this specification.

Embodiment 3

In this embodiment, examples of a semiconductor wafer where the semiconductor device or the like described in the above embodiment is formed and electronic components incorporating the semiconductor device will be described.
<Semiconductor Wafer>

First, an example of a semiconductor wafer where a semiconductor device or the like is formed will be described with reference to FIG. 26A.

A semiconductor wafer 4800 illustrated in FIG. 26A includes a wafer 4801 and a plurality of circuit portions 4802 provided on a top surface of the wafer 4801. Note that a portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as a next step. Dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided such that the plurality of scribe lines SCL1 are parallel to each other, the plurality of scribe lines SCL2 are parallel to each other, and the scribe lines SCL1 are perpendicular to the scribe lines SCL2.

With the dicing step, a chip 4800a as illustrated in FIG. 26B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 26A. The element substrate may be a rectangular semiconductor wafer, for example. The shape of the element substrate can be changed as appropriate, depending on a fabrication process of an element and an apparatus for fabricating the element.
<Electronic Component>

FIG. 26C is a perspective view of an electronic component 4700 and a substrate (a mounting board 4704) on which the electronic component 4700 is mounted. The electronic component 4700 illustrated in FIG. 26C includes a chip 4800a in a mold 4711. As the chip 4800a, the semiconductor device or the like of one embodiment of the present invention can be used.

To illustrate the inside of the electronic component 4700, some portions are omitted in FIG. 26C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, so that the mounting board 4704 is completed.

FIG. 26D is a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

Examples of the semiconductor device 4710 include the chip 4800a, the semiconductor device described in the above embodiment, and a high bandwidth memory (HBM). In addition, an integrated circuit (a semiconductor device)

such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. In addition, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. Furthermore, a through electrode is provided in the interposer 4731 and the through electrode is used to electrically connect an integrated circuit and the package substrate 4732 in some cases. Moreover, in the case of using a silicon interposer, a TSV (Through Silicon Via) can also be used as the through electrode.

A silicon interposer is preferably used as the interposer 4731. The silicon interposer can be fabricated at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In addition, in a SiP, an MCM, or the like using a silicon interposer, a decrease in reliability due to a difference in the coefficient of expansion between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

In addition, a heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on a bottom portion of the package substrate 4732. FIG. 26D illustrates an example in which the electrode 4733 is formed of a solder ball. Solder balls are provided in a matrix on the bottom portion of the package substrate 4732, so that BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods other than BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be combined as appropriate with any of the other embodiments and the like described in this specification.

Embodiment 4

In this embodiment, application examples of the semiconductor device of one embodiment of the present invention will be described.

The semiconductor device of one embodiment of the present invention can be used, for example, as memory devices of a variety of electronic devices (e.g., information terminals, computers, smartphones, e-book readers, digital still cameras, video cameras, video recording/reproducing devices, navigation systems, game machines, and the like). In addition, the semiconductor device can also be used for image sensors, IoT (Internet of Things), healthcare-related devices, and the like. Note that here, the computers refer not only to tablet computers, laptop computers, and desktop computers, but also to large computers such as server systems.

An example of an electronic device including a semiconductor device of one embodiment of the present invention is described. Note that FIG. 27A to FIG. 27J and FIG. 28A to FIG. 28E each illustrate a state where the electronic component 4700 or the electronic component 4730 that includes the semiconductor device is included in an electronic device.

[Cellular Phone]

An information terminal 5500 illustrated in FIG. 27A is a cellular phone (smartphone), which is a type of information terminal. The information terminal 5500 includes a housing 5510 and a display portion 5511, and as input interfaces, a touch panel is provided in the display portion 5511 and a button is provided in the housing 5510.

By using the semiconductor device of one embodiment of the present invention, the information terminal 5500 can retain a temporary file generated at the time of executing an application (e.g., a web browser's cache or the like).

[Wearable Terminal]

FIG. 27B illustrates an information terminal 5900 that is an example of a wearable terminal. The information terminal 5900 includes a housing 5901, a display portion 5902, an operation switch 5903, an operation switch 5904, a band 5905, and the like.

Like the information terminal 5500 described above, the wearable terminal can retain a temporary file generated at the time of executing an application by using the semiconductor device of one embodiment of the present invention.

[Information Terminal]

FIG. 27C illustrates a desktop information terminal 5300. The desktop information terminal 5300 includes a main body 5301 of the information terminal, a display portion 5302, and a keyboard 5303.

Like the information terminal 5500 described above, the desktop information terminal 5300 can retain a temporary file generated at the time of executing an application by using the semiconductor device of one embodiment of the present invention.

Although the smartphone, the wearable terminal, and the desktop information terminal are respectively illustrated in FIG. 27A to FIG. 27C as examples of the electronic device, one embodiment of the present invention can be applied to information terminals other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

[Household Appliance]

FIG. 27D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is an electric refrigerator-freezer that is compatible with IoT (Internet of Things).

The semiconductor device of one embodiment of the present invention can be used for the electric refrigerator-freezer 5800. The electric refrigerator-freezer 5800 can transmit and receive information on food stored in the electric refrigerator-freezer 5800 and food expiration dates, for example, to and from an information terminal and the like via the Internet. In the electric refrigerator-freezer 5800, the semiconductor device can retain a temporary file generated at the time of transmitting the information.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machine]

FIG. 27E illustrates a portable game machine 5200 as an example of a game machine. The portable game machine 5200 includes a housing 5201, a display portion 5202, a button 5203, and the like.

In addition, FIG. 27F illustrates a stationary game machine 7500 as another example of a game machine. The stationary game machine 7500 includes a main body 7520 and a controller 7522. Note that the controller 7522 can be connected to the main body 7520 with or without a wire. Although not illustrated in FIG. 27F, the controller 7522 can include a display portion that displays a game image, and an input interface besides a button, such as a touch panel, a stick, a rotating knob, or a sliding knob, for example. The shape of the controller 7522 is not limited to that illustrated in FIG. 27F, and the shape of the controller 7522 may be changed in various ways in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

The semiconductor device described in the above embodiment is employed for the portable game machine 5200 or the stationary game machine 7500, so that the portable game machine 5200 with low power consumption or the stationary game machine 7500 with low power consumption can be achieved. Moreover, heat generation from a circuit can be reduced owing to low power consumption; thus, the influence of heat generation on the circuit itself, a peripheral circuit, and a module can be reduced.

Moreover, by using the semiconductor device described in the above embodiment, the portable game machine 5200 or the stationary game machine 7500 can retain a temporary file or the like necessary for an arithmetic operation that occurs during game play.

As an example of a game machine, FIG. 27E illustrates a portable game machine. In addition, FIG. 27F illustrates a home-use stationary game machine. Note that an electronic device of one embodiment of the present invention is not limited thereto. Examples of the electronic device of one embodiment of the present invention include an arcade game machine installed in entertainment facilities (a game center, an amusement park, and the like), a throwing machine for batting practice installed in sports facilities, and the like.

[Moving Vehicle]

The semiconductor device described in the above embodiment can be used for a motor vehicle, which is a moving vehicle, and around the driver's seat in a motor vehicle.

FIG. 27G illustrates a motor vehicle 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the motor vehicle 5700. In addition, a display device showing the above information may be provided around the driver's seat.

In particular, the display device can compensate for the view obstructed by a pillar or the like, blind areas for the driver's seat, and the like by displaying a video from an imaging device (not illustrated) provided for the motor vehicle 5700, which can increase safety. That is, display of an image from an imaging device provided on the outside of the motor vehicle 5700 can fill in blind areas and increase safety.

The semiconductor device described in the above embodiment can temporarily retain information; thus, the semiconductor device can be used to retain temporary information necessary in systems for automatic driving, navigation, risk prediction, and the like of the motor vehicle 5700, for example. The display device may be configured to display temporary information regarding navigation, risk prediction, or the like. Moreover, the semiconductor device may be configured to retain a video of a driving recorder provided in the motor vehicle 5700.

Although a motor vehicle is described above as an example of a moving vehicle, the moving vehicle is not limited to a motor vehicle. Examples of moving vehicles include a train, a monorail train, a ship, and a flying object (a helicopter, an unmanned aircraft (a drone), an airplane, and a rocket).

[Camera]

The semiconductor device described in the above embodiment can be used in a camera.

FIG. 27H illustrates a digital camera 6240 as an example of an imaging device. The digital camera 6240 includes a housing 6241, a display portion 6242, operation switches 6243, a shutter button 6244, and the like, and a detachable lens 6246 is attached to the digital camera 6240. Although the digital camera 6240 is configured here such that the lens 6246 is detachable from the housing 6241 for replacement, the lens 6246 may be integrated with the housing 6241. In addition, the digital camera 6240 can be additionally equipped with a stroboscope, a viewfinder, or the like.

When the semiconductor device described in the above embodiment is used in the digital camera 6240, the digital camera 6240 with low power consumption can be achieved. Moreover, heat generation from a circuit can be reduced owing to low power consumption; thus, the influence of heat generation on the circuit itself, a peripheral circuit, and a module can be reduced.

[Video Camera]

The semiconductor device described in the above embodiment can be used in a video camera.

FIG. 27I illustrates a video camera 6300 as an example of an imaging device. The video camera 6300 includes a first housing 6301, a second housing 6302, a display portion 6303, operation switches 6304, a lens 6305, a joint 6306, and the like. The operation switches 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Videos displayed on the display portion 6303 may be changed in accordance with the angle at the joint 6306 between the first housing 6301 and the second housing 6302.

When videos taken by the video camera 6300 are recorded, the videos need to be encoded in accordance with a data recording format. By using the above semiconductor device, the video camera 6300 can retain a temporary file generated in encoding.

[ICD]

The semiconductor device described in the above embodiment can be used in an implantable cardioverter-defibrillator (ICD).

FIG. 27J is a schematic cross-sectional view illustrating an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. In addition, when the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor or the like, the number of times the treatment with pacing is performed, and the time taken for the treatment, for example, can be stored in the electronic component 4700.

The antenna 5404 can receive electric power, and the battery 5401 is charged with the electric power. Furthermore, when the ICD main unit 5400 includes a plurality of batteries, safety can be increased. Specifically, even when some of the batteries in the ICD main unit 5400 are dead, the other batteries can function properly; thus, the batteries also function as an auxiliary power source.

In addition to the antenna 5404 capable of receiving electric power, an antenna that can transmit physiological signals may be included to construct, for example, a system that monitors cardiac activity by checking physiological signals such as a pulse, a respiratory rate, a heart rate, and body temperature with an external monitoring device.

[Expansion Device for PC]

The semiconductor device described in the above embodiment can be used in a calculator such as a PC (Personal Computer) and an expansion device for an information terminal.

Figure 28A:
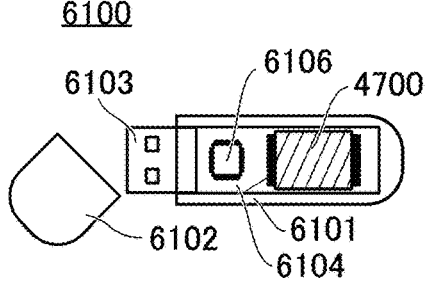
FIG. 28A to FIG. 28E are perspective views and schematic views illustrating examples of electronic devices.

FIG. 28A illustrates, as an example of the expansion device, a portable expansion device 6100 that includes a chip capable of storing information and is externally provided on a PC. The expansion device 6100 can store information using the chip when connected to a PC with a USB (Universal Serial Bus) or the like, for example. Note that FIG. 28A illustrates the portable expansion device 6100; however, the expansion device of one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, the substrate 6104 is provided with the electronic component 4700 and a controller chip 6106. The USB connector 6103 functions as an interface for connection to an external device.

[SD Card]

The semiconductor device described in the above embodiment can be used in an SD card that can be attached to an electronic device such as an information terminal or a digital camera.

Figure 28B:
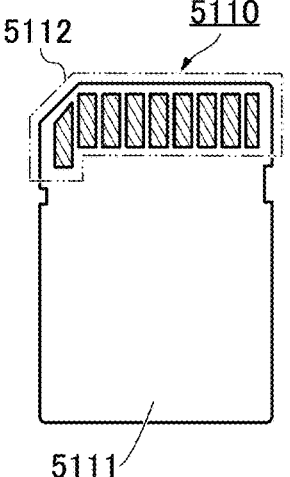
Figure 28C:
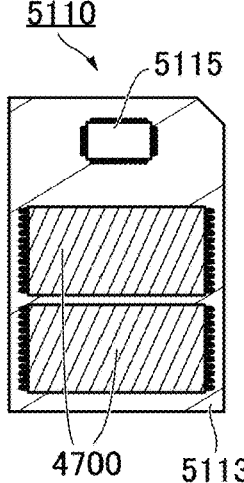

FIG. 28B is a schematic external view of an SD card, and FIG. 28C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a semiconductor device and a circuit for driving the semiconductor device. For example, electronic components 4700 and a controller chip 5115 are attached to the substrate 5113. Note that the circuit structures of the electronic components 4700 and the controller chip 5115 are not limited to those described above, and can be changed as appropriate according to circumstances. For example, a write circuit, a row driver, a read circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from and to the electronic components 4700.

[SSD]

The semiconductor device described in the above embodiment can be used in an SSD (Solid State Drive) that can be attached to an electronic device such as an information terminal.

Figure 28D:
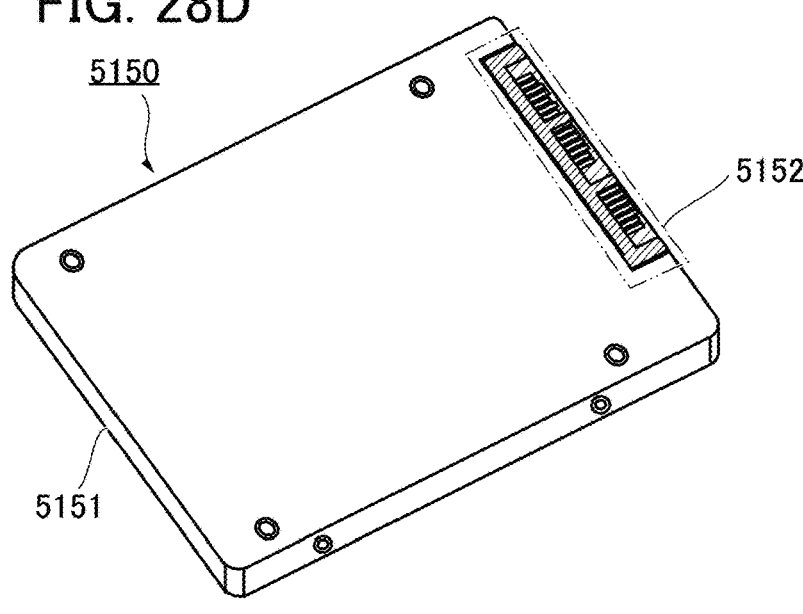
Figure 28E:
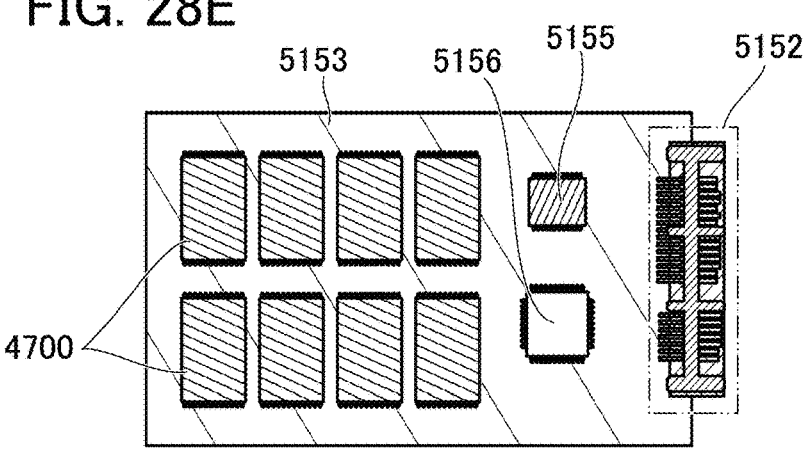

FIG. 28D is a schematic external view of an SSD, and FIG. 28E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the electronic components 4700, a memory chip 5155, and a controller chip 5156 are attached to the substrate 5153. When the electronic components 4700 are provided also on a rear surface side of the substrate 5153, the capacity of the SSD 5150 can be increased. A work memory is incorporated in the memory chip 5155. For example, a DRAM chip is used as the memory chip 5155. A processor, an ECC circuit, and the like are incorporated in the controller chip 5156. Note that the circuit structures of the electronic components 4700, the memory chip 5155, and the controller chip 5115 are not limited to those described above, and the circuit structures can be changed as appropriate according to circumstances. For example, a memory functioning as a work memory may also be provided in the controller chip 5156.

[Computer]

Figure 29A:
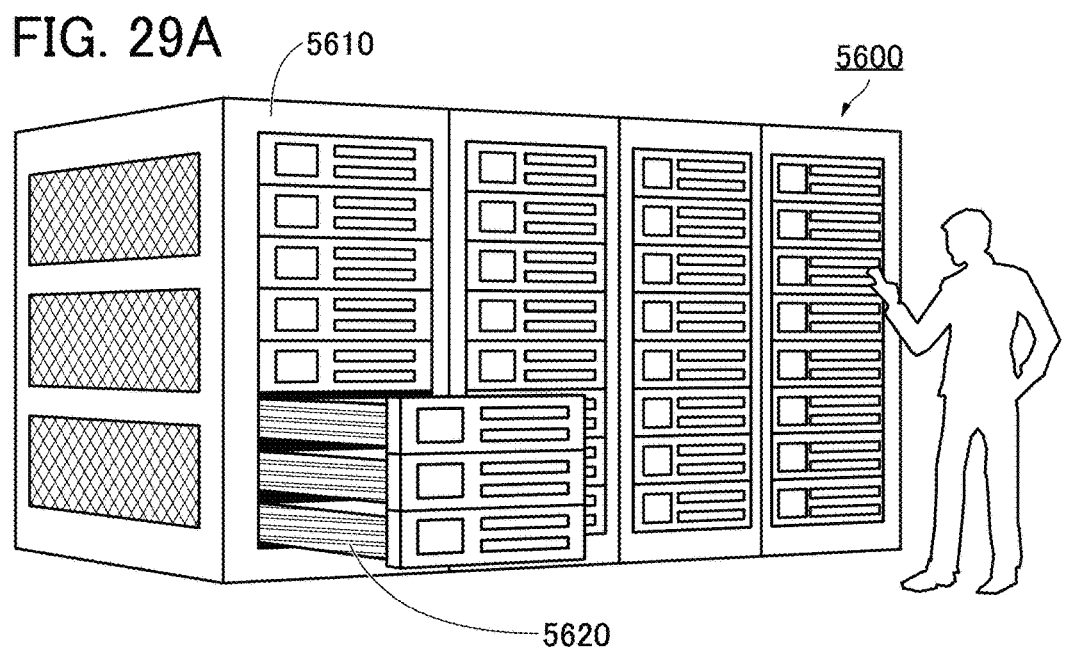
FIG. 29A to FIG. 29C are diagrams illustrating examples of electronic devices.

A computer 5600 illustrated in FIG. 29A is an example of a large computer. In the computer 5600, a plurality of rack mount computers 5620 are stored in a rack 5610.

Figure 29B:
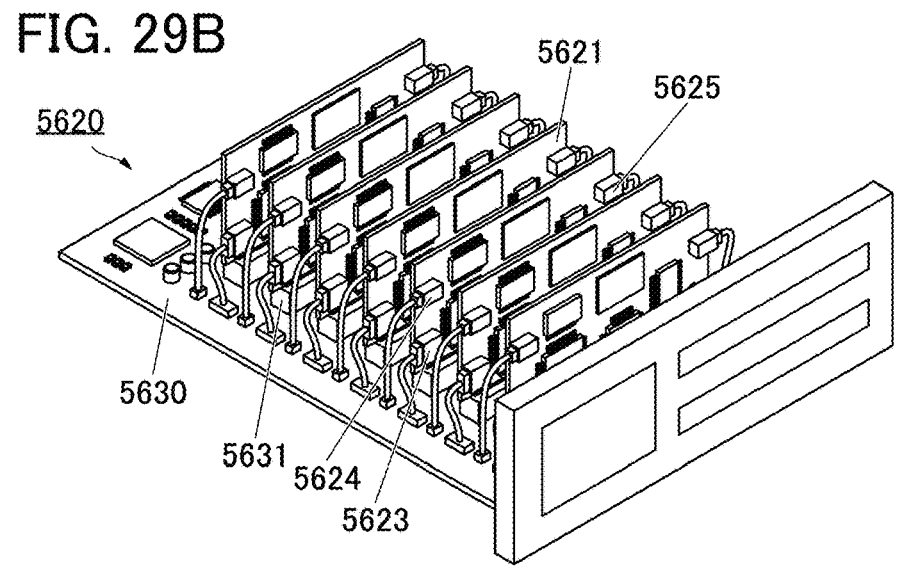

The computer 5620 can have a structure in a perspective view illustrated in FIG. 29B, for example. In FIG. 29B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 29C:
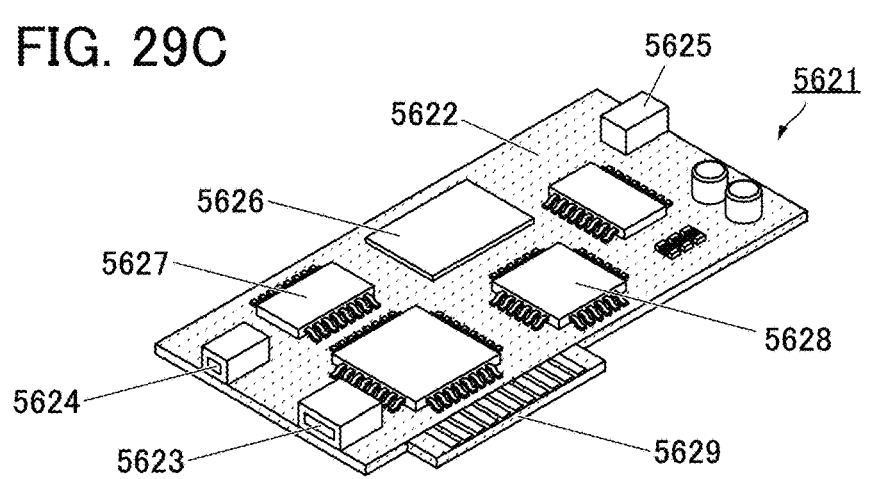

The PC card 5621 illustrated in FIG. 29C is an example of a processing board provided with a CPU, a GPU, a memory device, and the like. The PC card 5621 includes a board 5622. The board 5622 includes the connection terminal 5623, the connection terminal 5624, the connection terminal 5625, a semiconductor device 5626, a semiconductor device 5627, a semiconductor device 5628, and a connection terminal 5629. Note that FIG. 29C also illustrates semiconductor devices other than the semiconductor device 5626, the semiconductor device 5627, and the semiconductor device 5628; the following description of the semiconductor device 5626, the semiconductor device 5627, and the semiconductor device 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve as, for example, an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), and SCSI (Small Computer System Interface). In the case where video signals are output from the connection terminal 5623, the connection terminal 5624, and the connection terminal 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, and a CPU. As the semiconductor device 5627, the electronic component 4730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a memory device or the like. As the semiconductor device 5628, the electronic component 4700 can be used, for example.

The computer 5600 can also function as a parallel computer. When the computer 5600 is used as a parallel computer, large-scale computation necessary for artificial intelligence learning and inference can be performed, for example.

The semiconductor device of one embodiment of the present invention is used in a variety of electronic devices or the like described above, so that a reduction in size and/or a reduction in power consumption of the electronic devices can be achieved. In addition, since the semiconductor device of one embodiment of the present invention has low power consumption, heat generation from a circuit can be reduced. Accordingly, it is possible to reduce adverse effects of the heat generation on the circuit itself, a peripheral circuit, and a module. Furthermore, the use of the semiconductor device of one embodiment of the present invention can achieve an electronic device that operates stably even in a high-temperature environment. Thus, the reliability of the electronic devices can be increased.

This embodiment can be combined as appropriate with any of the other embodiments and the like described in this specification.

Example 1

This example will describe the sizes of a 1T1F memory cell using a Si transistor (SiFET) and a ferroelectric capacitor (FE) and a 1T1F memory cell using an OS transistor (OSFET) and an FE.

FIG. 30 shows circuit diagrams, design parameters, and layout views of the memory cell using the SiFET and the FE and the memory cell using the OSFET and the FE. The technology node of the SiFET is assumed to be 130 nm, and the technology nodes of the OSFET are assumed to be 55 nm and 7 nm.

On the assumption of a usable voltage of 3.3 V, the channel length L and the channel width W of the SiFET with the 130-nm node are required to be approximately 350 nm and approximately 300 nm, respectively. The channel area in that case is 0.105 $\mu m^2$. In the case of a usable voltage of 3.3 V, a dielectric thickness that allows sufficient polarization reversal in the FE is estimated to be approximately 8 to 11 nm.

The OSFET with the 55-nm node can be used at a voltage of 4.5 V even with L of 60 nm and W of 60 nm. The channel area in that case is 0.0036 $\mu m^2$. The OSFET with the 7-nm node can be used at a voltage of 4.5 V even with L of 30 nm and W of 30 nm. The channel area in that case is 0.0009 $\mu m^2$. In the case of a usable voltage of 4.5 V, a dielectric thickness that allows sufficient polarization reversal in the FE is estimated to be approximately 10 to 12.5 nm.

The memory cell using the SiFET fabricated with the 130-nm node is estimated to have a memory size of 0.5 $\mu m^2$ and an FE size of 0.112 $\mu m^2$. The memory cell using the OSFET fabricated with the 55-nm node is estimated to have a memory size of 0.153 $\mu m^2$ and an FE size of 0.05 $\mu m^2$. The memory cell using the OSFET fabricated with the 7-nm node is estimated to have a memory size of 0.018 $\mu m^2$ and an FE size of 0.004 $\mu m^2$.

From the above it follows that a memory cell size greatly depends on the performance of a transistor. As shown in the layout views of FIG. 30, the use of the OSFET in a memory cell can reduce a memory cell size to approximately one third, furthermore, approximately one eighth.

The OSFET having a high breakdown voltage between its source and drain can increase the usable voltage even with small L and W. Thus, voltage required for polarization reversal in the FE can be adequately supplied. Since the usable voltage can be high in the memory cell using the OSFET, the thickness of a dielectric that can have ferro-electricity in the FE can be large so that 2Pr can be increased. Consequently, the memory cell can have higher reliability.

Example 2

This example will describe integration of 1T1F memory cells each including one transistor (FET) and one ferroelectric capacitor (FE). FIG. 31A1 is a schematic cross-sectional view of a memory cell, and FIG. 31A2 is a plan view of the memory cell illustrated in FIG. 31A1. FIG. 31B1 is a schematic cross-sectional view of a memory cell, and FIG. 31B2 is a plan view of the memory cell illustrated in FIG. 31B1. FIG. 31C1 is a schematic cross-sectional view of a memory cell, and FIG. 31C2 is a plan view of the memory cell illustrated in FIG. 31C1.

FIG. 31A1 and FIG. 31A2 illustrate the memory cell in which 2Pr of the FE is comparatively small. In that case, an FE size is large and thus the degree of integration does not increase. As a way of increasing the degree of integration, a cylindrical FE illustrated in FIG. 31B1 and FIG. 31B2 is known. However, the cylindrical FE has problems in that its manufacturing process is complicated and it is difficult to control the crystallinity of a ferroelectric, for example. As illustrated in FIG. 31C1 and FIG. 31C2, large 2Pr can reduce an FE size.

When the FE size is small, the wiring capacitance (parasitic capacitance) of the bit line (wiring BL) needs to be small. FIG. 31D1 illustrates an example in which memory cell arrays 81 and periphery driver circuits 82 are arranged side by side on the plane. It is difficult to reduce the wiring capacitance of the bit line in the structure illustrated in FIG. 31D1.

FIG. 31D2 illustrates an example in which the memory cell arrays 81 are provided over the peripheral driver circuits 82 such that they overlap with each other. Providing the memory cell arrays 81 over the peripheral driver circuits 82 such that they overlap with each other leads to a shorter bit line, thereby reducing the wiring capacitance of the bit line. In addition, the occupied area can be reduced; thus, memory cells can be suitably integrated.

Figures 31E, 31F:
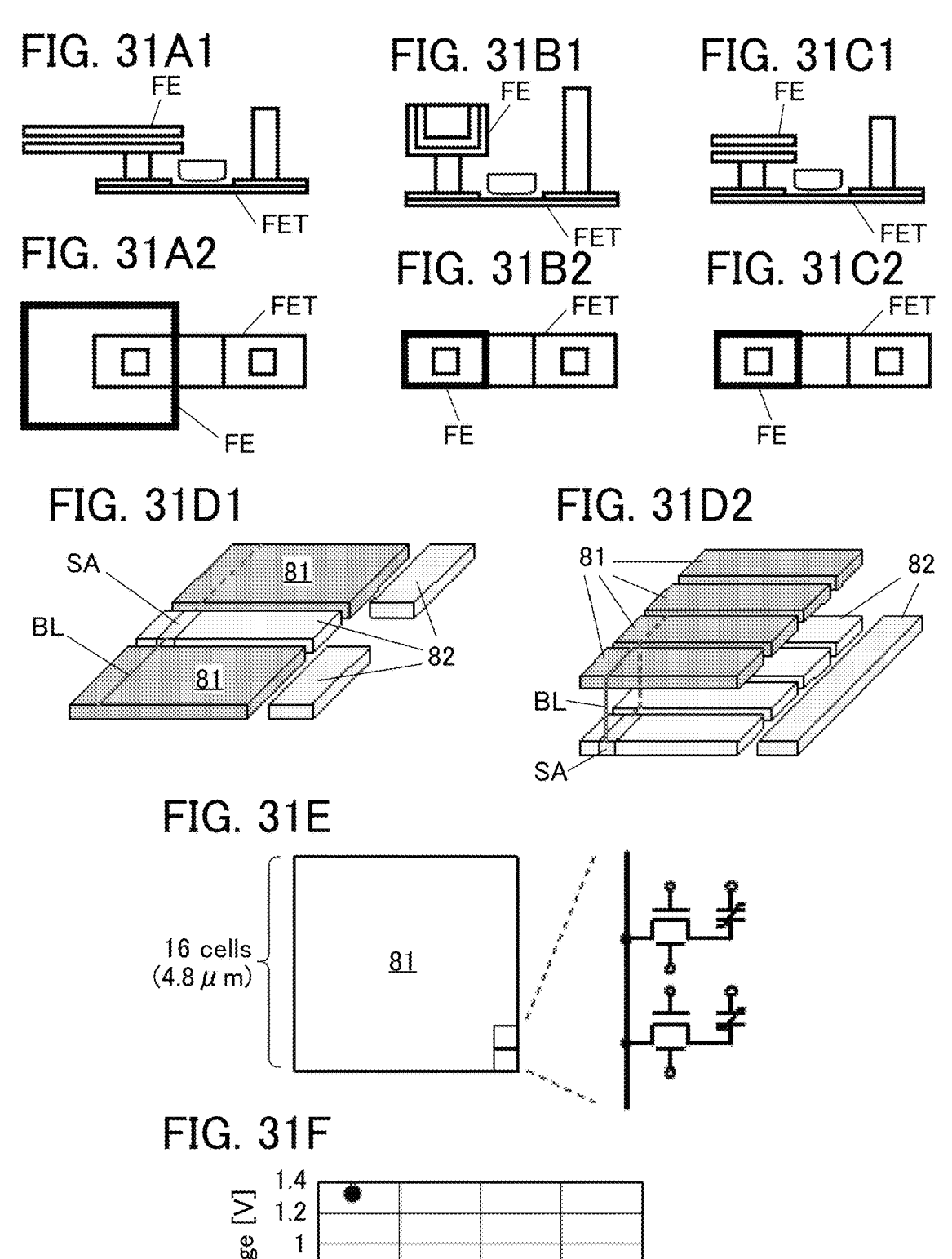
FIG. 31E is a diagram illustrating an example of the memory cell array.
FIG. 31F is a graph showing a relation between the number of memory cells connected to a bit line and read voltage.

Here, the case where 16 memory cells (16 cells) are connected to one bit line with a length of 4.8 $\mu m$ is considered (see FIG. 31E). Assuming that the wiring capacitance per micrometer of bit line is 0.5 fF/$\mu m$, the wiring capacitance of the bit line with a length of 4.8 $\mu m$ is 2.4 fF. Assuming that 2Pr of the FE is 40 $\mu C/cm^2$ and the FE size is 0.004 $\mu m^2$, the amount of charge is 1.6 fC and the potential of the bit line is changed by 0.7 V.

FIG. 31F shows a relation between the number of memory cells electrically connected to one bit line and the read voltage. It is found that the read voltage becomes lower with increasing number of memory cells. The OSFET is preferred to the SiFET in terms of downsizing and higher integration of memory cell arrays.

REFERENCE NUMERALS

10: memory cell, 20: memory array, 21: driver circuit, 22: PSW, 23: PSW, 31: peripheral circuit, 32: control circuit, 33: voltage generation circuit, 41: peripheral circuit, 42: row decoder, 43: row driver, 44: column decoder, 45: column driver, 46: sense amplifier, 47: input circuit, 48: output circuit, 51: curve, 52: curve, 55: polarization, 100: semiconductor device, 120: transistor, 130: capacitor

The invention claimed is:

1. A semiconductor device comprising:
   a memory cell comprising a transistor and a capacitor comprising a ferroelectric; and
   first to fourth wirings,
   wherein a gate of the transistor is electrically connected to the first wiring,
   wherein a back gate of the transistor is electrically connected to the fourth wiring,
   wherein one of a source and a drain of the transistor is electrically connected to the second wiring,
   wherein the other of the source and the drain of the transistor is electrically connected to one electrode of the capacitor,
   wherein the other electrode of the capacitor is electrically connected to the third wiring,
   wherein the semiconductor device is configured to supply a potential bringing the transistor into an on state or an off state to the first wiring,
   wherein the semiconductor device is configured to supply a first potential or a second potential to the second wiring,
   wherein the semiconductor device is configured to supply a third potential, a fourth potential, or a fifth potential to the third wiring,
   wherein the transistor comprises an oxide semiconductor in a channel formation region, and
   wherein a potential of the back gate of the transistor is changeable.

2. The semiconductor device according to claim 1, wherein the oxide semiconductor comprises at least one of indium and zinc.

3. The semiconductor device according to claim 1, wherein the ferroelectric comprises nitrogen and at least one of aluminum, gallium, and indium.

4. The semiconductor device according to claim 1, wherein the ferroelectric comprises nitrogen, at least one of aluminum, gallium, and indium, at least one of boron, scandium, yttrium, lanthanum, cerium, neodymium, europium, titanium, zirconium, hafnium, vanadium, niobium, tantalum, and chromium, and at least one of magnesium, calcium, strontium, zinc, and cadmium.

5. The semiconductor device according to claim 1, wherein the ferroelectric comprises hafnium, oxygen, and at least one of zirconium, silicon, aluminum, gadolinium, yttrium, lanthanum, and strontium.

6. A method for driving the semiconductor device according to claim 1, comprising:

supplying the first potential to the second wiring and then bringing the second wiring into a floating state;

supplying the potential bringing the transistor into the on state to the first wiring;

supplying the third potential to the third wiring and then supplying the first potential or the second potential to the second wiring in accordance with a potential of the second wiring;

supplying the fourth potential to the third wiring;

supplying the first potential to the second wiring and supplying the fifth potential to the third wiring; and supplying the potential bringing the transistor into the off state to the first wiring.

7. A method for driving the semiconductor device according to claim 1, comprising:

supplying the potential bringing the transistor into the on state to the first wiring;

supplying the second potential to the second wiring and supplying the fourth potential to the third wiring;

supplying the first potential to the second wiring and supplying the fifth potential to the third wiring; and supplying the potential bringing the transistor into the off state to the first wiring.

8. The method for driving the semiconductor device, according to claim 6, wherein the second potential is lower than or equal to 80% of saturation polarization voltage of the capacitor.

9. A method for driving the semiconductor device according to claim 1, comprising:

supplying the potential bringing the transistor into the on state to the first wiring;

supplying the first potential to the second wiring and supplying the third potential to the third wiring;

supplying the fifth potential to the third wiring; and supplying the potential bringing the transistor into the off state to the first wiring.

10. The method for driving the semiconductor device, according to claim 7, wherein the second potential is lower than or equal to 80% of saturation polarization voltage of the capacitor.

* * * * *